United States Patent
Knapp et al.

(10) Patent No.: US 10,591,818 B2
(45) Date of Patent: Mar. 17, 2020

(54) NADIC ANHYDRIDE POLYMERS AND PHOTOSENSITIVE COMPOSITIONS DERIVED THEREFROM

(71) Applicant: PROMERUS, LLC, Brecksville, OH (US)

(72) Inventors: Brian Knapp, Brecksville, OH (US); Cheryl Burns, Brecksville, OH (US)

(73) Assignee: PROMERUS, LLC, Brecksville, OH (US)

( * ) Notice: Subject to any disclaimer, the term of this patent is extended or adjusted under 35 U.S.C. 154(b) by 0 days.

(21) Appl. No.: 15/662,372

(22) Filed: Jul. 28, 2017

(65) Prior Publication Data

US 2018/0030189 A1 Feb. 1, 2018

Related U.S. Application Data

(60) Provisional application No. 62/367,857, filed on Jul. 28, 2016.

(51) Int. Cl.
| | | |
|---|---|---|
| *G03F 7/023* | (2006.01) | |
| *G03F 7/40* | (2006.01) | |
| *C08F 232/08* | (2006.01) | |
| *C08F 234/02* | (2006.01) | |
| *G03F 7/022* | (2006.01) | |
| *G03F 7/039* | (2006.01) | |
| *G03F 7/075* | (2006.01) | |
| *C09D 145/00* | (2006.01) | |
| *G03F 7/004* | (2006.01) | |
| *G03F 7/038* | (2006.01) | |
| *G03F 7/20* | (2006.01) | |
| *G03F 7/32* | (2006.01) | |
| *H01L 21/027* | (2006.01) | |
| *G03F 7/16* | (2006.01) | |
| *G03F 7/38* | (2006.01) | |

(52) U.S. Cl.
CPC .......... *G03F 7/0226* (2013.01); *C08F 232/08* (2013.01); *C08F 234/02* (2013.01); *C09D 145/00* (2013.01); *G03F 7/0045* (2013.01); *G03F 7/0046* (2013.01); *G03F 7/0233* (2013.01); *G03F 7/038* (2013.01); *G03F 7/039* (2013.01); *G03F 7/0395* (2013.01); *G03F 7/0755* (2013.01); *G03F 7/0757* (2013.01); *G03F 7/2004* (2013.01); *G03F 7/322* (2013.01); *G03F 7/40* (2013.01); *H01L 21/0274* (2013.01); *G03F 7/162* (2013.01); *G03F 7/168* (2013.01); *G03F 7/38* (2013.01)

(58) Field of Classification Search
CPC .... G03F 7/0395; G03F 7/0233; G03F 7/0392; G03F 7/0226; G03F 7/0382; G03F 7/40; C08F 222/04; C08F 232/08; C08F 234/02
USPC ............... 430/270.1, 905, 192, 193; 526/281
See application file for complete search history.

(56) References Cited

U.S. PATENT DOCUMENTS

| | | | |
|---|---|---|---|
| 6,136,499 A | 10/2000 | Goodall et al. | |
| 6,232,417 B1 | 5/2001 | Rhodes et al. | |
| 6,235,447 B1 * | 5/2001 | Lee | C07C 62/34 430/270.1 |
| 6,596,459 B1 * | 7/2003 | Kim | G03F 7/0395 430/270.1 |
| 8,378,034 B2 * | 2/2013 | Pawlow | C08F 283/14 525/285 |
| 8,633,259 B2 * | 1/2014 | Rhodes | C08K 5/04 520/1 |
| 8,748,074 B2 * | 6/2014 | Onishi | C08F 222/06 430/191 |
| 9,291,901 B2 * | 3/2016 | Kandanarachchi | C09D 135/06 |
| 2012/0129101 A1 | 5/2012 | Onishi et al. | |
| 2014/0322647 A1 | 10/2014 | Knapp et al. | |

FOREIGN PATENT DOCUMENTS

| | | |
|---|---|---|
| CN | 1828418 A | 9/2006 |
| JP | 2004002753 A | 1/2004 |
| WO | WO 02/093263 A1 | 11/2002 |

* cited by examiner

*Primary Examiner* — John S Chu
(74) *Attorney, Agent, or Firm* — Balaram Gupta

(57) ABSTRACT

Various vinyl addition polymers of nadic anhydride are disclosed. Examples of such polymers include copolymers and terpolymers of nadic anhydride with a wide variety of norbornene-type monomers. The nadic anhydride polymers are found to be useful in forming a wide variety of photosensitive compositions, both positive and negative, which are capable of forming high resolution imagable films exhibiting excellent dielectric properties (low-k) and thermal properties, and thus are useful in the fabrication of a variety of microelectronic and optoelectronic devices, among others.

20 Claims, 5 Drawing Sheets

NADIC ANHYDRIDE POLYMERS AND PHOTOSENSITIVE COMPOSITIONS DERIVED THEREFROM

CROSS REFERENCE TO RELATED APPLICATIONS

This application claims the benefit of U.S. Provisional Application No. 62/367,857, filed Jul. 28, 2016, which is incorporated herein by reference in its entirety.

BACKGROUND OF THE INVENTION

Field of the Invention

Various polymers containing nadic anhydride and norbornene-type monomers, compositions thereof useful for forming photo-imagable films are disclosed. Such polymers include norbornene-type repeating units containing polyalkylene oxide pendent groups, and the like. These polymers are useful in forming a variety of photosensitive compositions and form films which can be used as spacers and are photo-patternable, thus having utility in the fabrication of various semiconductor components. The films formed from such compositions provide photo imagable, low-k, thermally stable layers for use in microelectronic and optoelectronic devices.

Description of the Art

As the microelectronic devices are fabricated in smaller geometries there is an increasing demand for advanced materials that meet the stringent requirements of confined smaller geometries. In particular, sub-micron device geometries have become common place in the fabrication of a variety of microelectronics packages for memory and logic integrated circuits (ICs), liquid crystal displays (LCDs), organic light emitting diodes (OLEDs) and other radio frequency (Rf) and microwave devices. For example, devices such as radio frequency integrated circuits (RFICs), micro-machine integrated circuits (MMICs), switches, couplers, phase shifters, surface acoustic wave (SAW) filters and SAW duplexers, have recently been fabricated with submicron dimensions.

With such smaller geometries comes a requirement for dielectric materials with low dielectric constants to reduce or eliminate any cross-talk between adjacent signal lines or between a signal line and a device feature (e.g. a pixel electrode) due to capacitive coupling. Although many low dielectric (low-k) materials are available for microelectronic devices, for optoelectronic devices such materials must also be broadly transparent in the visible light spectrum, not require high temperature processing (greater than 300° C.) that would be incompatible with other elements of such an optoelectronic device, and be both low-cost and feasible for large scale optoelectronic device fabrication.

Thus, it would be desirable to have a material capable of forming a self-imagable layer to avoid the need for depositing a separate imaging layer. Such material should also be easy to apply to a substrate, have a low dielectric constant (5 or less) and thermal stability to temperatures in excess of 250° C. Of course, it is also desirable to have such materials available at a lower cost and feature such properties as positive or negative tone photoimaging capability, aqueous base developing capability, high transparency after heat stress and low weight loss at curing temperatures. It has been reported that acrylic polymers, which are inexpensive, offer good photoimaging properties and are aqueous base developable, see for example, Japanese Patent Application Laid-open No. Hei 5-165214 and the radiation-sensitive resin composition comprising an alicyclic olefin resin disclosed in Japanese Patent Application Laid-open No. 2003-162054. Similarly, polyimides have been reported to provide good thermal stability. However, these materials have certain deficiencies and thus making them not so suitable for the applications contemplated herein. For instance, acrylics are not suitable for applications requiring high thermal stability (i.e., temperatures higher than 200° C.), and many of the polyimides in general are not suitable for either positive tone or negative tone formulations requiring aqueous base developability and generally do not exhibit desirable transparency, thus making them unsuitable in certain optoelectronic applications. Although some polyimides and polybenzoxazoles have low dielectric constants but still may not have low enough permittivity to be effective in highly integrated and/or miniaturized devices having increased wiring density and high signal speed. Furthermore, both polyimides and polybenzoxazoles require cure temperatures in excess of 300° C., thus rendering them unsuitable for many applications. One such known polyimide material is the positive tone photosensitive resin comprising a polyimide precursor and a diazoquinone-type compound disclosed in Japanese Patent No. 3,262,108.

Generally, such fabrication methods make use of certain polymers having photosensitive properties thereby various compositions that are suitable for aforementioned electronic or optoelectronic applications can be formed. See, for example, U.S. Pat. Nos. 8,748,074 and 8,753,790, pertinent portions of which are incorporated herein, where it is disclosed norbornene-type repeat units having pendent phenol groups are useful in certain microelectronic applications, which are generally positive tone photo-imagable compositions, and are not suitable for forming negative tone images.

In addition, the polymers reported therein incorporate perfluoroalkyl substituted monomers in order to improve the dissolution characteristics of such compositions after imagewise exposed to suitable radiation and developed in an aqueous media. However, there are concerns in the electronic applications that presence of fluorine restricts use of such polymers containing the fluorinated monomers. For example, there is a concern of metal corrosion due to the presence of a fluoride in the dielectric polymer employed in the electronic device fabrication. In addition, the fluorinated monomers, such as for example, 2-(bicyclo[2.2.1]hept-5-en-2-ylmethyl)-1,1,1,3,3,3-hexafluoropropan-2-ol (HFANB), are expensive rendering polymers containing such monomers less attractive for such applications.

Accordingly, there is a need for cost effective permanent dielectric materials having not only photopatternable properties but also retaining of film thickness from the unexposed regions of a positive tone formulation (i.e., low dark field loss), low thermal reflow after cure, improved stability to various chemicals and process conditions involved in the downstream process fabrication steps, such as, for example, in a device containing a redistribution layer (RDL), and/or solvent stripper operations, among others.

Thus it is an object of this invention to provide organic polymer materials having aforementioned properties for a variety of electronic and/or optoelectronic device fabrication applications. Furthermore, it is an object of this invention to provide photosensitive compositions which can be tailored to use either as a positive tone or negative tone composition depending upon the intended use.

Other objects and further scope of the applicability of the present invention will become apparent from the detailed description that follows.

SUMMARY OF THE INVENTION

It has surprisingly been found that various polymers derived from nadic anhydride can be made which exhibit excellent photopatternable properties. For example, compositions encompassing such polymers when subjected to a suitable "imagewise" actinic radiation in the presence of a suitable photoactive compound forms both positive tone images as well as negative tone images after subjecting to suitable developing medium. The images thus formed are of sub-micron size suitable for fabricating various electronic and opto-electronic devices as enumerated hereinabove.

Accordingly, there is provided a polymer comprising:
a) a first repeating unit of the formula (IA) derived from a monomer of formula (I):

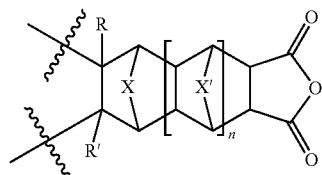

(IA)

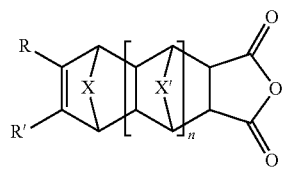

(I)

wherein
∿∿∿ represents a position at which the bonding takes place with another repeat unit;
n is an integer from 0 to 3;
X and X' are the same or different and independently of each other selected from $CH_2$, $CH_2$—$CH_2$, where $CH_2$ or $CH_2$—$CH_2$ is optionally substituted with ($C_1$-$C_6$)alkyl, O and S; and
R and R' are the same or different and independently of each other selected from hydrogen and ($C_1$-$C_6$)alkyl; and
b) a second repeating unit of the formula (IIA) derived from a monomer of formula (II):

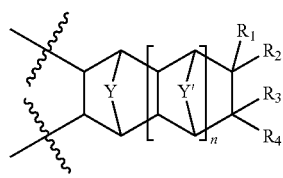

(IIA)

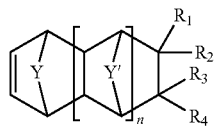

(II)

wherein
∿∿∿ represents a position at which the bonding takes place with another repeat unit;
n is an integer from 0 to 3;
Y and Y' are the same or different and independently of each other selected from $CH_2$, $CH_2$—$CH_2$, O and S;
at least one of $R_1$, $R_2$, $R_3$ and $R_4$ is selected from a monovalent group of the formula (A) and a monovalent group of the formula (B):

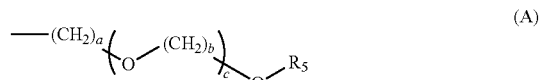

(A)

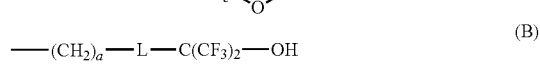

(B)

wherein
a is an integer from 0 to 3;
b is an integer from 1 to 4;
c is an integer from 1 to 4;
L is selected from a bond, O and S;
$R_5$ is selected from hydrogen, methyl, ethyl, a fluorinated or perfluorinated methyl or ethyl, linear or branched substituted or unsubstituted ($C_3$-$C_{12}$)alkyl, substituted or unsubstituted ($C_3$-$C_8$)cycloalkyl, substituted or unsubstituted ($C_1$-$C_{12}$)alkyl($C_3$-$C_8$)cycloalkyl, substituted or unsubstituted ($C_6$-$C_{10}$)aryl, substituted or unsubstituted ($C_1$-$C_{12}$)alkyl($C_6$-$C_{10}$)aryl, substituted or unsubstituted ($C_2$-$C_{12}$)acyl and substituted or unsubstituted ($C_7$-$C_{11}$)aroyl; and
the remaining $R_1$, $R_2$, $R_3$ and $R_4$ are the same or different and independently of each other selected from the group consisting of hydrogen, halogen, methyl, ethyl, a fluorinated or perfluorinated methyl or ethyl, linear or branched substituted or unsubstituted ($C_3$-$C_{12}$)alkyl, substituted or unsubstituted ($C_1$-$C_6$)alkoxy, substituted or unsubstituted ($C_3$-$C_8$) cycloalkyl, substituted or unsubstituted ($C_7$-$C_{12}$) bicycloalkyl and substituted or unsubstituted ($C_7$-$C_{12}$) tricycloalkyl, substituted or unsubstituted ($C_1$-$C_{12}$)alkyl($C_3$-$C_8$)cycloalkyl, substituted or unsubstituted ($C_6$-$C_{10}$)aryl and substituted or unsubstituted ($C_1$-$C_{12}$)alkyl($C_6$-$C_{16}$)aryl where said substituents are selected from halogen, hydroxy, ($C_1$-$C_6$)alkyl, ($C_1$-$C_6$)alkoxy, ($C_2$-$C_6$)alkenyl, ($C_3$-$C_8$)cycloalkyl, ($C_7$-$C_{12}$)bicycloalkyl, ($C_1$-$C_6$)alkoxy($C_3$-$C_6$)alkyl, ($C_1$-$C_6$)alkoxy($C_3$-$C_8$)cycloalkyl and ($C_1$-$C_6$)alkoxy($C_7$-$C_{12}$)bicycloalkyl.

In another aspect of this invention there is also provided a composition encompassing the aforementioned polymer, a photoactive compound and a solvent.

BRIEF DESCRIPTION OF THE DRAWINGS

Embodiments in accordance with the present invention are described below with reference to the following accompanying figures and/or images. Where drawings are provided, it will be drawings which are simplified portions of a device provided for illustrative purposes only.

DETAILED DESCRIPTION OF THE INVENTION

Figure 1:
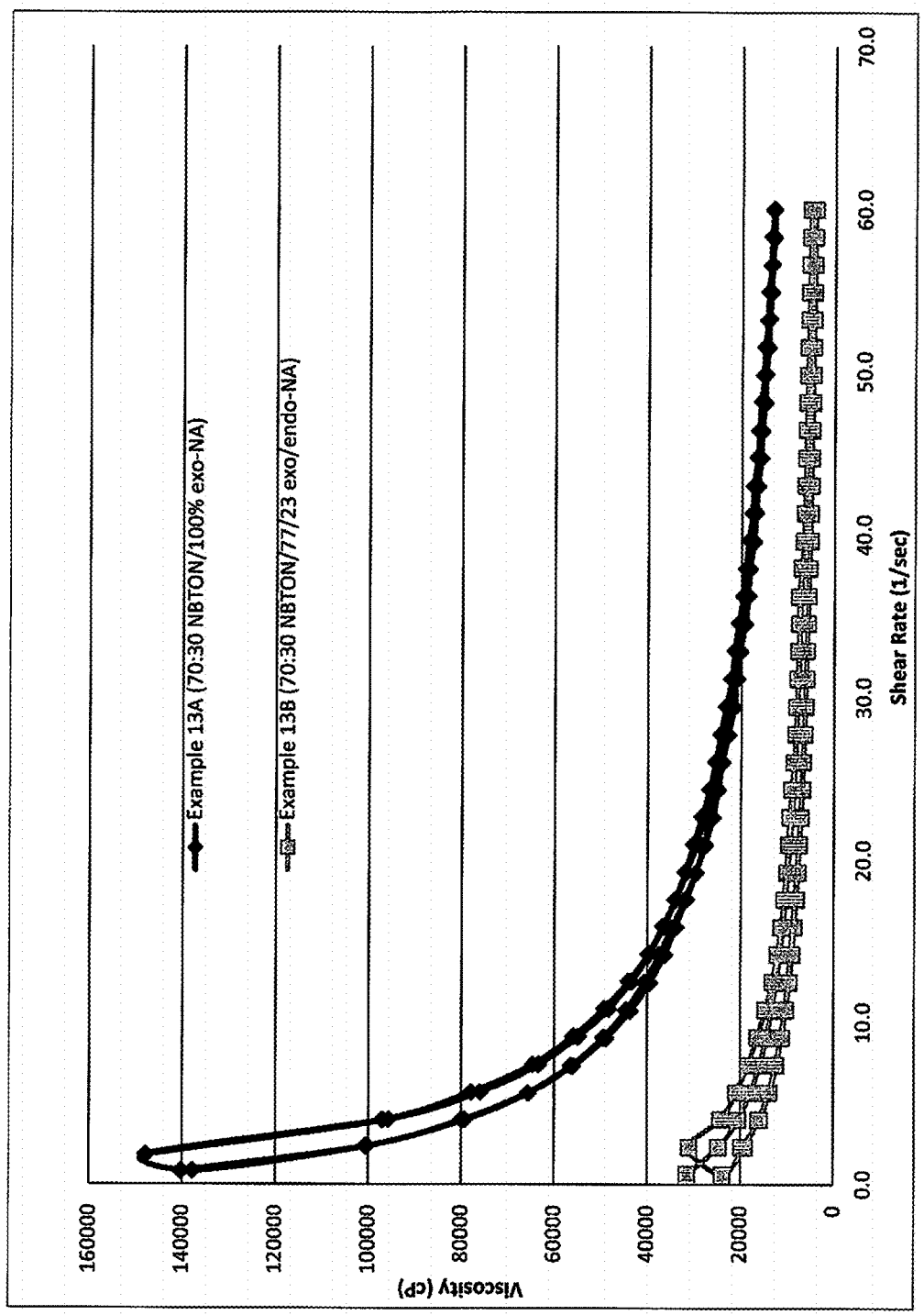
FIG. 1 shows shear dependence or thixotropic property of the polymer embodiments of this invention.

Embodiments in accordance with the present invention are directed to various polymers and compositions, including but not limited to, polymers that encompass nadic anhydride-type repeat units of formula (IA) derived from monomers of formula (I) with at least one repeating unit of formula (IIA) which is derived from a monomer of formula (II) as described herein. The polymers of this invention are useful as photosensitive compositions when used in combination with at least one photoactive compound. Such compositions are capable of forming photo-imagable films useful as layers in the manufacture of microelectronic and optoelectronic devices. That is to say that, after image-wise exposure to actinic radiation, such layers (or films) can be developed to form patterned layers (or films), where such pattern is reflective of the image through which the layers (or films) was exposed. In this manner, structures can be provided that are, or are to become, a part of such microelectronic and/or optoelectronic devices.

The terms as used herein have the following meanings:

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10, etc.

As used herein, the symbol "〰" denotes a position at which the bonding takes place with another repeat unit or, another atom or molecule or group or moiety as appropriate with the structure of the group as shown.

As used herein, "hydrocarbyl" refers to a radical of a group that contains carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen has been replaced by a halogen. The term perhalocarbyl refers to a hydrocarbyl group where all hydrogens have been replaced by a halogen. The term "heterohydrocarbyl" refers to a hydrocarbyl group where at least one hydrogen has been replaced by a heteroatom. Examples of such heteroatoms include but not limited to O, S, N, Si, P, and the like.

As used herein, the expression "$(C_1-C_{15})$alkyl" includes methyl and ethyl groups, and straight-chained or branched propyl, butyl, pentyl, hexyl, heptyl, and various other homolog groups. Particular alkyl groups are methyl, ethyl, n-propyl, isopropyl and tert-butyl, etc. Derived expressions, such as "$(C_1-C_{15})$alkoxy", "$(C_1-C_{15})$thioalkyl" "$(C_1-C_{15})$alkoxy$(C_1-C_{15})$alkyl", "hydroxy$(C_1-C_{15})$alkyl", "$(C_1-C_{15})$alkylcarbonyl", "$(C_1-C_{15})$alkoxycarbonyl$(C_1-C_{15})$alkyl", "$(C_1-C_{15})$alkoxycarbonyl", "amino$(C_1-C_{15})$alkyl", "$(C_1-C_{15})$alkylamino", "$(C_1-C_{15})$alkylcarbamoyl$(C_1-C_{15})$alkyl", "$(C_1-C_{15})$dialkylcarbamoyl$(C_1-C_{15})$alkyl" "mono- or di-$(C_1-C_{15})$alkylamino$(C_1-C_{15})$alkyl", "amino$(C_1-C_{15})$alkylcarbonyl" "diphenyl$(C_1-C_{15})$alkyl", "phenyl$(C_1-C_{15})$alkyl", "phenylcarboyl$(C_1-C_{15})$alkyl" and "phenoxy$(C_1-C_{15})$alkyl" are to be construed accordingly.

As used herein, the expression "cycloalkyl" includes all of the known cyclic radicals. Representative examples of "cycloalkyl" includes without any limitation cyclopropyl, cyclobutyl, cyclopentyl, cyclohexyl, cycloheptyl, cyclooctyl, and the like. Derived expressions such as "cycloalkoxy", "cycloalkylalkyl", "cycloalkylaryl", "cycloalkylcarbonyl" are to be construed accordingly.

As used herein, the expression "$(C_2-C_6)$alkenyl" includes ethenyl and straight-chained or branched propenyl, butenyl, pentenyl and hexenyl groups. Similarly, the expression "$(C_2-C_6)$alkynyl" includes ethynyl and propynyl, and straight-chained or branched butynyl, pentynyl and hexynyl groups.

As used herein, the expression "$(C_1-C_{15})$perfluoroalkyl" means that all of the hydrogen atoms in said alkyl group are replaced with fluorine atoms. Illustrative examples include trifluoromethyl and pentafluoroethyl, and straight-chained or branched heptafluoropropyl, nonafluorobutyl, undecafluoropentyl and tridecafluorohexyl groups. Derived expression, "$(C_1-C_{15})$perfluoroalkoxy", is to be construed accordingly.

As used herein, the expression "$(C_6-C_{10})$aryl" means substituted or unsubstituted phenyl or naphthyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted naphthyl" also include any of the possible substituents as further defined herein or one known in the art. Derived expression, "$(C_6-C_{10})$arylsulfonyl," is to be construed accordingly.

As used herein, the expression "$(C_6-C_{10})$aryl$(C_1-C_4)$alkyl" means that the $(C_6-C_{10})$aryl as defined herein is further attached to $(C_1-C_4)$alkyl as defined herein. Representative examples include benzyl, phenylethyl, 2-phenylpropyl, 1-naphthylmethyl, 2-naphthylmethyl and the like.

As used herein the expression "$(C_1-C_6)$acyl" shall have the same meaning as "$(C_1-C_6)$alkanoyl", which can also be represented structurally as "R—CO—," where R is a $(C_1-C_5)$alkyl as defined herein. Additionally, "$(C_1-C_5)$alkylcarbonyl" shall mean same as $(C_1-C_5)$acyl. Specifically, "$(C_1-C_5)$acyl" shall mean formyl, acetyl or ethanoyl, propanoyl, n-butanoyl, etc. Derived expressions such as "$(C_1-C_6)$acyloxy" and "(C$_1$-C$_4$)acyloxyalkyl" are to be construed accordingly. Similarly, "(C$_7$-C$_{11}$)aroyl" shall mean benzoyl, toluoyl, napththoyl, and the like.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of (C$_1$-C$_6$)alkyl, (C$_2$-C$_6$)alkenyl, (C$_1$-C$_6$)perfluoroalkyl, phenyl, hydroxy, —CO$_2$H, an ester, an amide, (C$_1$-C$_6$) alkoxy, (C$_1$-C$_6$)thioalkyl, (C$_1$-C$_6$)perfluoroalkoxy, —NH$_2$, Cl, Br, I, F, —NH(C$_1$-C$_6$)alkyl, and —N((C$_1$-C$_6$)alkyl)$_2$. However, any of the other suitable substituents known to one skilled in the art can also be used in these embodiments.

It should be noted that any atom with unsatisfied valences in the text, schemes, examples and tables herein is assumed to have the appropriate number of hydrogen atom(s) to satisfy such valences.

As used herein, the terms "polymer composition," or "copolymer composition" are used herein interchangeably and are meant to include at least one synthesized polymer or copolymer, as well as residues from initiators, solvents or other elements attendant to the synthesis of such polymers, where such residues are understood as not being covalently incorporated thereto. Such residues and other elements considered as part of the "polymer" or "polymer composition" are typically mixed or co-mingled with the polymer such that they tend to remain therewith when it is transferred between vessels or between solvent or dispersion media. A polymer composition can also include materials added after synthesis of the polymer to provide or modify specific properties of such composition. Such materials include, but are not limited to solvent(s), antioxidant(s), photoinitiator (s), sensitizers and other materials as will be discussed more fully below.

By the term "derived" is meant that the polymeric repeating units are polymerized (formed) from, e.g., polycyclic norbornene-type monomers, in accordance with formula (I) wherein the resulting polymers are formed by 2,3 enchainment of norbornene-type monomers:

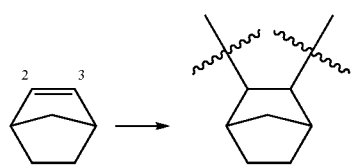

The term "low-k" refers in general to a dielectric constant less than that of thermally formed silicon dioxide (3.9) and when used in reference to a "low-k material" it will be understood to mean a material having a dielectric constant of less than 5.

The term "photodefinable" refers to the characteristic of a material or composition of materials, such as a polymer composition in accordance with embodiments of the present invention, to be formed into, in and of itself, a patterned layer or a structure. In alternate language, a "photodefinable layer" does not require the use of another material layer formed thereover, for example a photoresist layer, to form the aforementioned patterned layer or structure. It will be further understood that a polymer composition having such a characteristic be employed in a pattern forming scheme to form a patterned film/layer or structure. It will be noted that such a scheme incorporates an "imagewise exposure" of the photodefinable material or layer. Such imagewise exposure being taken to mean an exposure to actinic radiation of selected portions of the layer, where non-selected portions are protected from such exposure to actinic radiation.

The phrase "a material that photonically forms a catalyst" refers to a material that, when exposed to "actinic radiation" will break down, decompose, or in some other way alter its molecular composition to form a compound capable of initiating a crosslinking reaction in the polymer, where the term "actinic radiation" is meant to include any type of radiation capable of causing the aforementioned change in molecular composition. For example, any wavelength of ultraviolet or visible radiation regardless of the source of such radiation or radiation from an appropriate X-ray and electron beam source. Non-limiting examples of suitable materials that "photonically form catalyst" include photoacid generators such as are discussed in detail below. It should also be noted that generally "a material that photonically forms a catalyst" will also form a catalyst if heated to an appropriate temperature. Such exposures are sometimes desirable after developing a negative tone image and to fix the images post developing by blanket exposure to a suitable radiation.

The term "cure" (or "curing") as used in connection with a composition, e.g., "a cured composition," shall mean that at least a portion of the crosslinkable components which are encompassed by the composition are at least partially crosslinked. In some embodiments of the present invention, the crosslinking is sufficient to render the polymer film insoluble in the developer and in some other embodiments the polymer film is insoluble in commonly used solvents. One skilled in the art will understand that the presence and degree of crosslinking (crosslink density) can be determined by a variety of methods, such as dynamic mechanical analysis (DMA). This method determines the glass transition temperature and crosslink density of free films of coatings or polymers. These physical properties of a cured material are related to the structure of the crosslinked network. Higher crosslink density values indicate a higher degree of crosslinking in the coating or film.

Monomers

Various monomers as described herein which are part of polymer embodiments in accordance with the present invention are generally known in the art. In general, the polymers of this invention encompass a wide range of "polycyclic" repeating units. As defined herein, the terms "polycyclic olefin" or "polycycloolefin" mean the same and are used interchangeably to represent several of the monomeric compounds used to prepare the polymers of this invention. As a representative example of such a compound or a monomer is "norbornene-type" monomer and is generally referred to herein as addition polymerizable monomer (or the resulting repeating unit), that encompass at least one norbornene moiety such as shown below:

The simplest norbornene-type or polycyclic olefin monomer encompassed by some of the embodiments in accordance with the present invention is norbornene itself, also known as bicyclo[2.2.1]hept-2-ene. However, the term norbornene-type monomer or repeating unit is used herein to mean norbornene itself as well as any substituted norbornene(s), or substituted and unsubstituted higher cyclic derivatives thereof. Representative examples of such monomers include but not limited to bicyclo[2.2.2]oct-2-ene, 1,2,3,4,4a,5,8,8a-octahydro-1,4:5,8-dimethanonaphthalene, 1,4,4a,5,6,7,8,8a-octahydro-1,4-epoxy-5,8-methanonaphthalene, and the like.

In particular, several of the nadic anhydride type monomers within the scope of formula (I) are known in the art and can be synthesized by any of the procedures known to one skilled in the art. Specifically, the starting materials used in the preparation of the monomers of formula (I) used herein are known or are themselves commercially available. The monomers employed herein as well as several of the precursor compounds may also be prepared by methods used to prepare similar compounds as reported in the literature and as further described herein.

In general, an economical route for the preparation of monomers of formula (I), wherein n=0, X=CH$_2$ and R and R' are hydrogen, relies on the Diels-Alder addition reaction in which cyclopentadiene (CPD) is reacted with maleic anhydride at suitable reaction temperatures which are typically at elevated temperatures to form the monomers of formula (I), wherein n=0, X=CH$_2$ and R and R' are hydrogen, generally shown by the following reaction scheme I:

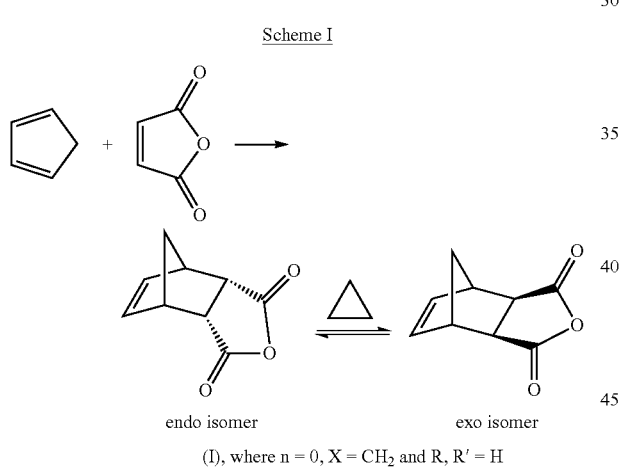

As shown in Scheme I, nadic anhydride so formed exists in two stereoisomeric forms, endo and exo isomers. Generally, endo isomer, which is a kinetic product forms first which then can be isomerized thermally to exo isomer as shown by heating to various temperatures. For example, heating endo-nadic anhydride above 190° C. for about 2 hours results in a eutectic composition of 45/55 endo/exo isomers. See for example, R. Madan, et al., Prog. Polym. Sci., Vol. 23, 621-663 (1998). It should be noted that all isomeric ratios of endo/exo isomers are suitable to form the polymers of this invention as described further hereinbelow.

Various other starting monomers of formula (I) where n=0 and X=CH$_2$ can similarly be prepared by employing appropriate starting diene, such as for example, 2,3-(C$_1$-C$_6$) dialkyl-cyclopentadiene and maleic anhydride or suitably substituted maleic anhydride as desired as shown in Scheme II. Furthermore, similar methods can be employed for other monomers of formula (I) where X is other than CH$_2$.

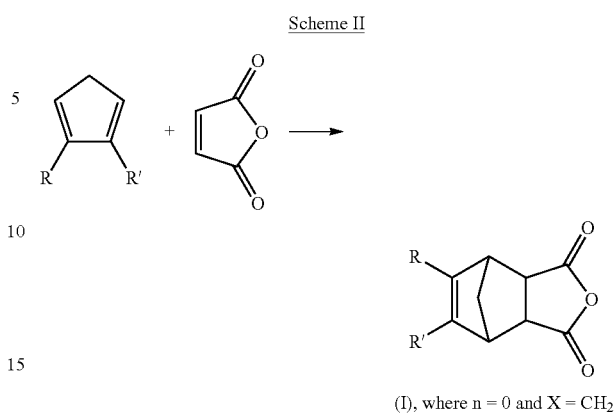

Similarly, various other monomers of formula (I) where n is 1, 2 or 3 can similarly prepared by employing desired cyclopentadiene as the diene and the initial adduct as obtained in Scheme I or Scheme II as the dienophile further in a Diels Alder type reaction. This is further illustrated in Scheme III where a monomer of formula (I) where n=1, X=CH$_2$ and R and R' are hydrogen is prepared from the adduct obtained in Scheme I is further reacted with cyclopentadiene under Diels Alder reaction conditions.

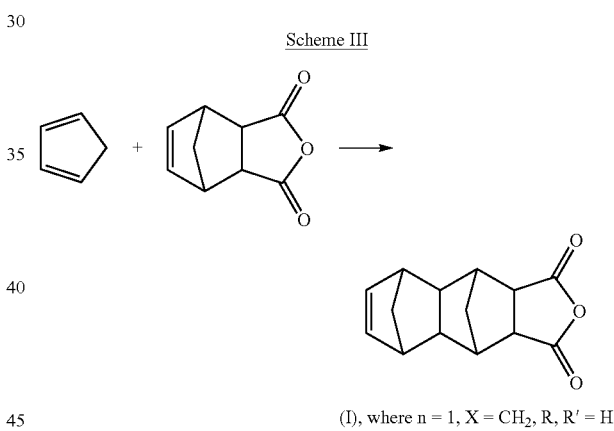

Accordingly, it should be understood that various other monomers within the scope of formula (I) can similarly be prepared as readily appreciated by one of skill in the art or can be prepared following any of the other known literature procedures. Also, several monomers within the scope of formula (I) may also be commercially available.

Similarly, various other monomers of formulae (II) and (III) as described herein are also known in the art or are themselves commercially available. Also, monomers of formulae (II) and (III) can be synthesized by similar procedures as described above:

Polymers

In one aspect of this invention, there is provided a provided a polymer comprising:
  a) a first repeating unit of the formula (IA) derived from a monomer of formula (I):

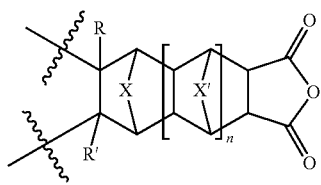

(IA)

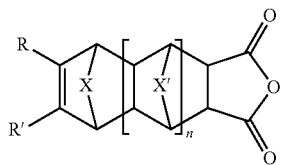

(I)

wherein

∿∿ represents a position at which the bonding takes place with another repeat unit;

n is an integer from 0 to 3;

X and X' are the same or different and independently of each other selected from $CH_2$, $CH_2-CH_2$, where $CH_2$ or $CH_2-CH_2$ is optionally substituted with ($C_1$-$C_6$)alkyl, O and S; and R and R' are the same or different and independently of each other selected from hydrogen and ($C_1$-$C_6$)alkyl; and b) a second repeating unit of the formula (IIA) derived from a monomer of formula (II):

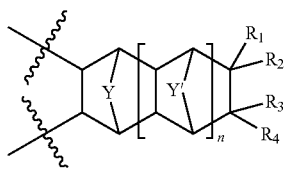

(IIA)

(II)

wherein

∿∿ represents a position at which the bonding takes place with another repeat unit;

n is an integer from 0 to 3;

Y and Y' are the same or different and independently of each other selected from $CH_2$, $CH_2-CH_2$, O and S;

at least one of $R_1$, $R_2$, $R_3$ and $R_4$ is selected from a monovalent group of the formula (A) and a monovalent group of the formula (B):

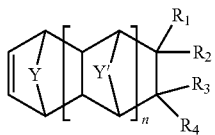

(A)

(B)

wherein a is an integer from 0 to 3;

b is an integer from 1 to 4;

c is an integer from 1 to 4;

L is selected from a bond, O and S;

$R_5$ is selected from hydrogen, methyl, ethyl, a fluorinated or perfluorinated methyl or ethyl, linear or branched substituted or unsubstituted ($C_3$-$C_{12}$)alkyl, substituted or unsubstituted ($C_3$-$C_5$)cycloalkyl, substituted or unsubstituted ($C_1$-$C_{12}$)alkyl($C_3$-$C_8$)cycloalkyl, substituted or unsubstituted ($C_6$-$C_{10}$)aryl, substituted or unsubstituted ($C_1$-$C_{12}$)alkyl($C_6$-$C_{10}$)aryl, substituted or unsubstituted ($C_2$-$C_{12}$)acyl and substituted or unsubstituted ($C_7$-$C_{11}$)aroyl; and the remaining $R_1$, $R_2$, $R_3$ and $R_4$ are the same or different and independently of each other selected from the group consisting of hydrogen, halogen, methyl, ethyl, a fluorinated or perfluorinated methyl or ethyl, linear or branched substituted or unsubstituted ($C_3$-$C_{12}$)alkyl, substituted or unsubstituted ($C_1$-$C_6$)alkoxy, substituted or unsubstituted ($C_3$-$C_8$)cycloalkyl, substituted or unsubstituted ($C_7$-$C_{12}$)bicycloalkyl and substituted or unsubstituted ($C_7$-$C_{12}$)tricycloalkyl, substituted or unsubstituted ($C_1$-$C_{12}$)alkyl($C_3$-$C_8$)cycloalkyl, substituted or unsubstituted ($C_6$-$C_{10}$)aryl and substituted or unsubstituted ($C_1$-$C_{12}$)alkyl($C_6$-$C_{16}$)aryl where said substituents are selected from halogen, hydroxy, ($C_1$-$C_6$)alkyl, ($C_1$-$C_6$)alkoxy, ($C_2$-$C_6$)alkenyl, ($C_3$-$C_8$)cycloalkyl, ($C_7$-$C_{12}$)bicycloalkyl, ($C_1$-$C_6$)alkoxy($C_3$-$C_6$)alkyl, ($C_1$-$C_6$)alkoxy($C_3$-$C_8$)cycloalkyl and ($C_1$-$C_6$)alkoxy($C_7$-$C_{12}$)bicycloalkyl.

Advantageously, it has now been found that polymers of nadic anhydride as described herein can be obtained in which the nadic anhydride repeat units exist in various endo/exo isomeric ratio as described hereinabove. Surprisingly, it has now been found that the polymers formed with pure exo nadic anhydride exhibits increased solubility in organic solvents as well as developing solvents such as tetramethylammonium hydroxide (TMAH). Even more importantly the polymers formed from pure exo nadic anhydride exhibits thixotropic property as described in the specific examples that follow. As used herein "thixotropy" is a time-dependent shear thinning property. That is, the polymer solution exhibits high viscosity under static conditions and will flow (become thin, less viscous) when stressed (time dependent viscosity). The polymer solution will then take a fixed time to return to original high viscous state. Accordingly, polymers of this invention offer unique advantages in certain applications where there is a need to exhibit high viscosity under static conditions while exhibiting ready flow under stress. For example, applications needing underfill of a polymeric material during various fabrication of electrical and/or mechanical parts, including semiconductor devices, and the like.

In one of the embodiments of this invention the polymer of this invention further encompasses one or more repeating units distinct from each other and each represented by formula (IIIA), said repeating unit is derived from a corresponding monomer of formula (III):

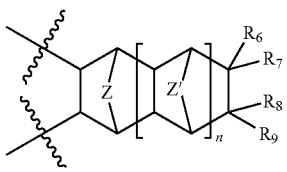

(IIIA)

-continued

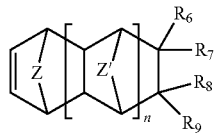

(III)

wherein

∿∿ represents a position at which the bonding takes place with another repeat unit;

n is an integer from 0 to 3;

Z and Z' are the same or different and independently of each other selected from $CH_2$, $CH_2$—$CH_2$, O and S;

$R_6$, $R_7$, $R_8$ and $R_9$ are the same or different and independently of each other selected from the group consisting of hydrogen, methyl, ethyl, a fluorinated or perfluorinated methyl or ethyl, a linear or branched substituted or unsubstituted ($C_3$-$C_{25}$)hydrocarbyl group, substituted or unsubstituted ($C_1$-$C_{25}$)heterohydrocarbyl group, substituted or unsubstituted ($C_3$-$C_{25}$)cyclic hydrocarbyl group, substituted or unsubstituted ($C_6$-$C_{25}$)polycyclic hydrocarbyl group, substituted or unsubstituted ($C_3$-$C_{25}$)cyclic heterohydrocarbyl group and substituted or unsubstituted ($C_6$-$C_{25}$)polycyclic heterohydrocarbyl group.

The polymers in accordance with this invention can be prepared by any of the methods known in the art, see for example U.S. Pat. No. 9,341,949, pertinent portions of which is incorporated herein by reference.

Generally, the polymers of this invention are made by vinyl addition polymerization methods employing a transition metal catalyst and an activator or a co-catalyst. Advantageously, it has now been found that a wide variety of palladium catalysts in combination with a co-catalyst can be employed to polymerize nadic anhydride with a wide variety of other monomers, including at least one monomer of formula (II) and one or more monomers of formula (III).

Accordingly, in some embodiments of this invention polymers of this invention are made using a palladium catalyst as described herein in combination with a co-catalyst of the formula:

$M_d^{\oplus}$ $Z^{\ominus}$, where $M_a^{\oplus}$ is a cation selected from lithium, sodium, potassium, cesium, barium, ammonium or linear or branched tetra($C_1$-$C_4$)alkyl ammonium; and $Z^{\ominus}$ is a weakly coordinating anion selected from $B(C_6F_5)_4^{\ominus}$, $B[C_6H_3(CF_3)_2]_4^{\ominus}$, $B(C_6H_5)_4^{\ominus}$, $[Al(OC(CF_3)_2C_6F_5)_4]^{\ominus}$, $BF_4^{\ominus}$, $PF_6^{\ominus}$, $AsF_6^{\ominus}$, $SbF_6^{\ominus}$, $(CF_3SO_2)N^{\ominus}$ or $CF_3SO_3^{\ominus}$.

Non-limiting examples of palladium catalysts include the following:

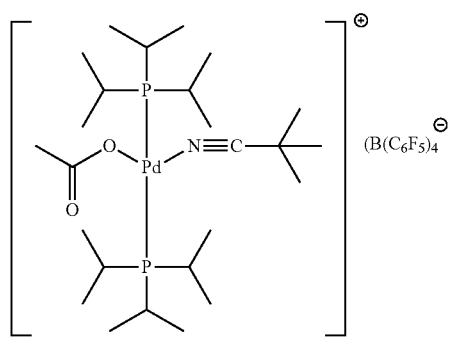

Pd-1206

Pd(II)(t-butylnitrile)(triisopropylphosphine)$_2$ acetate tetrakis(pentafluorophenyl)borate

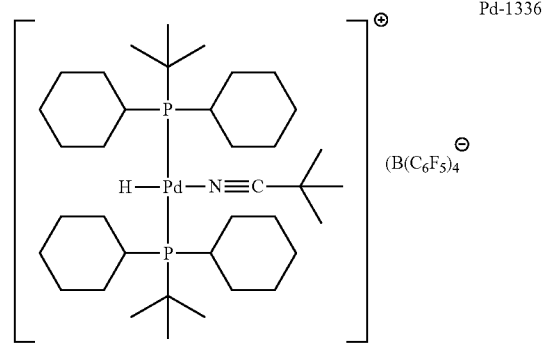

Pd-1336

Pd(II)(t-butylnitrile)(dicyclohexylisopropylphosphine)$_2$ hydride tetrakis(pentafluorophenyl)borate

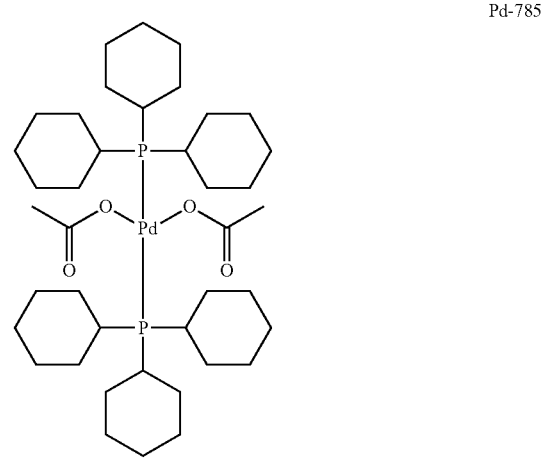

Pd-733

Pd(II)(dicyclohexylisopropylphosphine)$_2$ diacetate

Pd-785

Pd(II)(tricyclohexylphosphine)₂ diacetate

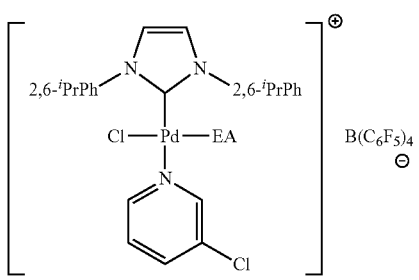

Pd-1425

Pd(II)(1,3-bis(2,6-diisopropylphenyl)-2,3-dihydro-1H-imidazol-2-ylidene)(3-chloropyridine)(ethyl acetate) chloride tetrakis(pentafluorophenyl)borate

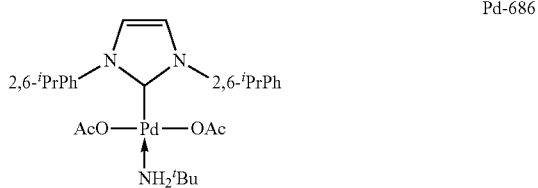

Pd-686

Pd(II)(1,3-bis(2,6-diisopropylphenyl)-2,3-dihydro-1H-imidazol-2-ylidene)(t-butylamine) diacetate

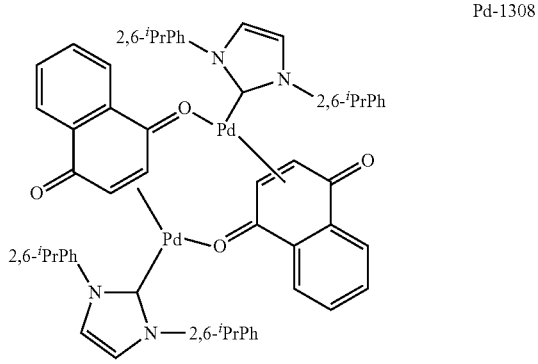

Pd-1308

Di-palladium(0), bis[1,3-bis(2,6-disopropylphenyl]-2,3-dihydro-1H-imidazol-2-ylidene]bis[(1,4-naphthalenedione)

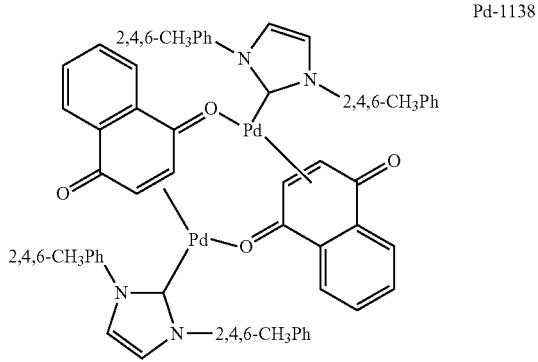

Pd-1138

1,3-Bis(2,4,6-trimethylphenyl)imidazol-2-ylidene (1,4-naphthoquinone)palladium(0) dimer Non-limiting examples of co-catalysts include lithium tetrakis(pentafluorophenyl)borate etherate (LiFABA—[Li(OEt₂)₂.₅][B(C₆F₅)₄]) and N,N-dimethylanilinium tetrakis(pentafluoro-phenyl)-borate (DANFABA), and the like.

Accordingly, by employing suitable combination of palladium catalyst as described herein and a suitable co-catalyst as described vinyl addition polymers of this invention can be made. That is, each of the polymer made as described herein are obtained by the 2,3-enchaiment of the norbornyl chain resulting in the polymers having the repeat units of formula (IA) and (IIA) in combination with a repeat unit of formula (IIIA), if employed. In general, the polymerization can be carried out either in solution using a desirable solvent or in mass. Also, it should be noted that as the reactivity of each of the monomers may be different with the catalyst employed the monomers in desired ratios are generally metered into the reaction mixture in order to facilitate the polymerization of various monomers employed as is well known in the art.

It should further be noted that the polymer of this invention generally encompasses at least one monomer each of formulae (I) and (II). However, the polymer of this invention can encompass more than one monomer of formulae (I) and (II), which are distinct from each other, all such combinations are part of this invention. Accordingly, in one of the embodiments of this invention, the polymer of this invention encompasses two or more distinct repeat units of formula (I) with at least one monomer of formula (II). In yet another embodiment of this invention, the polymer of this invention encompasses two or more distinct repeat units of formula (II) with at least one monomer of formula (I). In yet another embodiment of this invention, the polymer of this invention encompasses at least one monomer of formula (I), at least one formula of monomer (II) and at least one monomer of formula (III).

Any molar ratios of one or more monomers of monomer of formula (I) can be employed with one or more monomers of formulae (II) and/or (III) to form the polymers of this invention. Thus, the polymers of this invention generally incorporate repeating units of formula (IA) from about 1 mole percent to about 99 mole percent. The remaining repeat units are being derived from a combination of repeat units of one or more repeat units of formula (IIA) and (IIIA). Accordingly, in some embodiments a copolymer of this invention is having a molar ratio of repeat units of formulae (IA):(IIA) from about 1:99 to 99:1; in some other embodiments it can be 2:98 to 98:2. Accordingly, in some embodiments the molar ratio of (IA) to (IIA) can be 5:95, 10:90, 20:80, 30:40, 50:50, 60:40, 70:30, 80:20, 90:10, and the like. Similarly, the polymer of this invention can be a terpolymer containing any combinations of monomeric repeat units of formula (IA), (IIA) or (IIIA) in which the molar ratios of the repeat units can be 40:30:30, 40:40:20, 50:20:30, 50:25:25, 50:30:20, 50:40:10, 50:45:5, 60:20:20, and the like. Similarly, polymers containing more than three distinctive repeat units can also be formed in accordance with this invention.

Generally speaking, as to various possible substituents defined for R₁, R₂, R₃, R₄ . . . it should be noted that such substituents can broadly be defined as "hydrocarbyl" group, except where a specific group is defined as for example a group of formulae (A) and (B) for a monomer of formula (II). As defined hereinabove, such definition of "hydrocarbyl" group includes any C₁ to C₃₀ alkyl, aryl, aralkyl, alkaryl, cycloalkyl, or heteroalkyl group. Representative alkyl groups include, but are not limited to, methyl, ethyl, propyl, isopropyl, butyl, isobutyl, sec-butyl, tert-butyl, pentyl, neopentyl, hexyl, heptyl, octyl, nonyl, and decyl. Representative cycloalkyl groups include, but are not limited to, adamantyl, cyclopentyl, cyclohexyl, and cyclooctyl. Representative aryl groups include, but are not limited to, phenyl, naphthyl, and anthracenyl. Representative aralkyl groups include, but are not limited to, benzyl and phenethyl. In addition, it should be noted that the hydrocarbyl groups mentioned above can be substituted, that is to say at least one of the hydrogen atoms can be replaced with, for example, $(C_1-C_{10})$alkyl, haloalkyl, perhaloalkyl, aryl, and/or cycloalkyl group(s). Representative substituted cycloalkyl groups include, among others, 4-t-butylcyclohexyl and 2-methyl-2-adamantyl. A non-limiting representative substituted aryl group is 4-t-butylphenyl.

As noted, any of the monomers within the scope of formula (I) as described herein can be used to form the polymer of this invention. In some embodiments of this invention, the polymer of this invention encompasses without any limitation a first repeat unit which is derived from a monomer selected from the group consisting of:

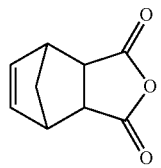

3a,4,7,7a-tetrahydro-4,7-methanoisobenzofuran-1,3-dione (nadic anhydride)

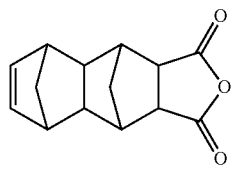 [SMILES: O=C1OC(=O)C2C3CC(C12)C1C2C=CC(C2)C31]

3a,4,4a,5,8,8a,9,9a-octahydro-4,9:5,8-dimethanonaphtho[2,3-c]furan-1,3-dione (TD-anhydride)

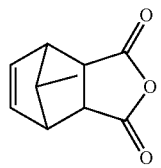

8-methyl-3a,4,7,7a-tetrahydro-4,7-methanoisobenzofuran-1,3-dione; and

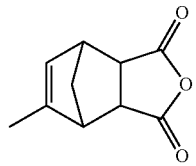

5-methyl-3a,4,7,7a-tetrahydro-4,7-methanoisobenzofuran-1,3-dione

Again, it should be understood that the polymer of this invention may encompass more than one distinctive forms of repeat units derived from the respective monomer of formula (I). All such combinations are within the scope of this invention. Accordingly, in some embodiments the polymer of this invention encompasses two distinctive repeat units of formula (IA) derived from the corresponding monomers of formula (I).

In yet another embodiment, the polymer of this invention encompasses one or more distinctive second repeat unit of formula (IIA) which are derived from the respective monomers of formula (II). Non-limiting examples of such monomers of formula (II) are selected from the group consisting of:

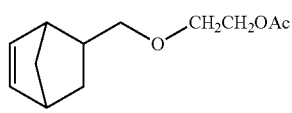

2-(bicyclo[2.2.1]hept-5-en-2-ylmethoxy)ethyl acetate (NBCH$_2$GlyOAc)

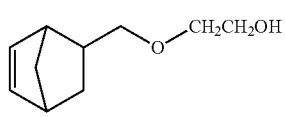

2-(bicyclo[2.2.1]hept-5-en-2-ylmethoxy)ethanol ((NBCH$_2$GlyOH)

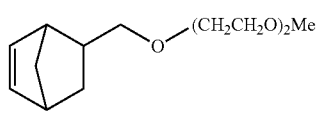

trioxanonanenorbornene (NBTON)

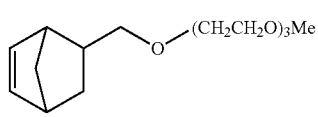

tetraoxadodecanenorbornene (NBTODD)

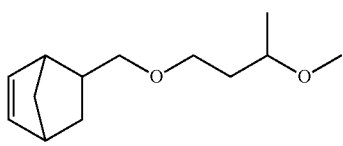

5-(3-methoxybutoxy)methyl-2-norbornene
(NB-3-MBM)

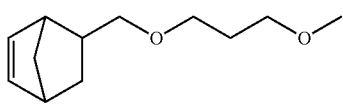

5-(3-methoxypropoxy)methyl-2-norbornene
(NB-3-MPM)

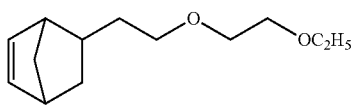 [SMILES: CCOCCOCCC1CC2C=CC1C2]

5-(2-(2-ethoxyethoxy)ethyl)bicyclo[2.2.1]hept-2-ene

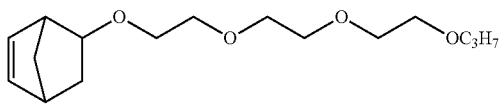

5-(2-(2-(2-propoxyethoxy)ethoxy)ethoxy)bicyclo
[2.2.1]hept-2-ene

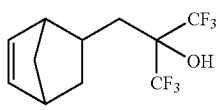 [SMILES: OC(CC1CC2C=CC1C2)(C(F)(F)F)C(F)(F)F]

2-(bicyclo[2.2.1]hept-5-en-2-ylmethyl)-1,1,1,3,3,3-
hexafluoropropan-2-ol (HFANB)

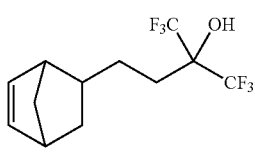 [SMILES: OC(CCC1CC2C=CC1C2)(C(F)(F)F)C(F)(F)F]

4-(bicyclo[2.2.1]hept-5-en-2-yl)-1,1,1-trifluoro-2-
(trifluoromethyl)butan-2-ol (HFACH$_2$NB)

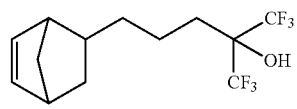 [SMILES: OC(CCCC1CC2C=CC1C2)(C(F)(F)F)C(F)(F)F]

5-(bicyclo[2.2.1]hept-5-en-2-yl)-1,1,1-trifluoro-2-
(trifluoromethyl)pentan-2-ol (HFACH$_2$CH$_2$NB)

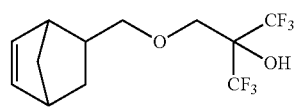

2-((bicyclo[2.2.1]hept-5-en-2-ylmethoxy)methyl)-1,
1,1,3,3,3-hexafluoropropan-2-ol; and

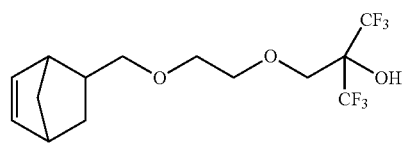 [SMILES: OC(COCCOCC1CC2C=CC1C2)(C(F)(F)F)C(F)(F)F]

2-((2-(bicyclo[2.2.1]hept-5-en-2-ylmethoxy)ethoxy)
methyl)-1,1,1,3,3,3-hexafluoropropan-2-ol (GlyH-
FIPNB)

In another aspect of this invention the polymer of this invention further comprises one or more repeat units derived from any of the norbornene-type monomers. In particular, the polymer of this invention further comprises one or more distinctive repeat units of formula (IIIA) which are derived from respective monomers of formula (III). Exemplary monomers of formula (III), which may be employed, without any limitation are selected from the group consisting of:

bicyclo[2.2.1]hept-2-ene (NB)

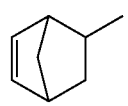

| 21 | 22 |
|---|---|
| 5-methylbicyclo[2.2.1]hept-2-ene (MeNB) | bicyclo[2.2.1]hept-5-en-2-ylmethanamine |

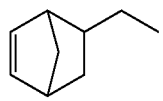

5-ethylbicyclo[2.2.1]hept-2-ene (EtNB)

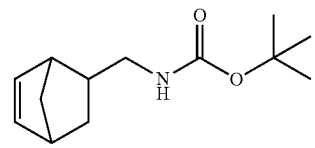 [SMILES: CC(C)(C)OC(=O)NCC1CC2C=CC1C2]

tert-butyl (bicyclo[2.2.1]hept-5-en-2-ylmethyl)carbamate

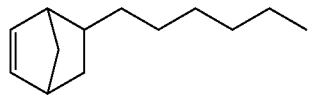

5-hexylbicyclo[2.2.1]hept-2-ene (HexNB)

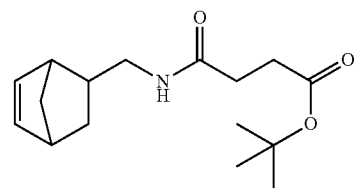 [SMILES: CC(C)(C)OC(=O)CCC(=O)NCC1CC2C=CC1C2]

tert-butyl 4-((bicyclo[2.2.1]hept-5-en-2-ylmethyl)amino)-4-oxobutanoate

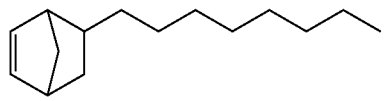

5-octylbicyclo[2.2.1]hept-2-ene (OctNB)

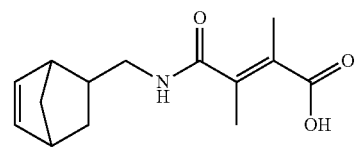 [SMILES: C/C(C(=O)O)=C(/C)C(=O)NCC1CC2C=CC1C2]

(E)-4-((bicyclo[2.2.1]hept-5-en-2-ylmethyl)amino)-2,3-dimethyl-4-oxobut-2-enoic acid

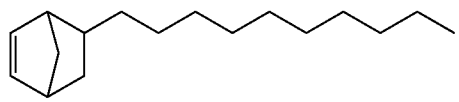

5-decylbicyclo[2.2.1]hept-2-ene (DecNB)

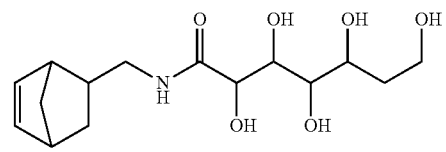 [SMILES: O=C(NCC1CC2C=CC1C2)C(O)C(O)C(O)C(O)CCO]

N-(bicyclo[2.2.1]hept-5-en-2-ylmethyl)-2,3,4,5,7-pentahydroxyheptanamide

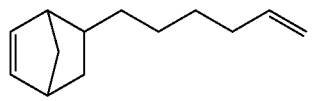

5-(hex-5-en-1-yl)bicyclo[2.2.1]hept-2-ene (HexenylNB)

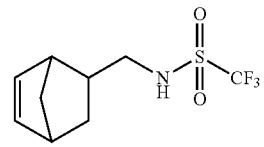 [SMILES: O=S(=O)(NCC1CC2C=CC1C2)C(F)(F)F]

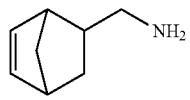

N-(bicyclo[2.2.1]hept-5-en-2-ylmethyl)-1,1,1-trif-
luoromethanesulfonamide bicyclo[2.2.1]hept-5-en-2-ylmethyl acetate
(NBMeOAc)

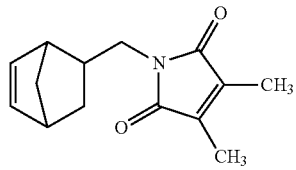

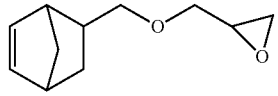

1-(bicyclo[2.2.1]hept-5-en-2-ylmethyl)-3,4-dim-
ethyl-1H-pyrrole-2,5-dione (MeDMMINB)

2-((bicyclo[2.2.1]hept-5-en-2-ylmethoxy)methyl)
oxirane (MGENB)

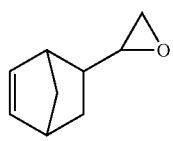

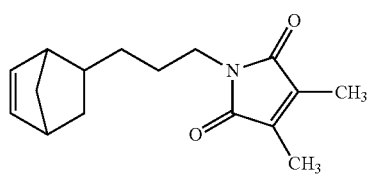 [SMILES: CC1=C(C)C(=O)N(CCCC2CC3C=CC2C3)C1=O]

2-(bicyclo[2.2.1]hept-5-en-2-yl)oxirane 1-(3-(bicyclo[2.2.1]hept-5-en-2-yl)propyl)-3,4-dim-
ethyl-1H-pyrrole-2,5-dione (PrDMMINB)

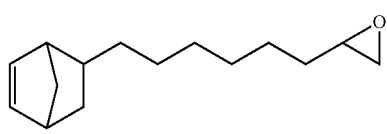

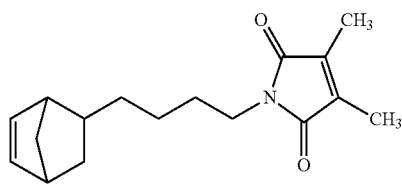 [SMILES: CC1=C(C)C(=O)N(CCCCC2CC3C=CC2C3)C1=O]

2-(6-(bicyclo[2.2.1]hept-5-en-2-yl)hexyl)oxirane;
and 1-(4-(bicyclo[2.2.1]hept-5-en-2-yl)butyl)-3,4-dim-
ethyl-1H-pyrrole-2,5-dione (BuDMMINB)

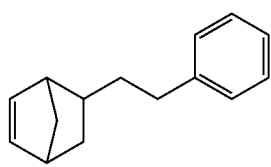

5-phenethylbicyclo[2.2.1]hept-2-ene (PENB)

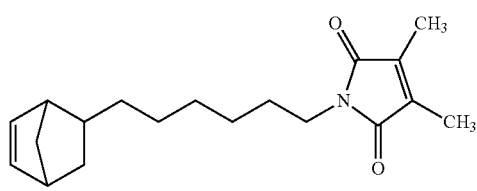 [SMILES: CC1=C(C)C(=O)N(CCCCCCC2CC3C=CC2C3)C1=O]

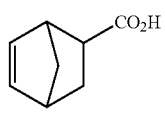

1-(6-(bicyclo[2.2.1]hept-5-en-2-yl)hexyl)-3,4-dim-
ethyl-1H-pyrrole-2,5-dione (HexDMMINB)

bicyclo[2.2.1]hept-5-ene-2-carboxylic acid

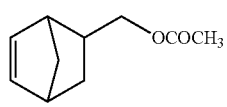

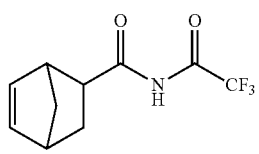 [SMILES: O=C(NC(=O)C(F)(F)F)C1CC2C=CC1C2]

25

N-(2,2,2-trifluoroacetyl)bicyclo[2.2.1]hept-5-ene-2-carboxamide

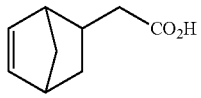

2-(bicyclo[2.2.1]hept-5-en-2-yl)acetic acid (NBCH$_2$CO$_2$H)

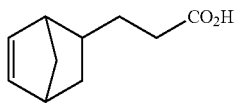 [SMILES: O=C(O)CCC1CC2C=CC1C2]

3-(bicyclo[2.2.1]hept-5-en-2-yl)propanoic acid (NBCH$_2$CH$_2$CO$_2$H)

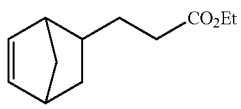 [SMILES: CCOC(=O)CCC1CC2C=CC1C2]

ethyl 3-(bicyclo[2.2.1]hept-5-en-2-yl)propanoate

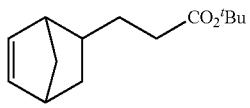

tert-butyl 3-(bicyclo[2.2.1]hept-5-en-2-yl)propanoate

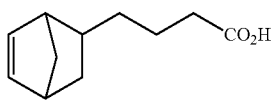 [SMILES: O=C(O)CCCC1CC2C=CC1C2]

4-(bicyclo[2.2.1]hept-5-en-2-yl)butanoic acid (NBCH$_2$CH$_2$CH$_2$CO$_2$H)

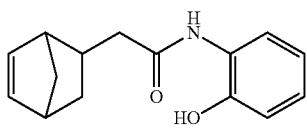

26

2-(bicyclo[2.2.1]hept-5-en-2-yl)-N-(2-hydroxyphenyl)acetamide

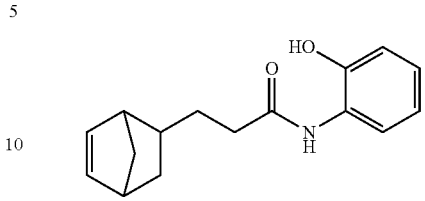

3-(bicyclo[2.2.1]hept-5-en-2-yl)-N-(2-hydroxyphenyl)propanamide

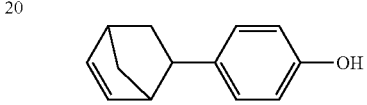

4-(bicyclo[2.2.1]hept-5-en-2-yl)phenol; and

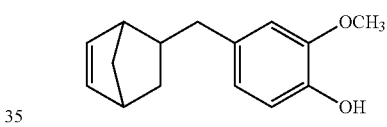

4-(bicyclo[2.2.1]hept-5-en-2-ylmethyl)-2-methoxyphenol

Finally, the polymer of this invention may encompass one or more other known norbornene-type monomers which include the following without any limitation:

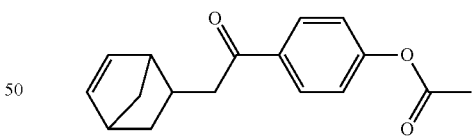

4-(2-(bicyclo[2.2.1]hept-5-en-2-yl)acetyl)phenyl acetate (NBCH$_2$C(O)PhOAc)

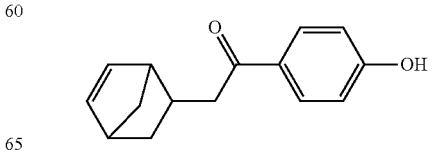

2-(bicyclo[2.2.1]hept-5-en-2-yl)-1-(4-hydroxyphenyl)ethan-1-one (NBCH₂C(O)PhOH)

3-(bicyclo[2.2.1]hept-5-en-2-yl)-1-(4-hydroxy-3-methoxyphenyl)propan-1-one

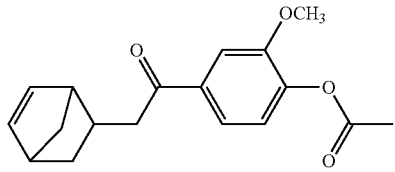 [SMILES: COc1cc(C(=O)CC2CC3C=CC2C3)ccc1OC(C)=O]

4-(2-(bicyclo[2.2.1]hept-5-en-2-yl)acetyl)-2-methoxyphenyl acetate

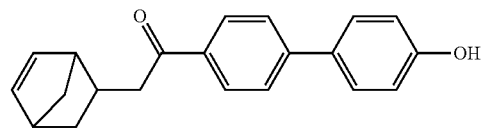

2-(bicyclo[2.2.1]hept-5-en-2-yl)-1-(4'-hydroxy-[1,1'-biphenyl]-4-yl)ethan-1-one

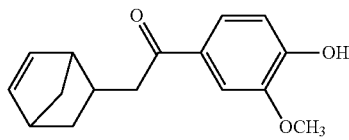

2-(bicyclo[2.2.1]hept-5-en-2-yl)-1-(4-hydroxy-3-methoxyphenyl)ethan-1-one

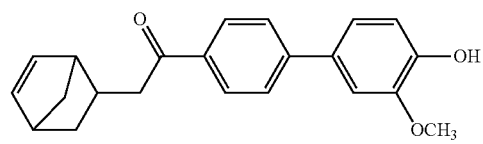

2-(bicyclo[2.2.1]hept-5-en-2-yl)-1-(4'-hydroxy-3'-methoxy-[1,1'-biphenyl]-4-yl)ethan-1-one

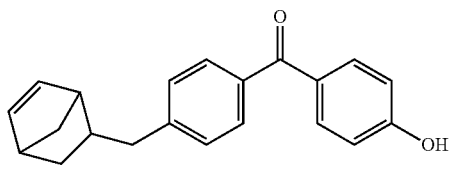 [SMILES: O=C(c1ccc(O)cc1)c1ccc(CC2CC3C=CC2C3)cc1]

(4-(bicyclo[2.2.1]hept-5-en-2-ylmethyl)phenyl)(4-hydroxyphenyl)methanone

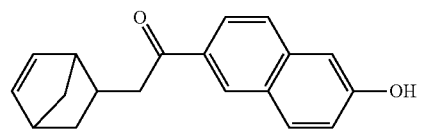

2-(bicyclo[2.2.1]hept-5-en-2-yl)-1-(6-hydroxynaphthalen-2-yl)ethan-1-one; and

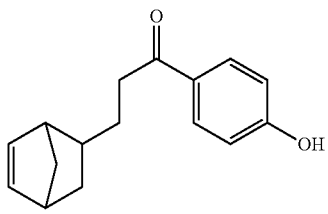 [SMILES: O=C(CCC1CC2C=CC1C2)c1ccc(O)cc1]

3-(bicyclo[2.2.1]hept-5-en-2-yl)-1-(4-hydroxyphenyl)propan-1-one

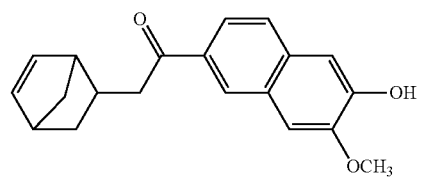

2-(bicyclo[2.2.1]hept-5-en-2-yl)-1-(6-hydroxy-7-methoxynaphthalen-2-yl)ethan-1-one In addition, other such norbornene-type monomers include the following:

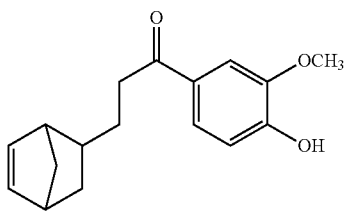 [SMILES: COc1cc(C(=O)CCC2CC3C=CC2C3)ccc1O]

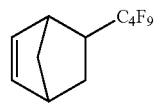

5-perfluorobutylbicyclo[2.2.1]hept-2-ene (NBC$_4$F$_9$)

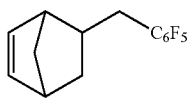

5-pentafluorobenzylbicyclo[2.2.1]hept-2-ene
(PFBNB)

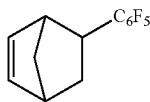

5-pentafluorophenylbicyclo[2.2.1]hept-2-ene
(PFPNB)

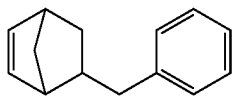 [SMILES: C1=CC2CC1CC2Cc1ccccc1]

5-benzylbicyclo[2.2.1]hept-2-ene (BzNB)

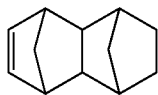

1,2,3,4,4a,5,8,8a-octahydro-1,4:5,8-dimethanonaph-
thalene (TD)

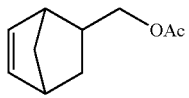 [SMILES: CC(=O)OCC1CC2C=CC1C2]

bicyclo[2.2.1]hept-5-en-2-ylmethyl acetate
(MeOAcNB)

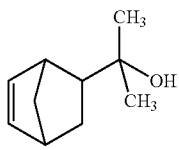

2-(bicyclo[2.2.1]hept-5-en-2-yl)propan-2-ol
(NBXOH)

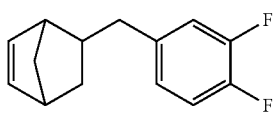 [SMILES: Fc1ccc(CC2CC3C=CC2C3)cc1F]

5-(3,4-difluorobenzyl)bicyclo[2.2.1]hept-2-ene
(NBCH$_2$C$_6$H$_3$F$_2$)

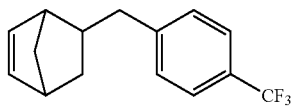 [SMILES: FC(F)(F)c1ccc(CC2CC3C=CC2C3)cc1]

5-(4-(trifluoromethyl)benzyl)bicyclo[2.2.1]hept-2-
ene (NBCH$_2$C$_6$H$_4$CF$_3$)

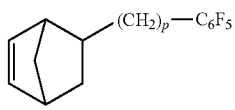

5-((perfluorophenyl)alkyl)bicyclo[2.2.1]hept-2-ene
(NBalkylC$_6$F$_8$), where p=1 (methyl), 2 (ethyl), 3
(propyl), 4 (butyl), 5 (pentyl) or 6 (hexyl)

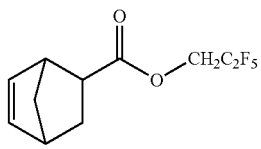

2,2,3,3,3-pentafluoropropyl
bicyclo[2.2.1]hept-5-ene-2-carboxylate (PFPrCNB)

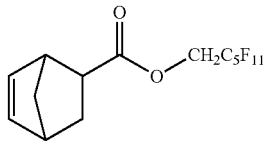

perfluoropentylmethyl
bicyclo[2.2.1]hept-5-ene-2-carboxylate
(PFPMeCNB)

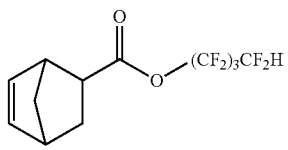

1,1,2,2,3,3,4,4-octafluorobutyl
bicyclo[2.2.1]hept-5-ene-2-carboxylate (FOCHNB)

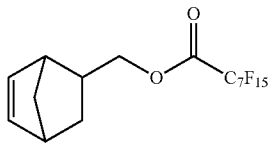

bicyclo[2.2.1]hept-5-en-2-ylmethyl
perfluorooctanoate (C$_8$PFAcNB); and

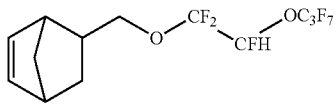

5-((1,1,2-trifluoro-2-(perfluoropropoxy)ethoxy)
methyl)bicyclo[2.2.1]hept-2-ene (PPVENB)

In some embodiments, the polymer of this invention is a copolymer, which is selected from the group consisting of:

a copolymer of nadic anhydride and trioxanonanenorbornene;

a copolymer of nadic anhydride and tetraoxadodecanenorbornene;

a copolymer of nadic anhydride and 5-(3-methoxypropoxy)methyl-2-norbornene;

a copolymer of nadic anhydride and 5-(3-methoxybutoxy)methyl-2-norbornene;

a copolymer of nadic anhydride and 5-(2-(2-ethoxyethoxy)ethyl)bicyclo[2.2.1]hept-2-ene; and a copolymer of nadic anhydride and 2-(bicyclo[2.2.1]hept-5-en-2-ylmethyl)-1,1,1,3,3,3-hexafluoropropan-2-ol.

In some other embodiments, the polymer of this invention is a terpolymer, which is selected from the group consisting of:

a terpolymer of nadic anhydride, trioxanonanenorbornene and 5-(hex-5-en-1-yl)bicyclo[2.2.1]hept-2-ene;

a terpolymer of nadic anhydride, trioxanonanenorbornene and bicyclo[2.2.1]hept-5-en-2-ylmethyl acetate; and a terpolymer of nadic anhydride, trioxanonanenorbornene and 2-((2-(bicyclo[2.2.1]hept-5-en-2-ylmethoxy)ethoxy)methyl)-1,1,1,3,3,3-hexafluoropropan-2-ol.

The polymers formed according to this invention generally exhibit a weight average molecular weight ($M_w$) of at least about 5,000. In another embodiment, the polymer of this invention has a $M_w$ of at least about 10,000. In yet another embodiment, the polymer of this invention has a $M_w$ of at least about 20,000. In some other embodiments, the polymer of this invention has a $M_w$ of at least about 30,000. In yet some other embodiments, the polymer of this invention has a $M_w$ higher than 30,000. In some other embodiments, the polymer of this invention has a $M_w$ higher than 60,000. In yet some other embodiments, the polymer of this invention has a $M_w$ of at least about 100,000 or higher than 100,000 or 200,000 or 300,000. The weight average molecular weight ($M_w$) of the polymer can be determined by any of the known techniques, such as for example, by gel permeation chromatography (GPC) equipped with suitable detector and calibration standards, such as differential refractive index detector calibrated with narrow-distribution polystyrene standards.

Photosensitive Compositions/Applications

In another aspect, embodiments in accordance with the present invention are also directed to various layer forming photosensitive polymer compositions containing polymers encompassing one or more norbornene-type repeating units of formula (IA) and one or more repeating units of formula (IIA). Such polymer compositions may further contain a photo active compound (PAC), a cross-linking agent or additives and a solvent. Further, such compositions are capable of forming films useful as self-imagable layers in the manufacture of microelectronic and optoelectronic devices. That is to say that when image-wise exposed to actinic radiation, such layers (or films) can be developed to form a patterned film, where such pattern is reflective of the image through which the film was exposed.

In this manner, structures can be provided that are, or are to become, a part of such microelectronic and/or optoelectronic devices. For example, such films may be useful as low-K dielectric layers in liquid crystal displays or in microelectronic devices. It will be noted that such examples are only a few of the many uses for such a self-imagable film, and such examples do not serve to limit the scope of such films or the polymers and polymer compositions that are used to form them.

Advantageously, it has now been found that polymer compositions of this invention provide several desirable properties especially when compared to several of the polymers reported in the literature for similar applications. For instance, it has been observed that several of the styrene-maleic anhydride copolymers exhibit very high dark field loss (DFL) making them less desirable for positive tone (PT) applications. As used herein, the term DFL or the unexposed area film thickness loss is a measure of the film thickness loss after image-wise exposure to suitable actinic radiation and developing in a suitable developer. That is, the polymer compositions of this invention are cast into films, the film thicknesses before and after development in an unexposed region of the film are measured and reported as percent loss of the film thickness in areas of the film that was not exposed to the radiation. Generally, higher the percent of DFL, poorer the performance of the polymer composition, which means that the unexposed areas of the film are also susceptible to the developer and thus dissolves in the developer. In addition, the measured DFL also depends on the developed time employed. Generally, longer the develop time higher the DFL.

Surprisingly, the compositions of this invention exhibit very low DFL in that the unexposed area of the film is not lost even at longer develop time. Accordingly, in some embodiments of this invention the DFL of the compositions may be less than about 25 percent; in some other embodiments DFL can be less than 20 percent; and in some other embodiments the DFL may be in the range of from about 0 percent to 30 percent. At the same time the develop time for the compositions of this invention can generally range from about 10 seconds to about 80 seconds; in some other embodiments the develop time can range from about 20 seconds to about 60 seconds; and in some other embodiments the develop time can range from about 30 seconds to about 40 seconds.

In addition, advantageously it has also been found that the compositions of this invention exhibit excellent dissolution rate in the developing solvent, such as for example, aqueous based alkali developer, including tetramethylammonium hydroxide (TMAH). This can further be tailored based on the molar content of nadic repeat units in the polymer. Generally, it has now been found that by judicious selection of the molar ratio of repeat units of formula (IA) and formula (IIA), and in addition the repeat units of formula (IIIA), if further needed, it is now possible to control the dissolution rate of the composition of this invention to the desirable range. Generally, increasing the molar amounts of exo-nadic repeat units of formula (IA) results in higher TMAH solubility, while improving the thermal reflow properties, which aspect becomes more important during downstream operations after developing the films. Furthermore, the compositions of this invention retain much needed lithographic resolution, photospeed and high degree of chemical resistance, among various other desirable properties.

In addition, the compositions of this invention contain one or more photoactive compounds (PACs). Generally, any PAC which can bring about the desirable effect in a positive tone composition can be employed herein. Non-limiting examples of suitable photoactive compounds (PACs) that can be employed in these photosensitive compositions encompasses a photoactive group, such as 1,2-naphthoquinonediazide-5-sulfonyl moiety and/or a 1,2-naphthoquinonediazide-4-sulfonyl moiety as represented by structural formulae (IVa) and (IVb), respectively:

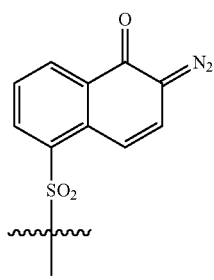

(IVa)

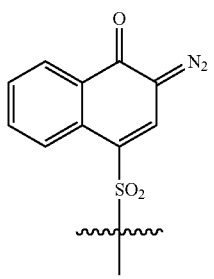

(IVb)

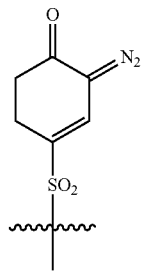

(IVc)

Other such photoactive moieties, among others, include sulfonyl benzoquinone diazide group represented by structural formula (IVc):

Generally, the functional groups of formulae (IVa), (IVb) and/or (IVc) are incorporated into the photosensitive composition as an esterification product of the respective sulfonyl chloride (or other reactive moiety) and a phenolic compound, such as one or more of the exemplary compounds represented below collectively as structural formulae (Va) to (Vag). Thus, any one, or any mixture of two or more of such esterification products are combined with the resin in forming the photosensitive resin compositions of the present invention. In the formulae (V) below, Q may represent any of the structures (IVa), (IVb) or (IVc). Advantageously, when a portion of a film or a layer of the photosensitive composition is exposed to appropriate electromagnetic radiation, these esterification products generate a carboxylic acid which enhances the solubility of such exposed portion in an aqueous alkali solution as compared to any unexposed portions of such film. Generally, such PACs (i.e., photoactive azo compound of formulae (Va) to (Vag) as described herein) are incorporated into the composition in an amount from 1 to 50 parts by weight material to 100 parts by weight polymer of this invention; and typically from about 2 to about 30 parts by weight. Where the specific ratio of the PAC to polymer (i.e., resin) is a function of the dissolution rate of exposed portions as compared to unexposed portions and the amount of radiation required to achieve a desired dissolution rate differential.

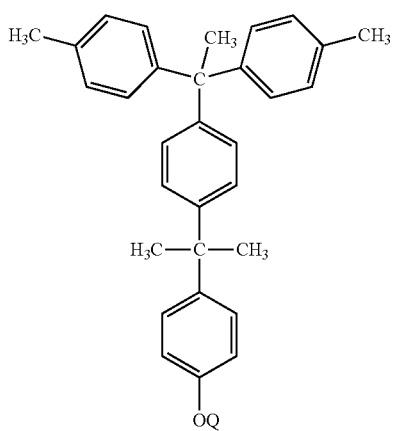

(Va)

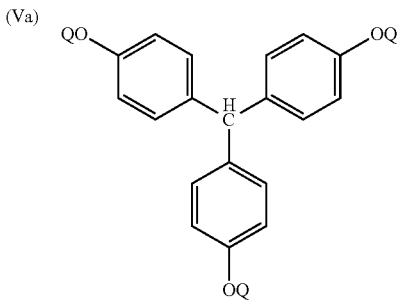

(Vb)

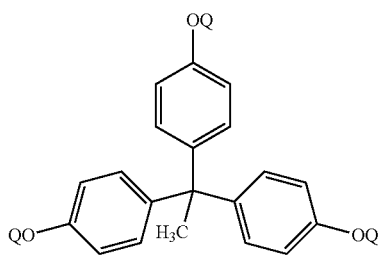
(Vc)
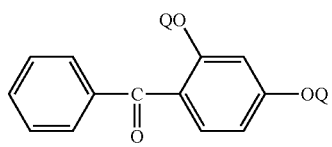
(Vd)
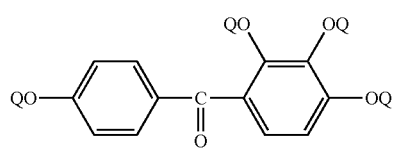
(Ve)
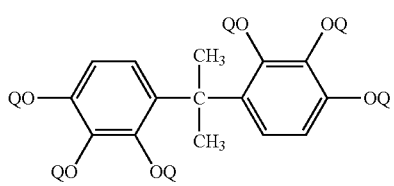
(Vf)
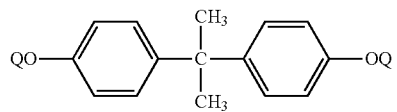
(Vg)
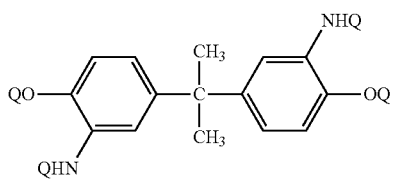
(Vh)
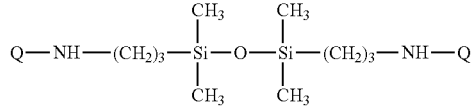
(Vi)
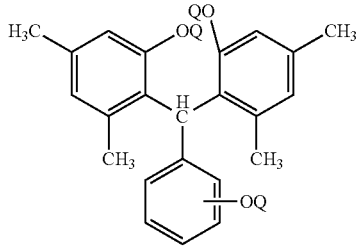
(Vj)
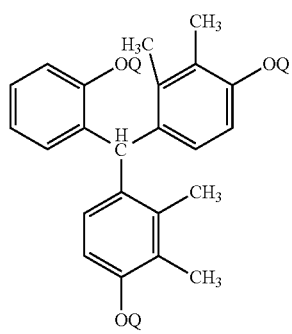
(Vk)
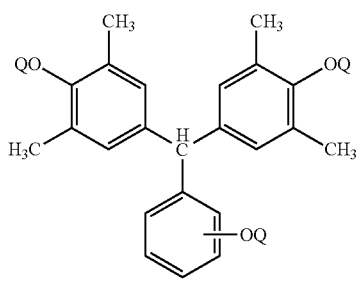
(Vl)
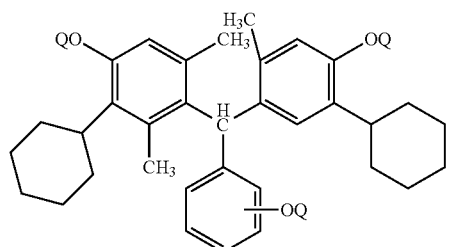
(Vm)
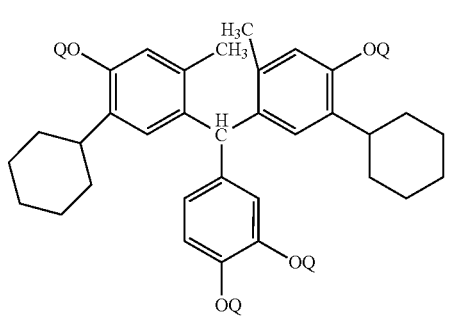
(Vn)

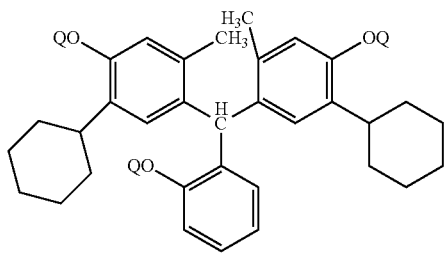
(Vo)
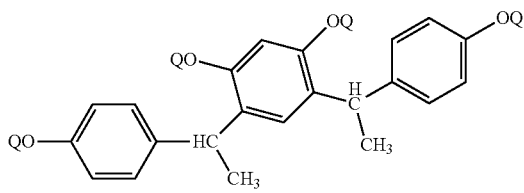
(Vp)
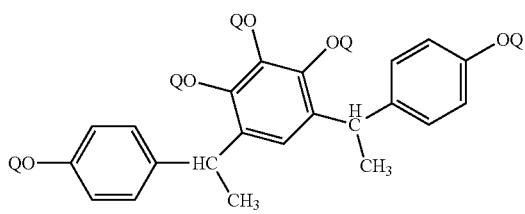
(Vq)
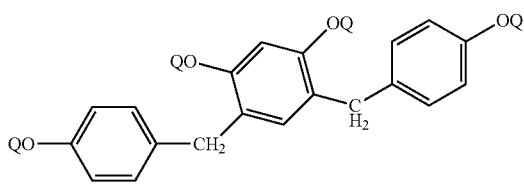
(VIIIr)
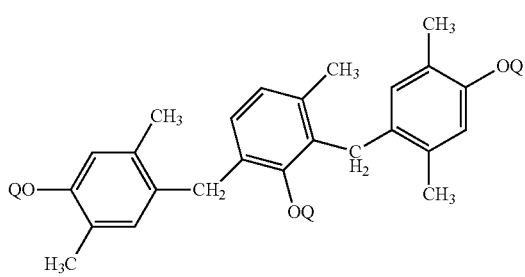
(VIIIs)
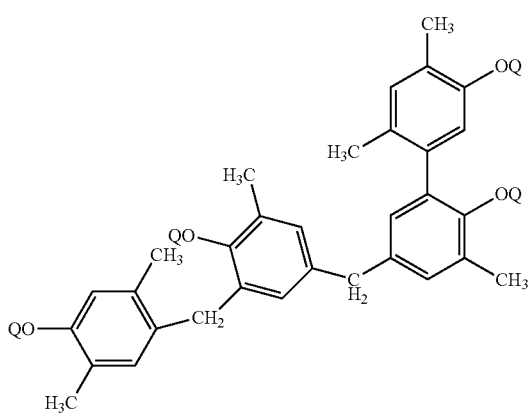
(VIIIt)
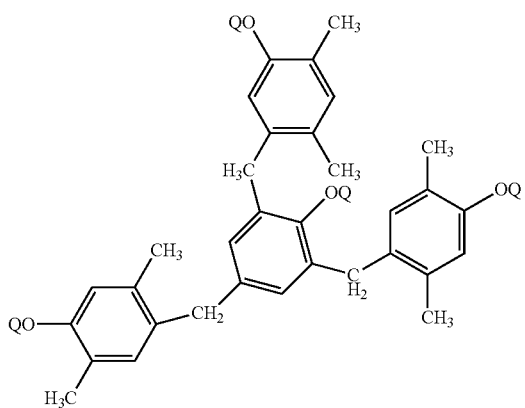
(VIIIu)
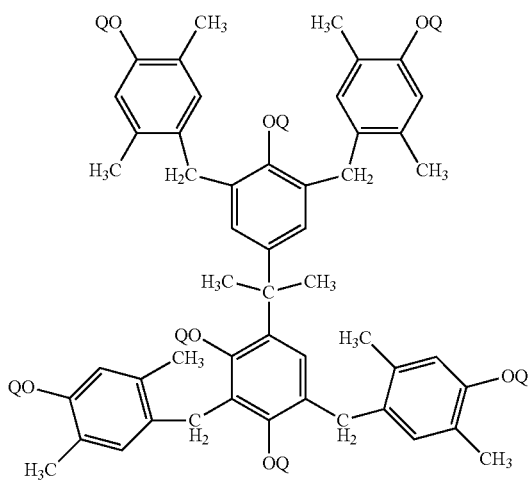
(Vv)
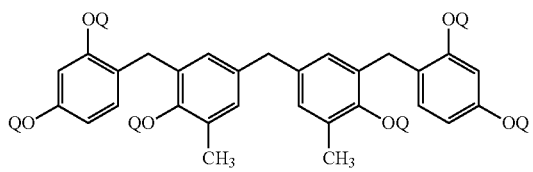
(Vw)
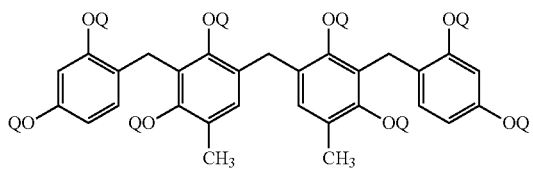
(Vx)

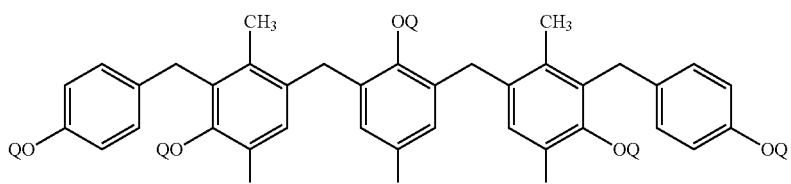

(Vy)

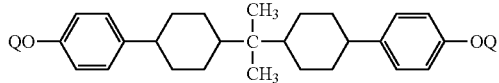

(Vx)

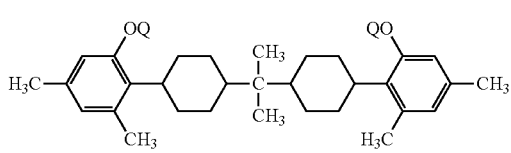

(Vab)

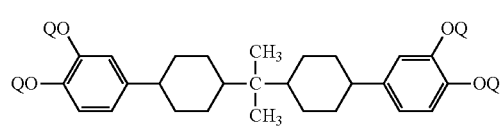

(Vaa)

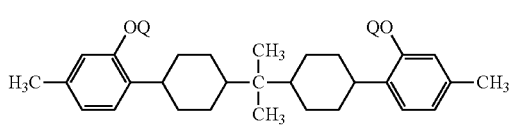

(Vad)

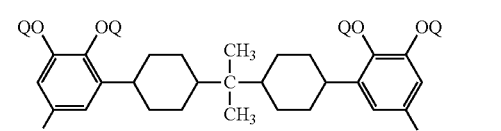

(Vac)

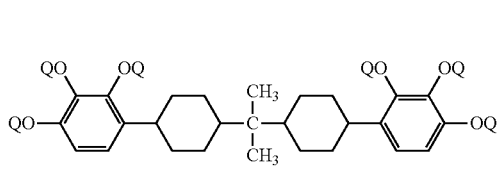

(Vaf)

(Vae)

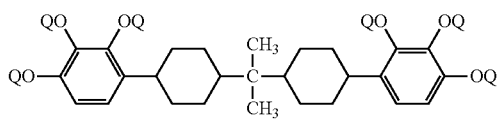

(Vag)

Again, as noted, in the above listed PACs of formulae (Va) to (Vag), Q refers to any one of photoactive moieties of formulae (IVa), (IVb) or (IVc). Several of the PACs listed above are commercially available. For example, PAC-5570 is of formula (Vc) (St. Jean Photochemicals Inc., Quebec, Canada), SCL6 is of formula (Vd) (Secant Chemicals Inc., Winchendon, Mass., USA), TrisP-3M6C-2-201 is of formula (Vo), collectively TS-200, TS-250 and TS-300 are of formula (Va), and 4NT-300 is of formula (Ve) (all from Toyo Gosei Co. Ltd., Chiba, Japan). It should be noted that for PACs of the types TS-200, TS-250 and TS-300, the degree of substitution of Qs also varies based on the product used. For instance, TS-200 is substituted with 67% of Q, TS-250 is substituted with 83% of Q, and TS-300 with 100% of Q, the unsubstituted portion being hydrogen.

Exemplary epoxies and other cross-linking additives, as mentioned above, include, but are not limited to, bisphenol A epoxy resin (LX-01—where n=1 to 2, Daiso Chemical Co., Osaka, Japan), 2,2'-((((1-(4-(2-(4-(oxiran-2-ylmethoxy) phenyl)propan-2-yl)phenyl)ethane-1,1-diyl)bis(4,1-phenylene))bis(oxy))bis(methylene))bis(oxirane) (Techmore VG3101L—Mitsui Chemical Inc.), trimethylolpropane triglycidylether (TMPTGE—CVC Specialty Chemicals, Inc.), 1,1,3,3,5,5-hexamethyl-1,5-bis(3-(oxiran-2-ylmethoxy)propyl)trisiloxane (DMS-E09—Gelest, Inc.), liquid epoxy resins (D.E.R.™ 732, where n=8 to 10, and D.E.R.™ 736, where n=4 to 6—both from Dow Chemical Company), bis(4-(oxiran-2-ylmethoxy)phenyl)methane (EPON™ 862, Hexion Specialty Chemicals, Inc.), triglycidyl ether of poly (oxypropylene)epoxide ether of glycerol (commercially available as Heloxy 84 or GE-36 from Momentive Specialty Chemicals Inc.), 2-((4-(tert-butyl)phenoxy)methyl)oxirane (commercially available as Heloxy 65 from Momentive Specialty Chemicals Inc.) and silicone modified epoxy compound (commercially available as BY16-115 from Toray-Dow Corning Silicone Co., Ltd.) as shown below:

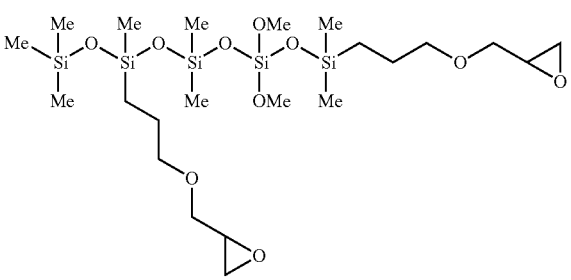 [SMILES: CO[Si](OC)(O[Si](C)(C)CCCOCC1CO1)O[Si](C)(C)O[Si](C)(CCCOCC1CO1)O[Si](C)(C)C]

silicone modified epoxy resin (BY16-115, commercially available from Toray Dow Corning Silicone Co., Ltd.)

Various other epoxy crosslinking compounds that can be employed in the composition of this invention include the following:

41
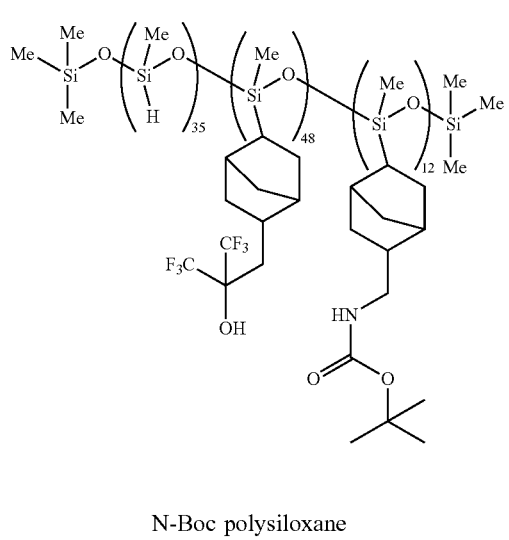
N-Boc polysiloxane
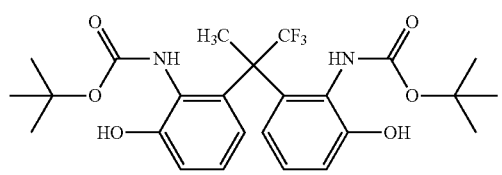
di-tert-butyl ((perfluoropropane-2,2-diyl)bis(6-hydroxy-2,1-phenylene))dicarbamate (N-Boc BAFA)
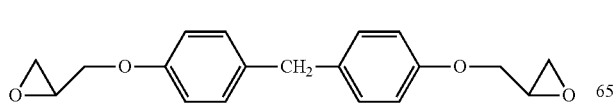
di-tert-butyl (propane-2,2-diylbis(6-hydroxy-2,1-phenylene))dicarbamate (N-Boc DABPA)
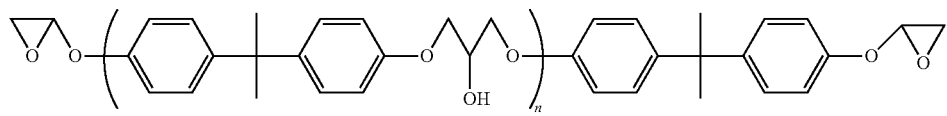
LX-01
42
EPON™ 862
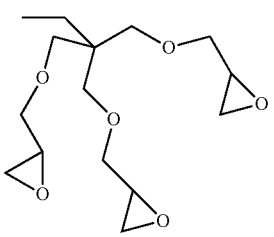 [SMILES: CCC(COCC1CO1)(COCC1CO1)COCC1CO1]
TMPTGE—2,2'-(((2-ethyl-2-((oxiran-2-ylmethoxy)methyl)propane-1,3-diyl)bis(oxy))bis(methylene))bis(oxirane), commercially available as Denacol EX-321L (Nagase)
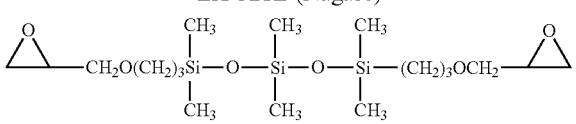
DMS-E09
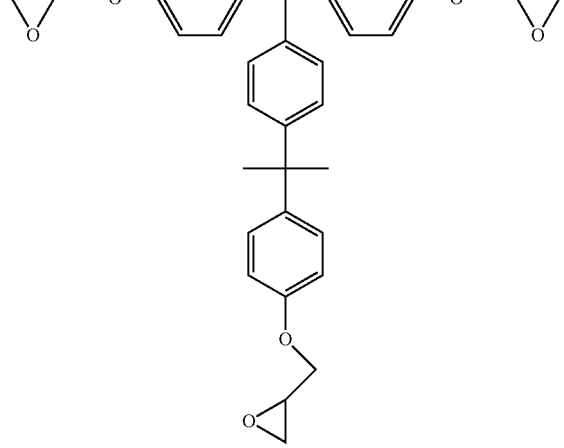
Techmore VG3101L
-continued
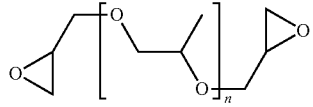

polypropylene glycol epichlorohydrin based epoxy resin (D.E.R.™ 732), where n=8 to 10 and D.E.R.™ 736, where n=4 to 6

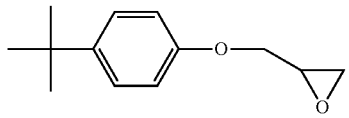

glycidyl ether of para-tertiary butyl phenol (2-((4-(tert-butyl)phenoxy)methyl)oxirane), commercially available as Heloxy 65 from Momentive Specialty Chemicals Inc.; and

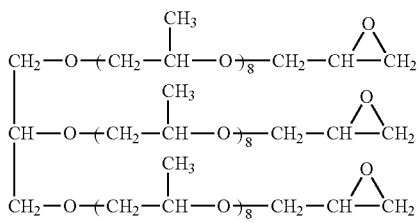 [SMILES: CC(COCC(COCC(C)OCC1CO1)OCC(C)OCC1CO1)OCC1CO1]

triglycidyl ether of poly(oxypropylene)epoxide ether of glycerol, commercially available as Heloxy 84 or GE-36 from Momentive Specialty Chemicals Inc.

Still other exemplary epoxy resins or cross-linking additives include, among others, Araldite MTO163 and Araldite CY179 (manufactured by Ciba Geigy); EHPE-3150, Epolite GT300 (manufactured by Daicel Chemical); bisphenol A epichlorohydrin based epoxy resin (EPON™ 828); bis(4-(oxiran-2-ylmethoxy)phenyl)methane (EPON 862); polyethylene glycol diglycidyl ether (PEGDGE); and polypropylene glycol diglycidyl ether (PPGDGE). It should further be noted that a mixture in any combination of one or more of the aforementioned epoxy compounds can be employed in the compositions of this invention.

The amount of epoxy compound may also vary as noted for PACs. The amount can vary generally from about 1 to 50 parts by weight of the polymer and typically from about 2 to about 30 parts by weight, although other advantageous amounts of such materials are also appropriate and within the scope of the present invention. In addition, one or more different types of epoxy compounds as enumerated herein can be used in the composition of this invention and the amounts of each can thus be varied as needed.

It will be understood that exemplary embodiments of the present invention, can include other suitable components and/or materials such as are necessary for formulating and using the polymer compositions in accordance with the present invention. Such other suitable components and/or materials include one or more components selected from sensitizer components, solvents, catalyst scavengers, adhesion promoters, stabilizers, and reactive diluents.

Non-limiting examples of adhesion promoters include ((triethoxysilyl)propyl)disulfide (commercially available as Si-75 or Si-266 from Evonik); trimethoxy(3-(oxiran-2-ylmethoxy)propyl)silane, also commonly known as 3-glycidoxypropyl trimethoxysilane (commercially available as KBM-403E from Shin-Etsu Chemical Co., Ltd.); bis(3-triethoxysilylpropyl)polyethylene oxide (commercially available as SIB1824.84 from Gelest); N-n-butyl-aza-2,2-dimethoxysilacyclopentane (commercially available as SIB1932.4 from Gelest); 3-(3-(triethoxysilyl)propyl)-dihydrofuran-2,5-dione (commercially available as SIT8192.6 from Gelest) and phenyltriethoxysilane (commercially available as KBE-103), and the like.

The polymer compositions in accordance with the present invention may further contain optional components as may be useful for the purpose of improving properties of both the composition and the resulting layer, for example the sensitivity of the composition to a desired wavelength of exposure radiation. Examples of such optional components include various additives such as a dissolution promoter, an adhesion promoter, a phenolic resin, a surfactant, a silane coupling agent, a leveling agent, an antioxidant, a fire or flame retardant, a plasticizer, a crosslinking agent, a curing agent or a curing accelerator, or the like. It should again be noted that any one of these compounds can be used alone or as mixtures in any combination thereof. Again, any amount of one or more of aforementioned compounds can be used in the composition of this invention so as to bring about the desired results. Generally it has now been found that such amounts can range from 0.1 to 20 parts per hundred parts of the polymer resin (pphr). In some embodiments such amounts range from 1 to 10 pphr.

Non-limiting examples of dissolution promoters include 2,2'-methylenediphenol (also referred to as 2,2'-bis(hydroxyphenyl)methane or o,o'-BPF), 4-hexylresorcinol, butyl 4-hydroxybenzoate, 4,4'-((2-hydroxyphenyl)methylene)bis (2-cyclohexyl-5-methylphenol), and the like.

Advantageously, it has now been found that judicious selection of aforementioned components in the compositions of this invention may offer certain unexpected benefits. For instance, it has now been found that employing one or more dissolution promoters in the composition of this invention significantly improves the photospeed of the developed images after shorter development time. This aspect is specifically illustrated by specific examples that follow. In addition, employing one or more of the aforementioned additive may also impart other benefits which include, among other things, improved DFL properties and thermal reflow properties. Again, these features become more apparent from the specific examples that follow. It should further be noted that various benefits obtained from this invention depends on many factors as already described herein and some of which may be readily appreciated by one of skill in the art. Accordingly, in some embodiments the photosensitive compositions of this invention contains at least one dissolution promoter. Examples of such dissolution promoter include, among others, various esters of para-hydroxybenzoic acid, for example, butyl 4-hydroxybenzoate, bisphenol A, and 5-norbornene-2,3-dicarboxylic acid.

In addition, it has now been found that use of certain amines improves the thermal and mechanical stability of the resulting films formed from the compositions after developing. For example, various monoamines and diamines can be employed to improve such thermal and mechanical properties. Generally, it is believed that the amines employed react with the anhydride functionality of the repeat unit derived from nadic anhydride (i.e., repeat units of formula (IA)) to form the imide which imparts this higher thermal stability and mechanical property as illustrated in Scheme IV. Accordingly, it may be advantageous to protect the amine group by a suitable amine protecting group such as t-butyloxycarbonyl (t-BOC) to avoid any premature reaction of the anhydride functional group with the amine before developing the film formed from the composition of this invention, see Scheme IV. Scheme IV illustrates the formation of an imide using a monoamine. However, various diamines can also be employed which will not only act as an imide forming agent but also provides a method for cross-linking agent.

Scheme IV

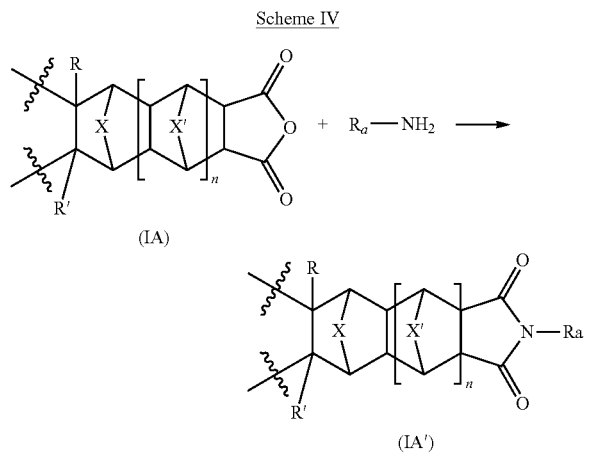

In Scheme IV, $R_a$ is any hydrocarbyl group as described herein including ($C_1$-$C_{24}$)alkyl, ($C_6$-$C_{10}$)aryl, ($C_6$-$C_{10}$)aryl ($C_1$-$C_{24}$)alkyl, and polyethylene oxide group. Non-limiting examples of such amines include the following:

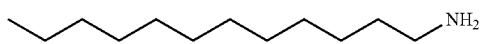

Dodecyl amine

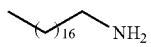

Octadecyl amine

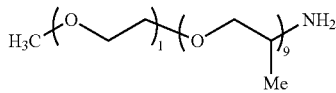

Branched polyeheramine, commercially available under the name, Jeffamine M-600 from Huntsman Corporation

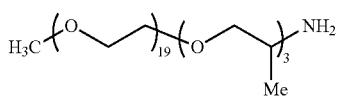

Branched polyether amine, commercially available under the name, Jeffamine M-1000 from Huntsman Corporation; and

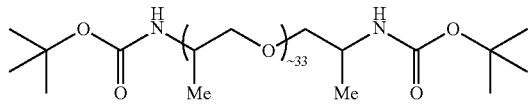

Branched polyether diamine, commercially available under the name, Jeffamine D series-N-Boc D-2000-t-BOC protected diamine, from Huntsman Corporation Another amine commercially sold under the tradename PRIMENE™ JM-T can also be used in the compositions of this invention. PRIMENE™ JM-T is a primary aliphatic amine in which the amino nitrogen atom is linked to a tertiary carbon, which is part of a highly branched ($C_{16}$-$C_{22}$)alkyl group and consists of a mixture of isomers.

Other such additives include, but are not limited to, a silicone surfactant such as TSF4452 (Toshiba Silicone Co., Ltd), a silane coupling agent such as γ-aminopropyl triethoxysilane, a leveling agent, such as γ-(methacryloyloxy propyl) trimethoxysilane, antioxidants such as pentaerythritol tetrakis(3-(3,5-di-tert-butyl-4-hydroxyphenyl)propionate) (IRGANOX™ 1010 from BASF), 3,5-bis(1,1-dimethyl-ethyl)-4-hydroxy-octadecyl ester benzenepropanoic acid (IRGANOX™ 1076 from BASF) and thiodiethylene bis[3-(3,5-di-tert.-butyl-4-hydroxy-phenyl)propionate] (IRGANOX™ 1035 from BASF), a fire retardant such as a trialkyl phosphate or other organic phosphoric compound and a plasticizer such as, poly(propylene glycol).

In addition, various other additives/components can be added to the composition of this invention, which is used for the formation of the photoimagable layer such that its mechanical and other properties can be tailored as desired. Also, other additives can be used to alter the processability, for example, increase the stability of the polymer to thermal and/or light radiation. Non-limiting examples of aforementioned additive compounds are selected from the group consisting of the following, commercially available materials are indicated by such commercial names.

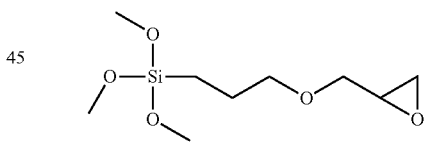

trimethoxy(3-(oxiran-2-ylmethoxy)propyl)silane, also commonly known as 3-glycidoxypropyl trimethoxysilane (KBM-403E from Shin-Etsu Chemical Co., Ltd.)

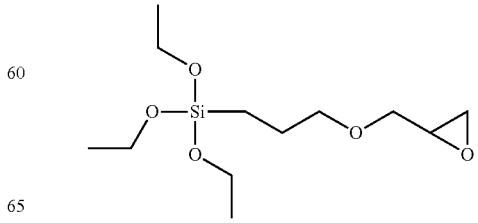

triethoxy(3-(oxiran-2-ylmethoxy)propyl)silane, also commonly known as 3-glycidoxypropyl triethoxysilane (KBE-403 from Shin-Etsu Chemical Co., Ltd.)

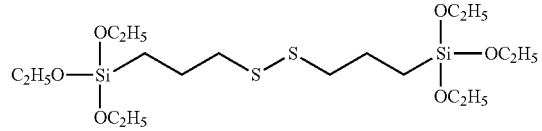

((triethoxysilyl)propyl)disulfide (Si-75 or Si-266 from Evonik)

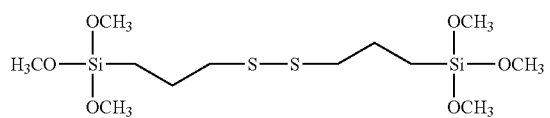

((trimethoxysilyl)propyl)disulfide

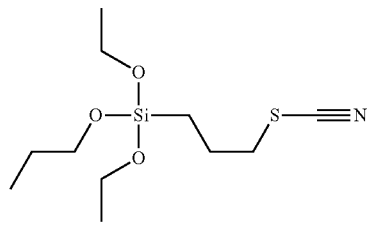 [SMILES: CCCO[Si](CCCSC#N)(OCC)OCC]

diethoxy(propoxy)(3-thiocyanatopropyl)silane, commercially available as SIT-7908.0 from Gelest

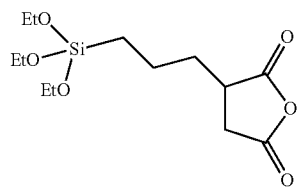 [SMILES: CCO[Si](CCCC1CC(=O)OC1=O)(OCC)OCC]

3-(3-(triethoxysilyl)propyl)dihydrofuran-2,5-dione, commercially available as SIT8192.6 from Gelest

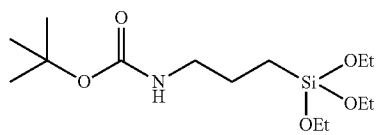 [SMILES: CCO[Si](CCCNC(=O)OC(C)(C)C)(OCC)OCC]

tert-butyl (3-(triethoxysilyl)propyl)carbamate, commercially available as SIT8186.5 from Gelest

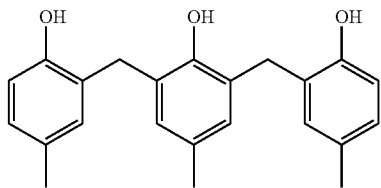 [SMILES: Cc1ccc(O)c(Cc2cc(C)cc(Cc3cc(C)ccc3O)c2O)c1]

2,2'-((2-hydroxy-5-methyl-1,3-phenylene)bis(methylene))bis(4-methylphenol) (AO-80 from TCI Japan)

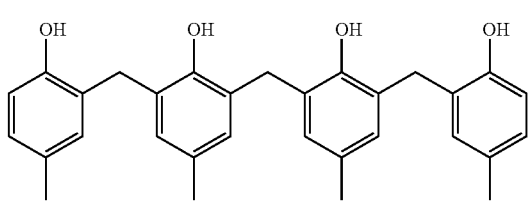 [SMILES: Cc1ccc(O)c(Cc2cc(C)cc(Cc3cc(C)cc(Cc4cc(C)ccc4O)c3O)c2O)c1]

6,6'-methylenebis(2-(2-hydroxy-5-methylbenzyl)-4-methylphenol) (4-PC)

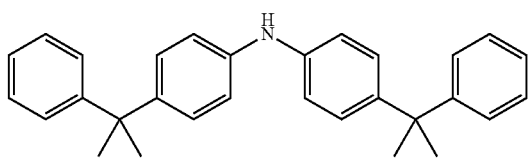 [SMILES: CC(C)(c1ccccc1)c1ccc(Nc2ccc(C(C)(C)c3ccccc3)cc2)cc1]

bis(4-(2-phenylpropan-2-yl)phenyl)amine, commercially available as Naugard-445 from Addivant

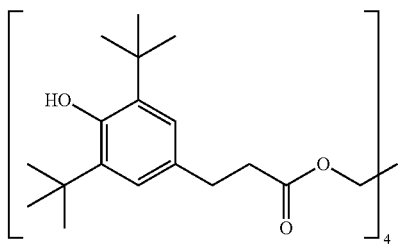

pentaerythritol tetrakis(3-(3,5-di-tert-butyl-4-hydroxyphenyl)propionate) (Irganox 1010 from BASF)

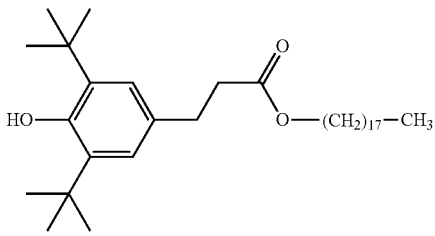

3,5-bis(1,1-dimethylethyl)-4-hydroxy-octadecyl ester benzenepropanoic acid (Irganox 1076 from BASF)

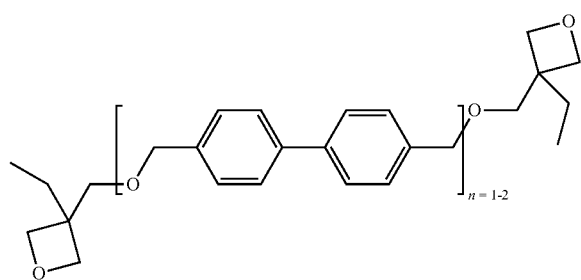

3,3'-[[1,1'-biphenyl]-4,4'-diylbis(methyleneoxymethylene)]bis[3-ethyl-oxetane

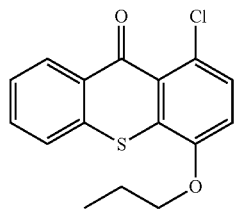 [SMILES: CCCOc1ccc(Cl)c2c(=O)c3ccccc3sc12]

1-chloro-4-propoxy-9H-thioxanthen-9-one (CPTX)

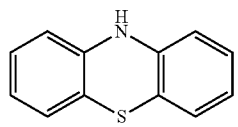 [SMILES: c1ccc2c(c1)Nc1ccccc1S2]

10H-phenothiazine

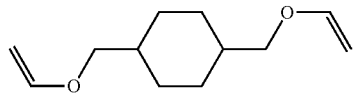

1,4-bis[(ethenyloxy)methyl]-cyclohexane

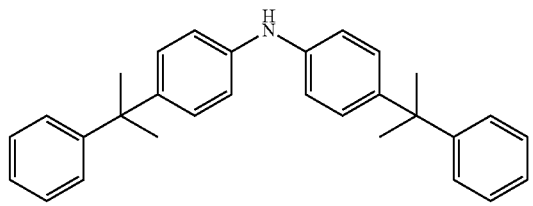 [SMILES: CC(C)(c1ccccc1)c1ccc(Nc2ccc(C(C)(C)c3ccccc3)cc2)cc1]

bis(4-(2-phenylpropan-2-yl)phenyl)amine, commercially available as Naugard 445

In the embodiments of the present invention, these components are generally dissolved in a solvent and prepared into a varnish form to be used. As a solvent, there may be used N-methyl-2-pyrrolidone (NMP), γ-butyrolactone (GBL), N,N-dimethylacetamide (DMAc), dimethylsulfoxide (DMSO), diethyleneglycol dimethylether, diethyleneglycol diethylether, diethyleneglycol dibutylether, propyleneglycol monomethylether (PGME), dipropylene glycol monomethylether, propyleneglycol monomethylether acetate (PGMEA), methyl lactate, ethyl lactate, butyl lactate, methylethyl ketone (MEK), methyl amyl ketone (MAK), cyclohexanone, tetrahydrofuran, methyl-1,3-butyleneglycolacetate, 1,3-butyleneglycol-3-monomethylether, terpineol methylpyruvate, ethyl pyruvate, methyl-3-methoxypropionate or the like. They may be used solely or mixed by optionally selecting two or more kinds.

Another aspect of this invention is to provide compositions which feature long shelf life. It has now been found that addition of certain additives increases the shelf life of the compositions. For example, addition of one or more antioxidants surprisingly increase the shelf life of the photosensitive compositions of this invention. Accordingly, some composition embodiments of this invention includes at least one antioxidant; and in some other embodiments inclusion of two or more antioxidants improves the shelf life stability of the compositions of this invention. Suitable antioxidants include phenolic types, such AO-80, and the like. Other antioxidants include aromatic amine type antioxidants, such as for example, Naugard 445 as described herein. In yet another embodiment of this invention it has now been found that a mixture of phenolic antioxidant and an aromatic amine antioxidant improves enormously the shelf life stability of the compositions of this invention. Thus, in some embodiments a mixture of AO-80 and Naugard 445 is used to improve shelf stability of the composition of this invention.

Any of the amounts of antioxidant that would bring about the effect of shelf life stability can be employed herein. For example, in some embodiments from about 3 to about 15 pphr of one or more antioxidants are used. In some other embodiments 3 to 15 pphr of phenolic antioxidants and 3 to 15 pphr of aromatic amine antioxidants are used. In some other embodiments 3 to 15 pphr of AO-80 and 3 to 15 pphr of Naugard 445 are used.

It should further be noted that the compositions of this invention can also be used as a negative tone imaging composition in which the images formed in the exposed regions are fixed and the unexposed regions are removed using the developer as further discussed in detail below. Typically, in a negative tone composition the imagewise exposure of the film to actinic radiation renders the film less soluble to the developing medium, for example by way of crosslinking of the polymer with a crosslinking agent. This crosslinking reaction can be facilitated by suitably having other additives in the composition such as for example a crosslinking agent which reacts with the polymer of this invention under certain conditions. For example, a photoacid generator (PAG) or a photobase generator may catalyze such crosslinking agent. Accordingly, a negative tone composition generally comprises one or more photoacid or photobase generators.

Exemplary PAGs that can be employed in the compositions of this invention include without any limitation, (p-isopropylphenyl)(p-methylphenyl)-iodonium tetrakis(pentafluoro-phenyl) borate (DPI-TPFPB), available commercially under the trade name RHODORSIL™ Photoinitiator 2074 from Rhodia, Inc.; (2-(4-methoxynaphthalen-1-yl)-2-oxoethyl)dimethylsulfonium tetrakis(perfluorophenyl)borate (MNDS-TPFPB), available commercially under the trade name TAG 382 from Toyo Inc.; tris(4-tert-butyl)phenyl)sulfonium tetrakis-(pentafluorophenyl)borate (TTBPS-TPFPB); tris(4-tert-butyl)phenyl)sulfonium hexafluorophosphate (TTBPS-HFP); triphenylsulfonium triflate (TPS-Tf); triazine (TAZ-101); triphenylsulfonium hexafluoroantimonate (TPS-103); triphenylsulfonium bis(perfluoromethanesulfonyl) imide (TPS-N1); di-(p-t-butyl)phenyliodonium bis(perfluoromethanesulfonyl) imide (DTBPI-N1); potassium tris(trifluoromethanesulfonyl) methanide, commercially available from Synquest Laboratories; di-(p-t-butylphenyl)iodonium tris(trifluoromethanesulfonyl)methanide (DTBPI-C1); diphenyliodonium hexafluorophosphate, diphenyliodonium hexafluorostibate, bis(4-(tert-butyl)phenyl)iodonium hexafluorophosphate, bis(4-(tert-butyl)phenyl)iodonium hexafluorostibate (DTBPI-Tf), diphenyliodonium trifluoromethanesulfonate, diphenyliodonium 1,1,2,2,3,3,4,4,4-nonafluorobutane-1-sulfonate; bis(4-(tert-butyl)phenyl)iodonium trifluoromethanesulfonate; and bis(4-(tert-butyl)phenyl)iodonium 1,1,2,2,3,3,4,4,4-nonafluorobutane-1-sulfonate; and combinations thereof.

In some embodiments the PAG used in the composition of this invention is selected from the group consisting of:

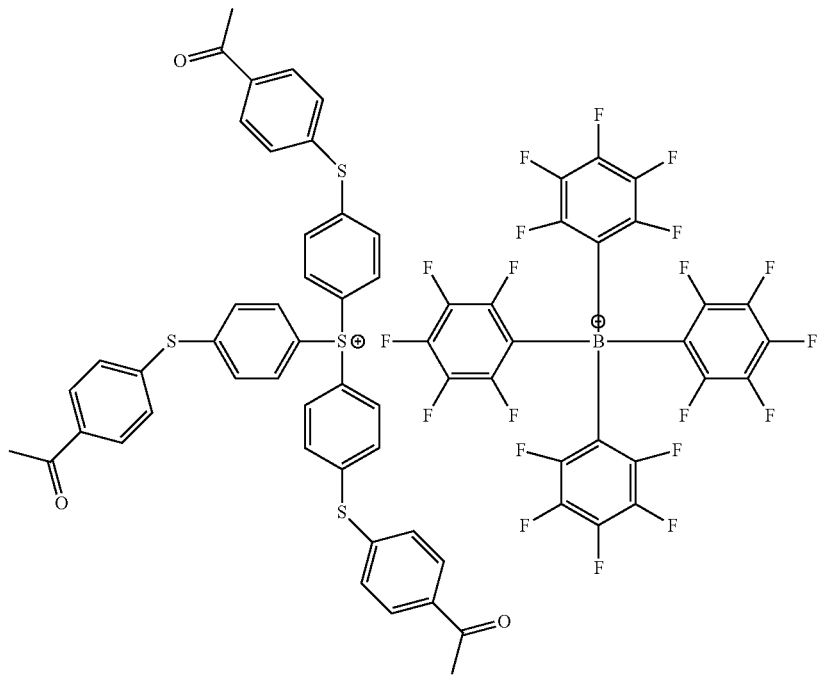

tris(4-((4-acetylphenyl)thio)phenyl)sulfonium tetrakis(perfluorophenyl)borate (Irgacure PAG 290, commercially available from BASF)

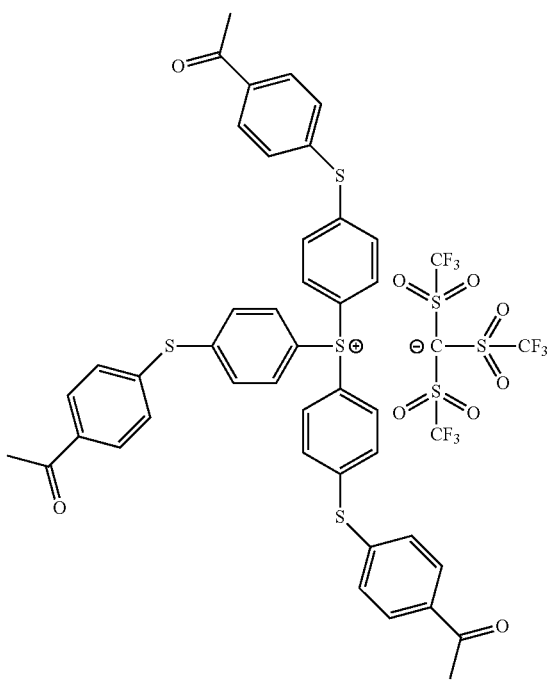 [SMILES: CC(=O)c1ccc(Sc2ccc([S+](c3ccc(Sc4ccc(C(C)=O)cc4)cc3)c3ccc(Sc4ccc(C(C)=O)cc4)cc3)cc2)cc1 ; O=S(=O)([C-](S(=O)(=O)C(F)(F)F)S(=O)(=O)C(F)(F)F)C(F)(F)F]

tris(4-((4-acetylphenyl)thio)phenyl)sulfonium tris((trifluoromethyl)sulfonyl)methanide

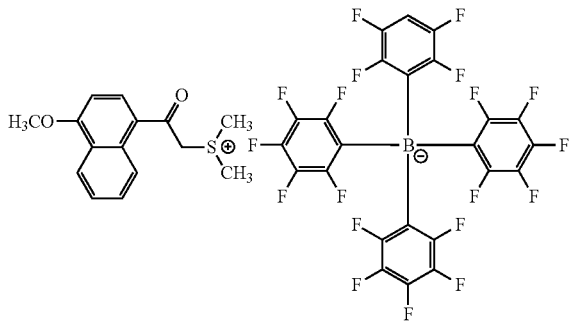 [SMILES: COc1ccc(C(=O)C[S+](C)C)c2ccccc12 ; Fc1cc(F)c(F)c([B-](c2c(F)c(F)c(F)c(F)c2F)(c2c(F)c(F)c(F)c(F)c2F)c2c(F)c(F)c(F)c(F)c2F)c1F]

(2-(4-methoxynaphthalen-1-yl)-2-oxoethyl)dimethylsulfonium tetrakis(perfluorophenyl)borate

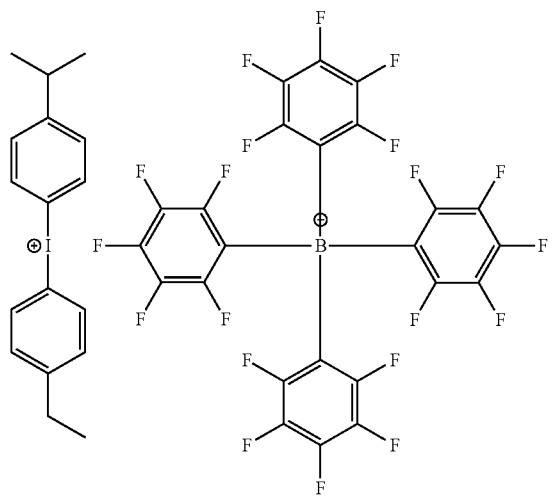 [SMILES: CCc1ccc([I+]c2ccc(C(C)C)cc2)cc1 ; Fc1c(F)c(F)c([B-](c2c(F)c(F)c(F)c(F)c2F)(c2c(F)c(F)c(F)c(F)c2F)c2c(F)c(F)c(F)c(F)c2F)c(F)c1F]

(4-ethylphenyl)(4-isopropylphenyl)iodonium tetrakis(perfluorophenyl)borate (Rhodorsil PI2074)

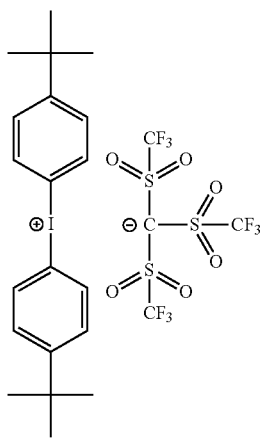 [SMILES: CC(C)(C)c1ccc([I+]c2ccc(C(C)(C)C)cc2)cc1 ; O=S(=O)([C-](S(=O)(=O)C(F)(F)F)S(=O)(=O)C(F)(F)F)C(F)(F)F]

di-(p-t-butylphenyl)iodonium tris(trifluoromethanesulfonyl)methanide

Again, as noted above, one or more of the above listed PAGs can be used as a mixture in any combination thereof. Any amount of PAG can be employed in the composition of this invention which brings about the desired results as described herein. Generally, such amount can range from 0.1 to 5 parts per hundred parts by mass (pphr) of the polymer (resin) as described herein. In some other embodiments such amount can range from 0.5 to 3 pphr and in some other embodiments such amount can range from 1 to 2 pphr.

The composition embodiments, in accordance with the present invention, are first applied to a desired substrate to form a film. Such a substrate includes any appropriate substrate as is, or may be used for electrical, electronic or optoelectronic devices, for example, a semiconductor substrate, a ceramic substrate, a glass substrate. With regard to said application, any appropriate coating method can be employed, for example spin coating, spraying, doctor blading, meniscus coating, ink jet coating and slot coating.

Next, the coated substrate is heated to facilitate the removal of residual casting solvent, for example to a temperature from 70° C. to 130° C. for from 1 to 30 minutes, although other appropriate temperatures and times can be used. After the heating, the film is generally imagewise exposed to an appropriate wavelength of actinic radiation, wavelength is generally selected based on the choice of the photoactive compound and/or photosensitizer incorporated into the composition as described herein. However, generally such appropriate wavelength is from 193 to 700 nm. It will be understood that the phrase "imagewise exposure" means exposing through a masking element to provide for a resulting pattern of exposed and unexposed portion of the film.

After an imagewise exposure of the film formed from composition embodiments in accordance with the present invention, a development process is employed. For the positive tone polymer formulations of the present invention, such development process removes only exposed portions of the film thus leaving a positive image of the masking layer in the film, leaves behind an unexposed film. For the negative tone composition of the present invention, such development process removes the unexposed portions of the film thus leaving a negative image of the masking layer in the film. For some embodiments, a post exposure bake can be employed prior to the development process.

The development process generally utilizes an aqueous or an organic solvent developer. Suitable aqueous developers include solutions of inorganic alkalis such as sodium hydroxide, potassium hydroxide, sodium carbonate, ammonia, and aqueous solutions of organic alkalis such as 0.26N tetramethylammonium hydroxide (TMAH), ethylamine, triethylamine and triethanolamine. Where an organic alkali is used, generally an organic solvent essentially fully miscible with water is used to provide adequate solubility for the organic alkali. Aqueous solutions of TMAH are well known developer solutions in the semiconductor industry. Suitable developers can also include organic solvents such as propylene glycol monomethyl ether acetate (PGMEA), di(propylene glycol) methyl ether acetate (DIPGMEA), 2-heptanone, cyclohexanone, toluene, xylene, ethyl benzene, mesitylene and butyl acetate, and a mixture in any combination thereof, among other suitable solvents.

Thus some formulation embodiments of the present invention provide self-imagable films that after imagewise exposure, the resulting image is developed using an aqueous base solution, while for other such embodiments the resulting image is developed using an organic solvent. Regardless of which type of developer is employed, after the image is developed, the substrate is rinsed to remove excess developer solution, typical rinse agents are water or appropriate alcohols and mixtures thereof.

After the aforementioned rinsing, the substrate is dried and the imaged film finally cured. That is to say, the image is fixed. Where the remaining layer has not been exposed during the imagewise exposure, image fixing is generally accomplished by causing a reaction within the remaining portions of the film. Such reaction is generally a cross-linking reaction that can be initiated by heating and/or non-imagewise or blanket exposure of the remaining material. Such exposure and heating can be in separate steps or combined as is found appropriate for the specific use of the imaged film. The blanket exposure is generally performed using the same energy source as employed in the imagewise exposure although any appropriate energy source can be employed. Further an optional heating step may be carried out at a desirable temperature, for example, from above 110° C. for a time of from 40 min to one or more hours, which is typically called as "hard bake" step. Accordingly, in some embodiments such hard bake heating can be at 165° C. for 3 to 6 hours, 170° C. for 4 to 6 hours or 175° C. for 4 to 6 hours, and so on. Where the remaining layer has been exposed during the image-wise exposure, image fixing is generally accomplished by a heating step to be tailored to complete any reaction initiated by the exposure. However an additional blanket exposure and heating, as discussed above, can also be employed. It should be realized, however, that the choice of a final cure process is also a function of the type of device being formed; thus a final fixing of the image may not be a final cure where the remaining layer is to be used as an adhesive layer or structure.

Accordingly, in some embodiments the resulting imagewise film or layer is further cured by heating the patterned and developed substrate at a temperature of from about 120° C. to about 250° C. for about 20 minutes to about 240 minutes. In some other embodiments such curing is carried out at a temperature of from about 130° C. to about 200° C. for about 30 minutes to about 180 minutes. In yet some other embodiments such curing is carried out at a temperature of from about 150° C. to about 180° C. for about 60 minutes to about 120 minutes. Finally, in some other embodiments of this invention, the curing is performed at a temperature of from about 130° C. to about 200° C. at an incremental heating ramp of about 5° C./minute and for about 1 to 3 hours.

The devices are produced by using embodiments of the composition of the present invention to form layers which are characterized as having high heat resistance, an appropriate water absorption rate, high transparency, and low permittivity. In addition, such layers generally have an advantageous coefficient of elasticity after curing, 0.1 kg/mm$^2$ to 200 kg/mm$^2$ being typical.

As previously mentioned, exemplary applications for embodiments of the photosensitive compositions in accordance with the present invention include die attach adhesive, wafer bonding adhesive, insulation films (interlayer dielectric layers), protecting films (passivation layers), mechanical buffer films (stress buffer layers) or flattening films for a variety of semiconductor devices, and printed wiring boards. Specific applications of such embodiments encompass a die-attach adhesive to form a single or multilayer semiconductor device, dielectric film which is formed on a semiconductor device; a buffer coat film which is formed on the passivation film; an interlayer insulation film which is formed over a circuit formed on a semiconductor device.

Accordingly, some embodiments in accordance with the present invention therefore provide a composition which exhibits enhanced characteristics with respect to one or more of mechanical properties (high tensile strength, high elongation to break and high thermocycling (TCT) as well as low-stress and retained elongation to break after aging) and at least equivalent chemical resistance, as compared to alternate materials. In addition such embodiments provide generally excellent electrical insulation, adhesion to the substrate, and the like. Thus semiconductor devices, device packages, and display devices are provided that incorporate embodiments in accordance with the present invention.

In particular, the compositions of this invention can be used to form adhesive layers for bonding the semiconductor chips to each other, such as in chip-stack applications. For example, a bonding layer used for such a purpose is composed of a cured product of the adhesive composition of the present invention. Although the adhesive layer is generally a single-layer structure, it should provide sufficient adhesiveness to the substrate and should be free of significant stress resulting due to the curing step. Accordingly, it is now possible to avoid undesirably thick layer of film encompassing the chip as a laminate. It is further anticipated that the laminates formed in accordance with the present invention are reliable in that the relaxation of stress concentration between layers caused by thermal expansion difference or the like can be obtained. As a result, the semiconductor device having low height and high reliability can be obtained. That is, devices with low aspect ratio and low thickness can be obtained. Such semiconductor device becomes particularly advantageous to electronic equipment, which has very small internal volume and is in use while carrying as a mobile device, for example.

Generally, the developed patterned layer is hardbaked at a desirable temperature to remove any of the components contained therein which may decompose and/or outgas during the downstream processing conditions. For example, the photoactive compounds (PACs), such as the diazo compounds of formula (V) as well as the photoacid generators (PAGs) used herein decompose and may outgas at certain high temperature conditions. Therefore, any PACs left in the exposed patterned layer need to be removed by post development hard baking at a suitable temperature in order to avoid any downstream outgassing. The hardbake can be carried out by heating the developed patterned layer at any temperature higher than 110° C. and typically in the temperature range of 120° C. to 170° C. for a period of about 20 minutes to several hours.

Next, the hardbaked surface is reactive ion etched (RIE) to remove any minor contamination or scum in the developed areas of the substrate (i.e., a wafer). Any of the RIE methods can be used for this purpose. Then the etched layer is ashed to prepare the surface for thermo-compression bonding with another substrate to form a plurality of chip-stacks.

It has now been found that by employing the compositions of this invention very high resolution images can be formed. The resolution of the images can be in the range from 1 to 100 μm. In some other embodiments, the resolution of the images can be in the range from 3 to 30 μm. In yet some other embodiments, the resolution of the images can be in the range from about 5 to 15 μm.

Further, in some embodiments of this invention as described above, the electronic and/or the semiconductor device according to this invention encompass a laminated semiconductor element where said lamination consists of a composition according to the present invention.

In some embodiments of this invention, the semiconductor device encompassing a redistribution layer (RDL) structure further incorporates a composition according to this invention.

Further, in some embodiments of this invention as described above, the semiconductor device encompassing a chip stack structure further includes a composition according to this invention.

In yet some other embodiments of this invention as described above, the semiconductor device encompassing a complementary metal oxide semiconductor (CMOS) image sensor dam structure further incorporates a photosensitive composition according to this invention.

In addition, in some embodiments of this invention as described above, a film is formed by the photosensitive composition according to this invention. As further described above, such films generally exhibit excellent chemical, mechanical, elastic properties having a wide variety of utility in electronic, optoelectronic, microelectromechanical applications featuring excellent dielectric properties.

Accordingly, in some embodiments of this invention, there is provided a microelectronic or optoelectronic device encompassing one or more of a redistribution layer (RDL) structure, a chip-stack structure, a CMOS image sensor dam structure, where said structures further incorporates a composition according to this invention.

Further, in some embodiments of this invention, there is provided a method of forming a film for the fabrication of a microelectronic or optoelectronic device comprising:

coating a suitable substrate with a composition according to the invention to form a film;

patterning the film with a mask by exposing to a suitable radiation;

developing the film after exposure to form a photopattern; and curing the film by heating to a suitable temperature.

The coating of the substrate with photosensitive composition of this invention can be performed by any of the coating procedures as described herein and/or known to one skilled in the art, such as by spin coating.

In addition, the developing in accordance with the method of this invention can be performed by any of the known developing techniques such as by the use of an aqueous base solution such as TMAH or an organic solvent as described herein.

In some embodiments of this invention, the method according to this invention utilizes a developer, which is PGMEA and aqueous base developers such as TMAH (commercially available under the tradename CD-26 from Microchem).

In addition, in some of the embodiments of this invention, a substrate is first hard baked in the method according to this invention before the curing step at a temperature of from 130° C. to 160° C. for 20 minutes to 60 minutes.

Finally, in some other embodiments of this invention, the curing is performed at a temperature of from 170° C. to 200° C. at an incremental heating ramp of 5° C. and for 1 to 5 hours.

In another embodiment there is further provided a method of manufacturing a semiconductor device having a plurality of chip stacks comprising:

coating a surface of a first substrate with a photosensitive composition according to the invention to form a film;

heating the coated substrate to a temperature from 70° C. to 130° C. for 1 to 30 minutes;

imagewise exposing the coated substrate to an actinic radiation to form a patterned layer on the substrate;

developing the patterned layer;

heating the patterned layer;

subjecting the heated patterned layer to reactive ion etching (ME) to remove any contaminants or scum in the developed areas of the substrate;

subjecting the etched layer to ashing to prepare the surface for thermo-compression bonding;

providing a second substrate;

contacting the second substrate to the surface of the first substrate containing the polymer layer where such contacting comprises thermal compression bonding whereby causing the bonding of the surface of the first substrate with the surface of the second substrate; and curing the first and second substrate by heating to a suitable temperature.

The following examples are detailed descriptions of methods of preparation and use of certain compounds/monomers, polymers and compositions of the present invention. The detailed preparations fall within the scope of, and serve to exemplify, the more generally described methods of preparation set forth above. The examples are presented for illustrative purposes only, and are not intended as a restriction on the scope of the invention. As used in the examples and throughout the specification the ratio of monomer to catalyst is based on a mole to mole basis.

EXAMPLES

The following abbreviations have been used hereinbefore and hereafter in describing some of the compounds, instruments and/or methods employed to illustrate certain of the embodiments of this invention:
HFANB—2-(bicyclo[2.2.1]hept-5-en-2-ylmethyl)-1,1,1,3,3,3-hexafluoropropan-2-ol; NBTON—5-((2-(2-methoxyethoxy)ethoxy)-methyl)bicyclo[2.2.1]hept-2-ene; NA—nadic anhydride; NB-3-MPM—5-(3-methoxypropoxy)methyl-2-norbornene; NBMeOAc—bicyclo[2.2.1]hept-5-en-2-ylmethyl acetate; HexenylNB—5-(hex-5-en-1-yl)bicyclo[2.2.1]hept-2-ene; GlyHFIPNB—2-((2-(bicyclo[2.2.1]hept-5-en-2-ylmethoxy)ethoxy)methyl)-1,1,1,3,3,3-hexafluoropropan-2-ol DANFABA—N,N-dimethylaniliniumtetrakis(pentafluoro-phenyl)borate; Pd-733-Pd(II)(dicyclohexylisopropylphosphine)$_2$ diacetate; Pd-1206—Pd(II)(t-butylnitrile)-(triisopropylphosphine)$_2$ acetate tetrakis(pentafluorophenyl)borate; Pd-1425—Pd(II)(1,3-bis(2,6-diisopropylphenyl)-2,3-dihydro-1H-imidazol-2-ylidene)(3-chloropyridine)(ethyl acetate) chloride tetrakis(pentafluorophenyl)borate; Pd-1308—di-palladium(0), bis[1,3-bis(2,6-disopropylphenyl)-2,3-dihydro-1H-imidazol-2-ylidene]bis[(1,4-naphthalenedione); Pd-686—Pd(II)(1,3-bis(2,6-diisopropylphenyl)-2,3-dihydro-1H-imidazol-2-ylidene)(t-butylamine) diacetate; Pd-785—Pd(II)(tricyclohexylphosphine)$_2$ diacetate; Pd-1336—Pd(II)(t-butylnitrile)(dicyclohexylisopropylphosphine)$_2$ hydride tetrakis(pentafluorophenyl)borate; Jeffamine D series N-Boc D-2000—Branched polyether diamine; Denacol EX-321L—2,2'-((2-ethyl-2-((oxiran-2-ylmethoxy)methyl)propane-1,3-diyl)bis(oxy))bis(methylene))bis(oxirane); BY16-115—silicone modified epoxy resin; Naugard 445—bis(4-(2-phenylpropan-2-yl)phenyl)amine; AO-80-2,2'-((2-hydroxy-5-methyl-1,3-phenylene)bis(methylene))bis(4-methylphenol); Rhodorsil (4-ethylphenyl)(4-isopropylphenyl)iodonium tetrakis(perfluorophenyl)borate; CPTX—1-chloro-4-propoxy-9H-thioxanthen-9-one; pphr— parts per hundred parts of the polymer resin; and GPC—gel permeation chromatography; $M_w$: weight average molecular weight; $M_n$: number average molecular weight; PDI: polydispersity index ($M_w/M_n$).

POLYMER EXAMPLES

Example 1

NBTON/NA Copolymer (70:30 Molar Ratio)

An appropriate sized reaction vessel was purged with nitrogen to minimize air and water contamination. The vessel was then charged with: anhydrous toluene (72 g), anhydrous ethyl acetate (72 g), nadic anhydride (23.7 g, 0.144 mol) and DANFABA (2.3 g, 3 mmol). The reaction medium was purged of oxygen by passing a stream of dry nitrogen through the solution for 30 minutes. Vessel was heated to 90° C. NBTON (76.2 g, 0.337 mol) was purged of oxygen with nitrogen in a separate bottle and loaded into a stainless steel septum, after the purging was completed, 0.706 g (0.963 mmol) of Pd-733 was dissolved in 4 ml of anhydrous toluene and 4 ml anhydrous ethyl acetate and then was injected into the reaction vessel containing the monomer. Simultaneously, the metered feed portion of the monomers was added at a rate intended to keep unreacted monomers at a constant level for the duration of the polymerization (36 hr). Polymerization was stirred one additional hour after monomer addition had stopped then allowed to cool to room temperature. Any unreacted monomers were removed via two liquid-liquid extractions with toluene, acetonitrile, heptane and ethyl acetate. To this product mixture was added tetrahydrofuran (442 g), and 30 wt % hydrogen peroxide (4.62 g, 40.7 mmols). The contents were pressurized with carbon monoxide (65 psig) and heated at 80° C. for 6.5 hr. After the contents had cooled to room temperature, the solution was passed through a 0.2 μm filter to remove the residual palladium. The polymer solution was then precipitated into excess heptanes, collected by filtration, and dried in a vacuum oven. GPC—$M_w$=32,500, $M_n$=13,300, PDI—2.4, % Conversion=91. The molar ratio of NBTON to NA was determined to 70:30 by anhydride assay; the acidity of the polymer was found to be 0.9 mmols/g.

Examples 2-3

NBTON/NA Copolymer (70:30 Molar Ratio)

The procedures of Example 1 were substantially repeated in Examples 2 and 3. The percent conversion, weight average and number average molecular weight and the PDI of the title polymer are summarized in Table 1. Also listed in Table 1 is the measured acidity of the polymer.

TABLE 1

|  | Example 2 | Example 3 |
|---|---|---|
| % Conversion | 92 | 83 |
| $M_w$ (GPC) | 31,400 | 35,900 |
| $M_n$ (GPC) | 10,600 | 13,600 |
| PDI | 2.9 | 2.6 |
| Acidity (mmols/g) | 0.9 | 0.9 |

Example 4

NBTON/NA Copolymer (70:30 Molar Ratio)

An appropriate sized reactor was charged with 75/25 exo/endo nadic anhydride (93.6 g, 0.57 mol), and purged with nitrogen to minimize air and water contamination. The vessel was then charged with anhydrous toluene (327.2 g), anhydrous ethyl acetate (195.25 g), and 10% dimethylanilinium tetrakis(pentafluorophenyl)borate (DANFABA) solution (9.13 g of DANFABA in 82.21 g of anhydrous ethyl acetate). The reactor was inerted by performing 3 pressure/vacuum swings from +20 psig nitrogen to 10" Hg vacuum. The reactor was then heated to 90° C. while mixing. NBTON (301 g, 1.33 mol) was charged to a metering pump. After the contents of the reactor was at temperature, 2.785 g (3.8 mmol) of Pd-733 dissolved in 52.92 g of anhydrous ethyl acetate was injected into the reactor containing the monomer. Simultaneously, NBTON was added at a rate intended to keep the relative monomer composition within the reactor at a constant level for the duration of the polymerization (36 h). The contents of the reactor were stirred for one additional hour, toluene was added to the reactor and then cooled to room temperature. Any unreacted monomers were removed via two liquid-liquid extractions with toluene, acetonitrile, heptanes and ethyl acetate. The resulting polymer solution was concentrated to a total solids (TS)>16%. Palladium (Pd) was then removed from the polymer solution in an appropriate sized reactor by adding 30% hydrogen peroxide in water (5.5 g), diluting with THF to a TS of 15%, pressurizing to 65 psig with carbon monoxide and heating to 80° C. for 6.5 hours while mixing. The polymer solution was then cooled to 30° C. and filtered through a 0.2 micron filter. The polymer solution was then precipitated into heptanes, filtered through grade 4 filter paper and the polymer solids were vacuum oven dried at 60° C. for 24 hours. Conversion: 86% (by gas chromatography); $M_w$=35,000, PDI=2.9 (GPC)

Examples 5-7

NBTON/NA Copolymer

The procedures of Example 1 were substantially repeated in Examples 5 to 7 except that different molar ratios of NBTON and NA were employed as listed in Table 2. The percent conversion, weight average and number average molecular weight, PDI and the mole ratio of the title polymer are also summarized in Table 2.

TABLE 2

|  | Example 5 | Example 6 | Example 7 |
|---|---|---|---|
| Mole Ratio -NBTON/NA | 90/10 | 85/15 | 60/40 |
| % Conversion | 86 | 93 |  |
| $M_w$ (GPC) | 22,200 | 23,700 | 15,200 |
| $M_n$ (GPC) | 11,600 | 11,000 | 8,500 |
| PDI | 1.9 | 2.1 | 1.8 |

Examples 8-13

NBTON/NA Copolymer (70:30 Molar Ratio)

The procedures of Example 1 were substantially repeated in Examples 8 to 13 except that different palladium catalysts were employed as listed in Table 3. The percent conversion, weight average molecular weight and PDI of the title polymer are summarized in Table 3.

TABLE 3

|  | Example 8 | Example 9 | Example 10 | Example 11 | Example 12 | Example 13 |
|---|---|---|---|---|---|---|
| Palladium Catalyst | Pd-1206 | Pd-1425 | Pd-1308 | Pd-686 | Pd-785 | Pd-1336 |
| % Conversion | 80 | 20 | 30 | 33 | 78 | 90 |
| $M_w$ (GPC) | 13,000 | 160,000 | 82,000 | 95,000 | 45,200 | 13,600 |
| PDI | 2.2 | 2.4 | 2.9 | 2 | 2.5 | 2.5 |

Examples 13A and 13B

NBTON/NA Copolymer (70:30 Molar Ratio)

The procedures of Example 1 were substantially repeated in Examples 13A and 13B except that 100% exo-NA was used in Example 13A and in Example 13B 77/23 exo/endo mixture of NA was employed. The percent conversion, weight average molecular weight and PDI of the title polymer are summarized in Table 3A.

TABLE 3A

|  | Example 13A | Example 13B |
|---|---|---|
| % Conversion | 80 | 80 |
| $M_w$ (GPC) | 27,000 | 32,000 |
| PDI | 2.9 | 2.5 |

FIG. 1 shows a plot of the shear rate dependence of the viscosity of the polymer solution of Examples 13A and 13B in PGMEA as solvent. In both cases the viscosity was measured with a polymer solution containing 27.4 wt. % of the polymer in PGMEA. It is evident that only the polymer of Example 13A which contained 100% exo isomer of NA exhibits thixotrophic behavior where a remarkable shear thinning occurs as the shear rate is increased. Whereas much less shear thinning effect was observed with the polymer of Example 13B which contained 77/23 mixture of the exo/endo isomer of NA.

Examples 14-16

HFANB/NA Copolymer (70:30 Molar Ratio)

The procedures of Example 1 were substantially repeated in Examples 14 to 16 except that NBTON was replaced with HFANB. The percent conversion, weight average molecular weight and PDI of the title polymer are summarized in Table 3B.

TABLE 3B

|  | Example 14 | Example 15 | Example 16 |
|---|---|---|---|
| % Conversion | 100 | 90 | 80 |
| $M_w$ (GPC) | 14,700 | 14,500 | 34,500 |
| PDI | 2.4 | 2 | 2.1 |

Example 17

NB-3-MPM/NA Copolymer (70:30 Molar Ratio)

The procedures of Example 1 were substantially repeated in Example 17 except that NBTON was replaced with NB-3-MPM. The percent conversion to title polymer was 80%. GPC, $M_w$ 34,000 and PDI 1.1.

Examples 18-20

Terpolymers of NA

The procedures of Example 1 were substantially repeated in Examples 18 to 20 except that an additional monomer along with NBTON and NA were fed into the reactor as listed in Table 4. The molar ratios of the monomers in the terpolymer, percent conversion, weight average molecular weight and PDI of the title polymer are also summarized in Table 4.

TABLE 4

|  | Example 18 NA/NBTON/MeOAcNB | Example 19 NA/NBTON/HexenylNB | Example 20 NA/NBTON/GlyHFIPNB |
|---|---|---|---|
| Mole Ratio | 22/62/16 | 19/79/2 | 18/59/23 |
| % Conversion | 90 | 90 | 90 |
| $M_w$ (GPC) | 25,800 | 23,200 | 39,800 |
| PDI | 2.1 | 2 | 2.5 |

Composition Example 21

In an appropriately sized amber HDPE bottle were mixed a 15 wt. % solution of copolymer from Example 1 in GBL (16.07 g), TrisP-3M6C-2-201 (0.6 g, 25 wt. %), N-Boc BAFA (0.6 g, 25 wt. %), and additional GBL (1.16 g) to target appropriate viscosity for film thickness by spin-coating. The mixture in HDPE bottle was rolled overnight (approximately for about 16 hours) to produce a homogenous solution of the polymer formulation. Particle contamination was removed by filtering the polymer solution through a 1 μm pore PTFE disc filter under 35 psi pressure, the filtered polymer solution was collected in a low particle HDPE amber bottle and the resulting solution was stored at 5° C.

Composition Example 22

The procedures of Example 21 were substantially repeated in this Example 22 except that n-butyl 4-hydroxybenzoate (0.117 g) was added to the composition as an additional component.

Examples 23-24

Imaging Examples (TMAH)

The compositions from Examples 21 and 22 were brought to room temperature and each of which was applied to a 100 mm diameter silicon wafer by spin coating at 500 rpm for 10 seconds and then at 1500 rpm for 30 seconds for the composition of Example 21 and at 1200 rpm for 30 seconds for the composition of Example 22; both on a CEE-200 CB spin coater (Brewer Scientific). The substrates were then placed on a 120° C. hot plate for 240 seconds, providing about 8-9 μm thick polymer film in each case. Each polymer film was then imagewise exposed through a range of exposure energies from 100-500 mJ/cm$^2$ on a GCA AutoStep 200 i-line (5× reduction) stepper. Each film was then developed using a puddle development method having about 2-4 30 second immersions in 0.26N TMAH. After the develop process each wafer was rinsed by spraying deionized water for 5 seconds and then dried by spinning at 3000 rpm for 15 seconds. Each film was then evaluated to determine the threshold energy ($E_{th}$) required to give a 100 μm square via hole.

Table 5 summarizes film thickness and the developing conditions of each of these films in these two Examples 23 and 24.

TABLE 5

| | Example 23 | Example 24 |
|---|---|---|
| Film Thickness (Initial, μm) | 9 | 7.8 |
| Develop Sequence (times × sec) | 4 × 30 | 1 × 35, 1 × 30 |
| Develop time (sec) | 140 | 75 |
| Film Thickness (Final, μm) | 8.3 | 6.9 |
| % Cure Shrinkage | 7.8 | 11.5 |
| $E_{th}$ (mJ/cm$^2$) | 450 | 250 |

Figure 2A:
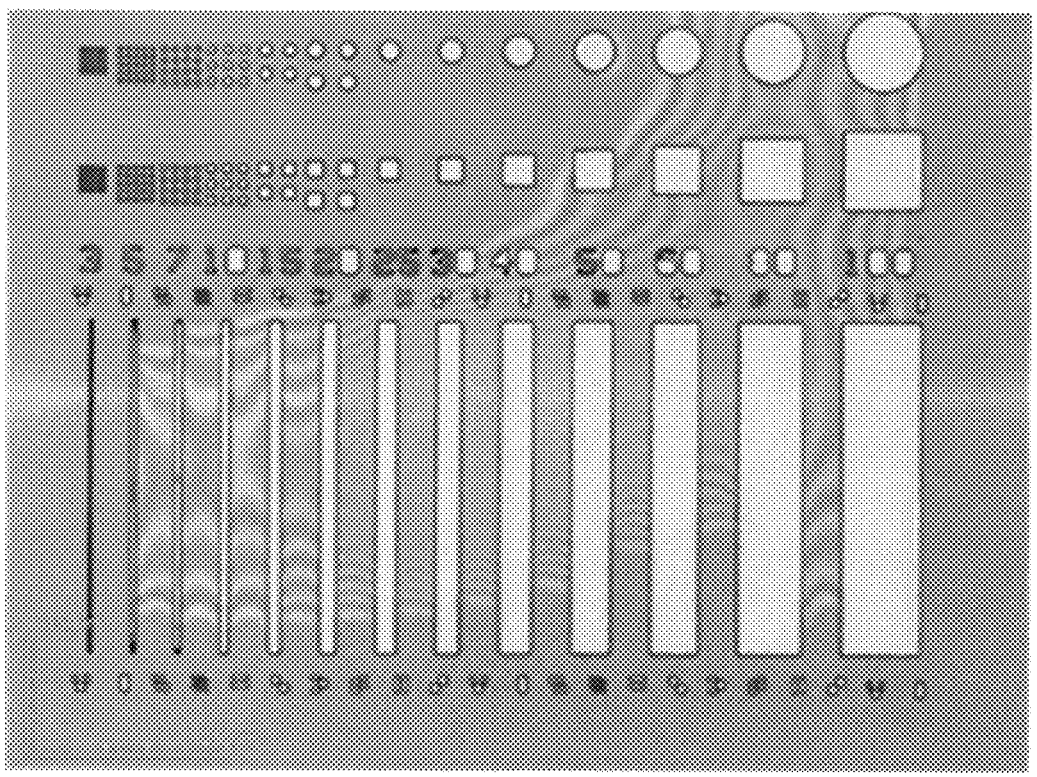
FIG. 2A shows an optical micrograph of a positive tone lithographic images of line and space pattern obtained from a composition embodiment of this invention.
Figure 2B:
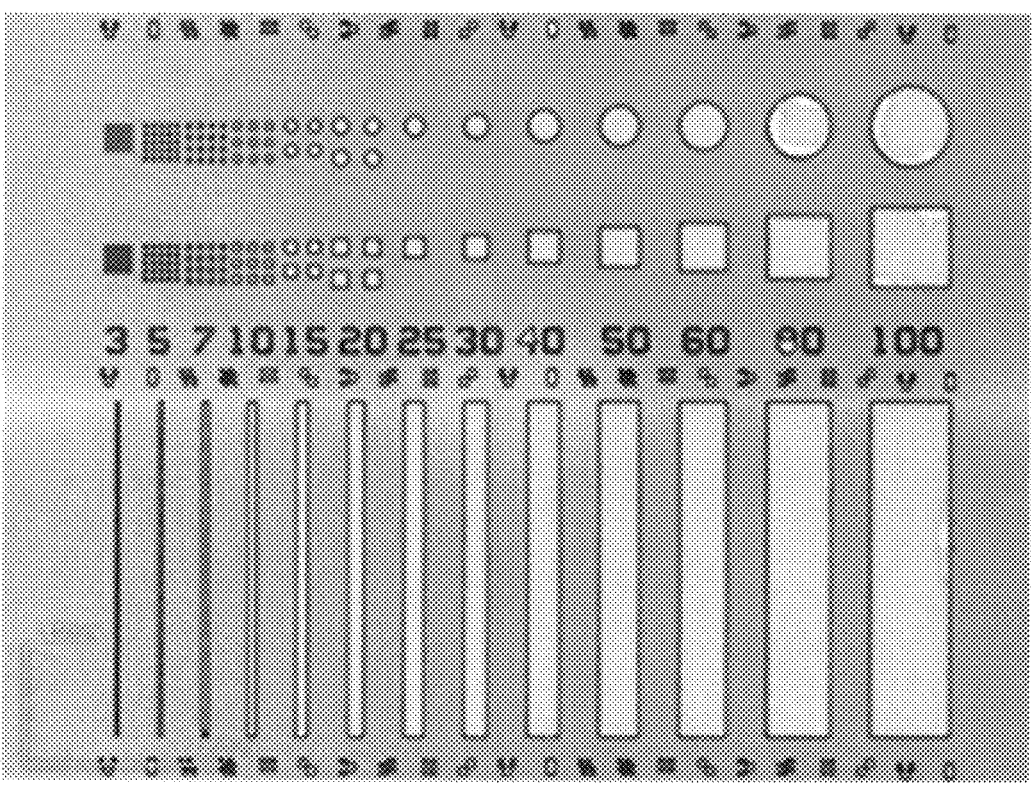
FIG. 2B shows an optical micrograph of a positive tone lithographic images of line and space pattern obtained from another composition embodiment of this invention.

FIGS. 2 and 3 show optical micrographs of the line and space pattern obtained from the compositions of Examples 21 and 22 respectively. It is quite evident from FIG. 2 that the image quality was reasonably good but the $E_{th}$ required to obtain this quality image was much higher than that used in Example 24, 450 mJ in Example 23 vs. 250 mJ in Example 24. In addition, the develop sequence involved four immersions of 30 seconds each in Example 23, but only two immersions of 30 seconds each was used in Example 24. It should be noted further that shorter development time was used in Example 24 as summarized in Table 5. This aspect is more evident in FIG. 2B, which shows much better quality line and space patterns obtained for the composition of Example 22.

Accordingly, it should be noted that the compositions can be tailored to desired result. That is, by having an additional additive of n-butyl 4-hydrozybenzoate as a dissolution promoter, the overall image quality of the compositions of this invention can be improved.

Examples 25-26

The procedures of Examples 23 and 24 were substantially repeated in these Examples 25 and 26 except that 10 μm via arrays were formed on the silicon wafer.

Figure 3A:
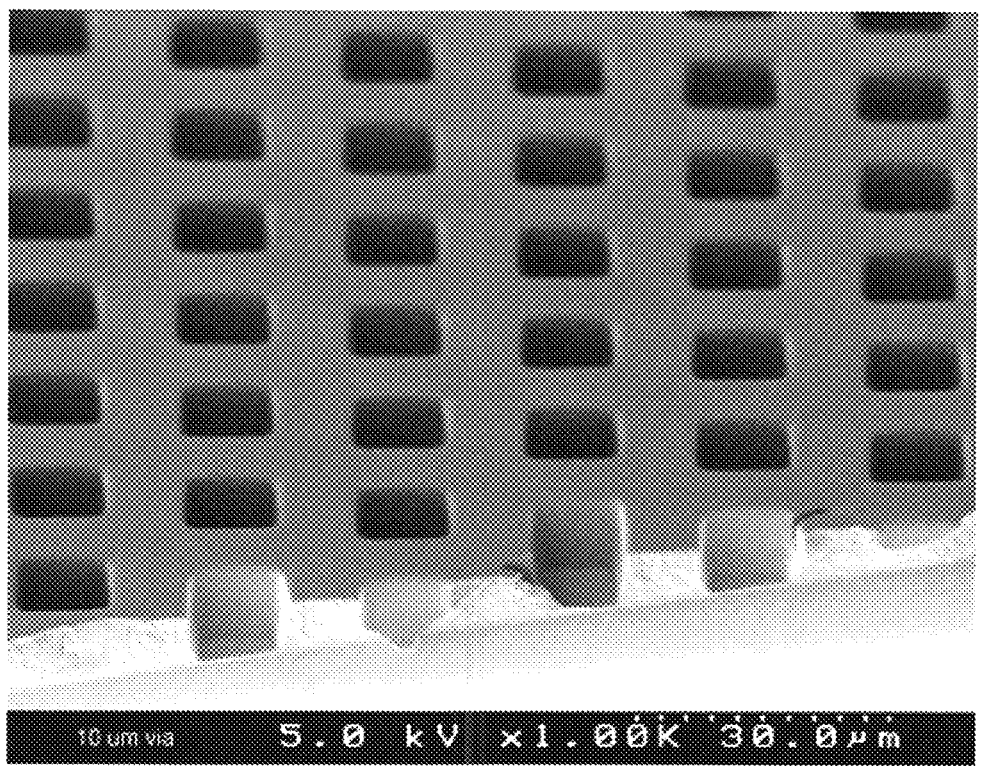
FIG. 3A shows a scanning electron micrograph (SEM) of a positive tone lithographic images of 10 μm via array pattern obtained from another composition embodiment of this invention.
Figure 3B:
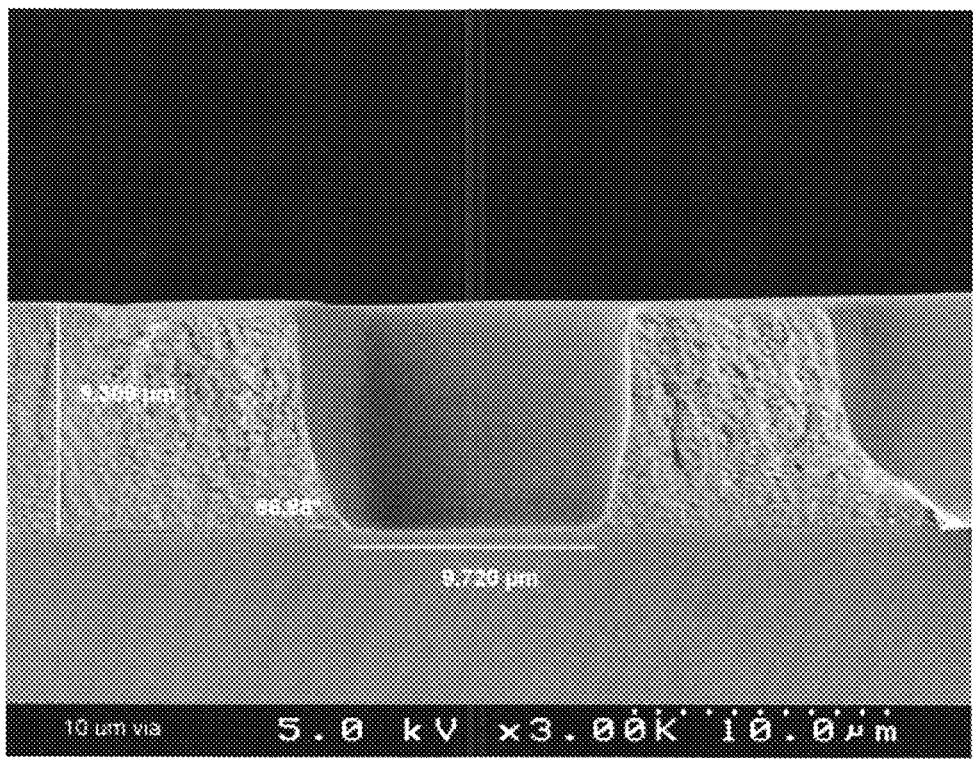
FIG. 3B shows a scanning electron micrograph (SEM) of a cross-sectional view of one of 10 μm vias of FIG. 3A.
Figure 4A:
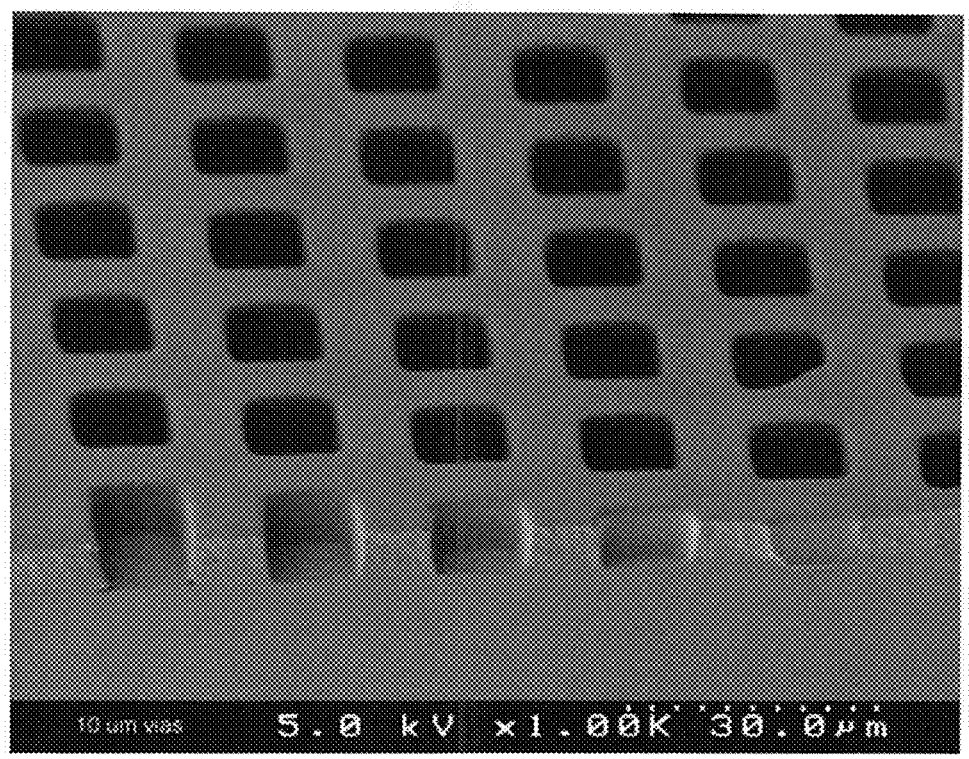
FIG. 4A shows a scanning electron micrograph (SEM) of a positive tone lithographic images of 10 μm via array pattern obtained from yet another composition embodiment of this invention.
Figure 4B:
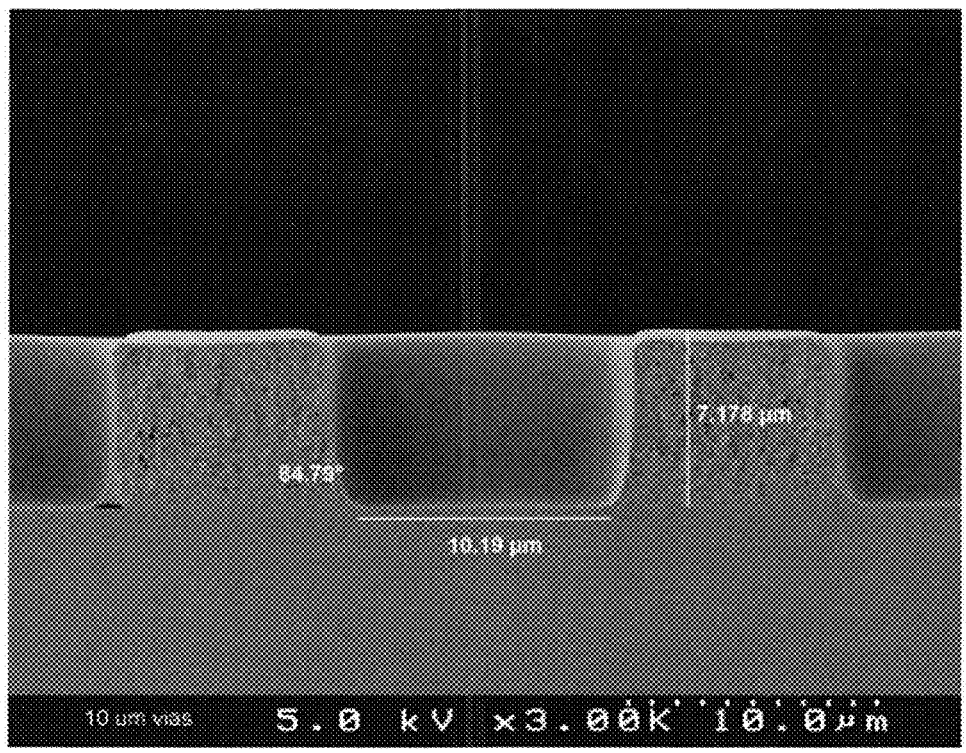
FIG. 4B shows a scanning electron micrograph (SEM) of a cross-sectional view of one of 10 μm vias of FIG. 4A.

FIG. 3A shows scanning electron micrographs (SEM) of 10 μm via arrays obtained from the composition of Example 21. FIG. 3B shows a cross-sectional view of one of the 10 μm array. FIG. 4A shows scanning electron micrographs (SEM) of 10 μm via arrays obtained from the composition of Example 22. FIG. 4B shows a cross-sectional view of one of the 10 μm array. It is again evident from these SEM micrographs, the compositions of this invention exhibit excellent photopatterning property, which feature can be further enhanced by the addition of a dissolution promoter as evidenced by improved images quality in FIGS. 4A and 4B.

The imaged films of Examples 23 to 26 further exhibited excellent thermomechanical properties exhibiting very high tensile strength, elongation to break, and temperature cycling test (TCT).

Evaluation of Presence or Absence of Cracks after Temperature Cycle Test (TCT)

Thermal Cycling Test (TCT) is a form of highly accelerated stress testing. A photosensitive adhesive composition substantially similar to that described in Example 21 was employed in this test except that the polymer used was NBTON/NA copolymer of 80:20 molar ratio and a 75:25 mixture of the cross-linker N-Boc BAFA and N-Boc D-2000 were employed. The composition was deposited onto a silicon wafer substrate consisting of arrays of octagonal copper pillars. The copper pillars were generally ~8 μm tall, and their diameter varied from 10-50 μm, and therefore the distance between the pillars varied accordingly (i.e., 10-50 μm). The deposited composition was processed as described hereinabove (e.g. spin-coating, prebake, optional exposure, cure, etc.) on top of the copper pillars targeting 20 μm film thickness after cure. After which, each of the die was isolated, placed in trays, and subjected to thermal cycling from −55 to +125° C. for 1000 cycles with observation via optical microscopy in increments of 250 cycles.

Figure 5B:
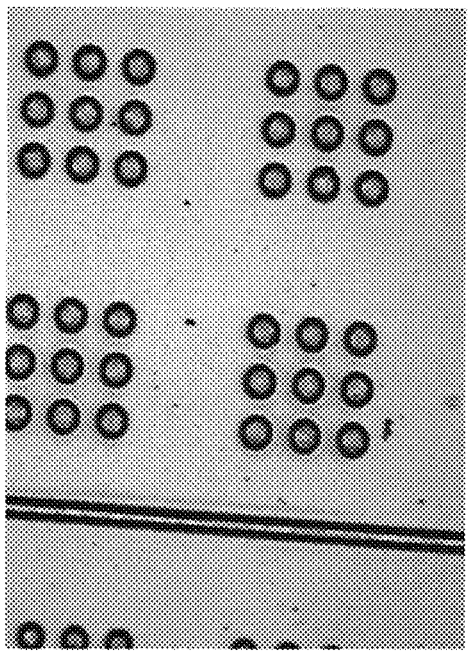
FIGS. 5A to 5D show optical micrographs of copper arrays encompassing a photosensitive adhesive composition embodiment of this invention which were subjected to thermal cycling test.
Figure 5D:
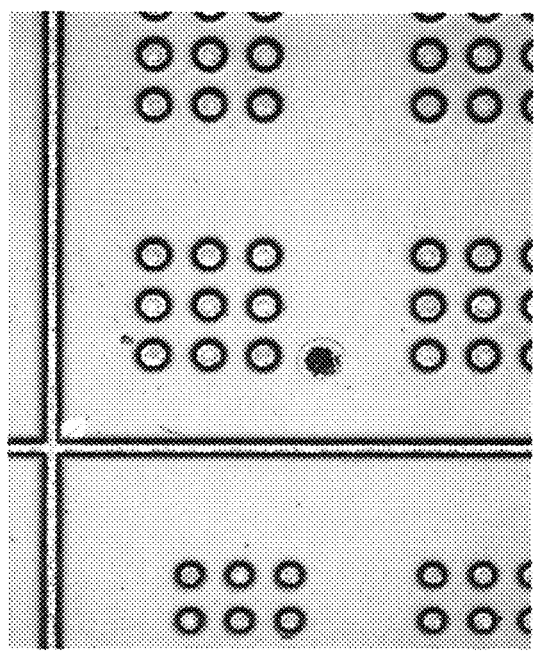
Figure 5A:
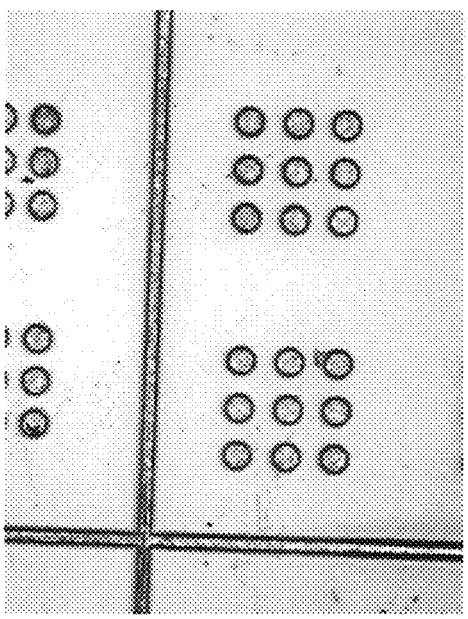
Figure 5C:
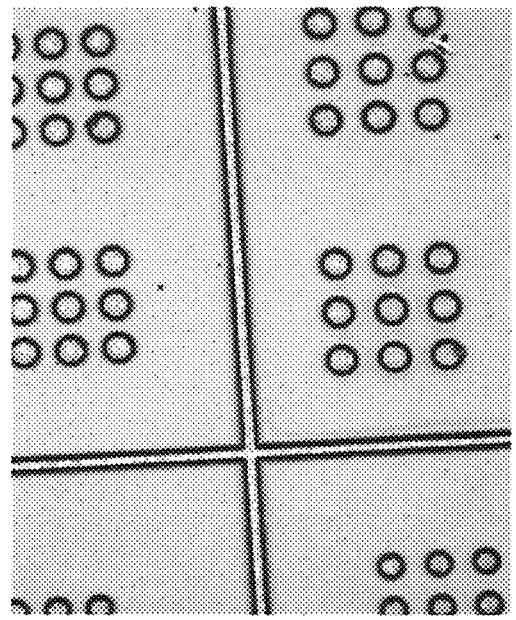

FIG. 5A shows an optical micrograph of the as deposited photosensitive composition of this invention which was exposed suitable radiation, developed and cured as described herein before subjecting to the thermal cycle test. FIG. 5B shows the optical micrograph after 250 cycles of TCT, and FIGS. 5C and 5D show the optical micrograph after 500 and 750 cycles of TCT, respectively. It is evident from these results that no cracks were observed at any of these tests, thus demonstrating that the compositions of this invention exhibit excellent thermal properties.

Example 27

Negative Tone Compositions

The procedures of Example 20 were substantially repeated in Example 27 except for using various ingredients as listed in Table 6 to form the compositions suitable for forming negative tone images.

TABLE 6

| Ingredient | Amount (pphr) |
|---|---|
| Polymer of Examples 1 to 20 | 100 |
| Rhodorsil | 2.8 |
| CPTX | 0.6 |
| 10H-Phenothiazine | 0.18 |
| Denacol EX-321L | 8-50 |
| BY16-115 | 15 |
| Naugard 445 | 5 |
| AO-80 | 5 |

The compositions thus formed were spin coated onto a silicon wafer substantially following the procedures as set forth in Examples 23 and 24. Next, the spin coated samples were soft baked for about 4 minutes at 100° C. to remove any residual solvent. Then imagewise exposed through at an exposure energy of 750 mJ/cm$^2$ on a GCA AutoStep 200 i-line (5× reduction) stepper. Each film was then post exposure baked at 100° C. for 3 minutes. Then the films were developed using a puddle development method having about 2-4 30 second immersions in 0.26N TMAH. After the develop process each wafer was rinsed by spraying deionized water for 5 seconds and then dried by spinning at 3000 rpm for 15 seconds. Each of the films thus developed featured good image qualities.

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. A copolymer consisting of a first repeat unit which is derived from a monomer selected from the group consisting of:

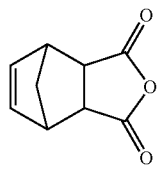

3a,4,7,7a-tetrahydro-4,7-methanoisobenzofuran-1,3-dione (nadic anhydride); and

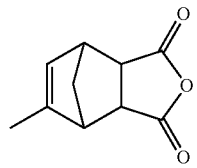

5-methyl-3a,4,7,7a-tetrahydro-4,7-methanoisobenzofuran-1,3-dione; and a second repeat unit which is derived from a monomer selected from the group consisting of:

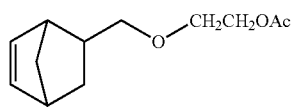

2-(bicyclo[2.2.1]hept-5-en-2-ylmethoxy)ethyl acetate (NBCH$_2$GlyOAc);

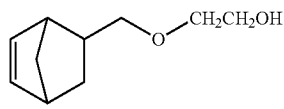

2-(bicyclo[2.2.1]hept-5-en-2-ylmethoxy)ethanol (NBCH$_2$GlyOH);

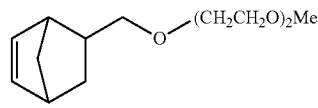

trioxanonanenorbornene (NBTON);

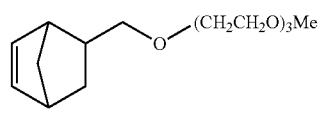

tetraoxadodecanenorbornene (NBTODD);

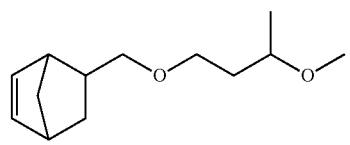

5-(3-methoxybutoxy)methyl-2-norbornene (NB-3-MBM);

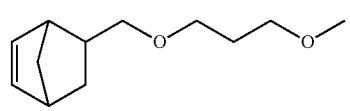

5-(3-methoxypropoxy)methyl-2-norbornene (NB-3-MPM);

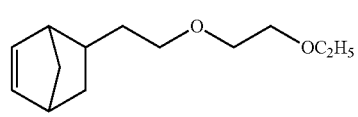 [SMILES: CCOCCOCCC1CC2C=CC1C2]

5-(2-(2-ethoxyethoxy)ethyl)bicyclo[2.2.1]hept-2-ene;

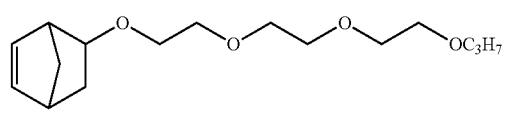

5-(2-(2-(2-propoxyethoxy)ethoxy)ethoxy)bicyclo[2.2.1]hept-2-ene;

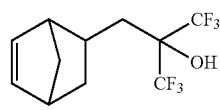 [SMILES: OC(CC1CC2C=CC1C2)(C(F)(F)F)C(F)(F)F]

2-(bicyclo[2.2.1]hept-5-en-2-ylmethyl)-1,1,1,3,3,3-hexafluoropropan-2-ol (HFANB);

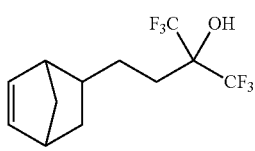 [SMILES: OC(CCC1CC2C=CC1C2)(C(F)(F)F)C(F)(F)F]

4-(bicyclo[2.2.1]hept-5-en-2-yl)-1,1,1-trifluoro-2-(trifluoromethyl)butan-2-ol (HFACH₂NB);

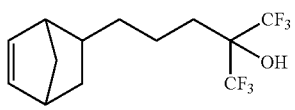 [SMILES: OC(CCCC1CC2C=CC1C2)(C(F)(F)F)C(F)(F)F]

5-(bicyclo[2.2.1]hept-5-en-2-yl)-1,1,1-trifluoro-2-(trifluoromethyl)pentan-2-ol (HFACH₂CH₂NB);

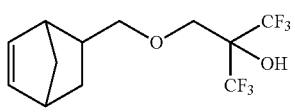 [SMILES: OC(COCC1CC2C=CC1C2)(C(F)(F)F)C(F)(F)F]

2-((bicyclo[2.2.1]hept-5-en-2-ylmethoxy)methyl)-1,1,1,3,3,3-hexafluoropropan-2-ol; and

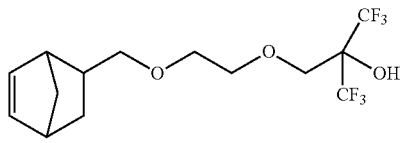 [SMILES: OC(COCCOCC1CC2C=CC1C2)(C(F)(F)F)C(F)(F)F]

2-((2-(bicyclo[2.2.1]hept-5-en-2-ylmethoxy)ethoxy)methyl)-1,1,1,3,3,3-hexafluoropropan-2-ol (GlyH-FIPNB).

2. A terpolymer consisting of a first repeat unit which is derived from a monomer selected from the group consisting of:

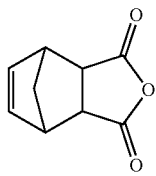

3a,4,7,7a-tetrahydro-4,7-methanoisobenzofuran-1,3-dione (nadic anhydride); and

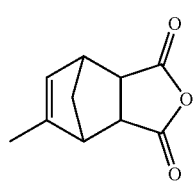

5-methyl-3a,4,7,7a-tetrahydro-4,7-methanoisobenzofuran-1,3-dione;

and a second repeat unit which is derived from a monomer selected from the group consisting of:

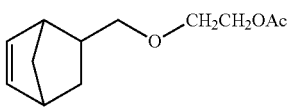

2-(bicyclo[2.2.1]hept-5-en-2-ylmethoxy)ethyl acetate (NBCH₂GlyOAc);

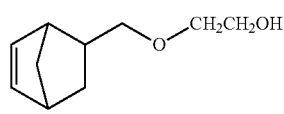

2-(bicyclo[2.2.1]hept-5-en-2-ylmethoxy)ethanol (NBCH₂GlyOH);

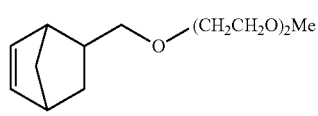

trioxanonanenorbornene (NBTON);

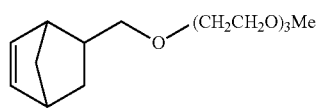

tetraoxadodecanenorbornene (NBTODD);

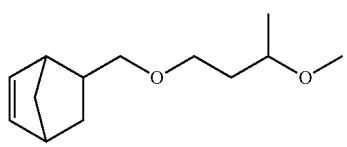

5-(3-methoxybutoxy)methyl-2-norbornene (NB-3-MBM);

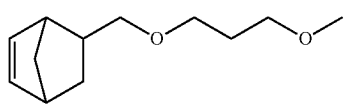

5-(3-methoxypropoxy)methyl-2-norbornene (NB3-MPM);

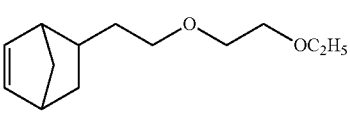

5-(2-(2-(2-propoxyethoxy)ethoxy)ethoxy)bicyclo[2.2.1]hept-2-ene;

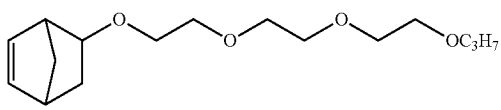

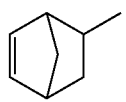

5-methylbicyclo[2.2.1]hept-2-ene (MeNB);

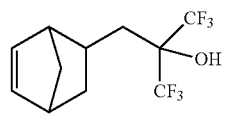 [SMILES: OC(CC1CC2C=CC1C2)(C(F)(F)F)C(F)(F)F]

2-(bicyclo[2.2.1]hept-5-en-2-ylmethyl)-1,1,1,3,3,3-hexafluoropropan-2-ol (HFANB);

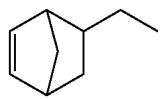

5-ethylbicyclo[2.2.1]hept-2-ene (EtNB);

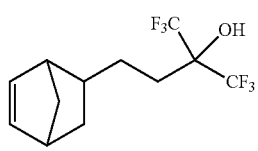 [SMILES: OC(CCC1CC2C=CC1C2)(C(F)(F)F)C(F)(F)F]

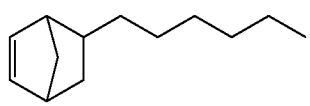

5-hexylbicyclo[2.2.1]hept-2-ene (HexNB);

4-(bicyclo[2.2.1]hept-5-en-2-yl)-1,1,1-trifluoro-2-(trifluoromethyl)butan-2-ol (HFACH₂NB);

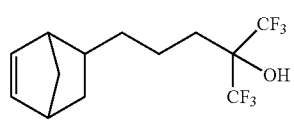 [SMILES: OC(CCCC1CC2C=CC1C2)(C(F)(F)F)C(F)(F)F]

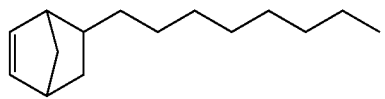

5-octylbicyclo[2.2.1]hept-2-ene (OctNB);

5-bicyclo[2.2.1]hept-5-en-2-yl)-1,1,1-trifluoro-2-(trifluoromethyl)pentan-2-ol (HFACH₂CH₂NB);

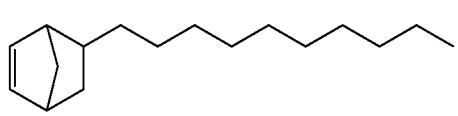

5-decylbicyclo[2.2.1]hept-2-ene (DecNB);

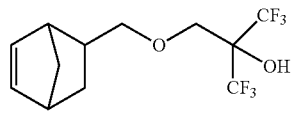 [SMILES: OC(COCC1CC2C=CC1C2)(C(F)(F)F)C(F)(F)F]

2-((bicyclo[2.2.1]hept-5-en-2-ylmethoxy)methyl)-1,1,1,3,3,3-hexafluoropropan-2-ol; and

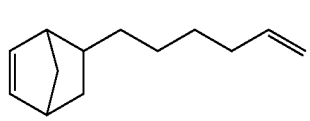

5-(hex-5-en-1-yl)bicyclo[2.2.1]hept-2-ene (HexenylNB);

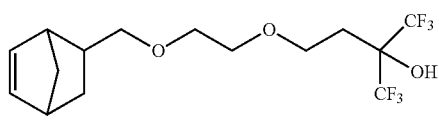 [SMILES: OC(CCOCCOCC1CC2C=CC1C2)(C(F)(F)F)C(F)(F)F]

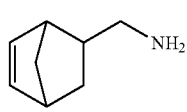

bicyclo[2.2.1]hept-5-en-2-ylmethanamine;

2-((2-bicyclo[2.2.1]hept-5-en-2-ylmethoxy)ethoxy)methyl)-1,1,1,3,3,3-hexafluoropropan-2-ol (GlyH-FIPNB); and a third repeat unit which is derived from a monomer selected from the group consisting of:

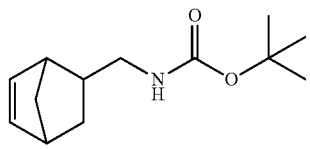

tert-butyl (bicyclo[2.2.1]hept-5-en-2-ylmethyl)carbamate;

bicyclo[2.2.1]hept-2-ene (NB);

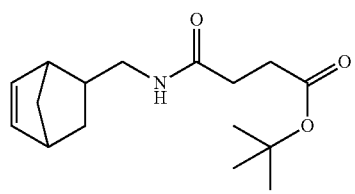 [SMILES: CC(C)(C)OC(=O)CCC(=O)NCC1CC2C=CC1C2]

tert-butyl 4-((bicyclo[2.2.1]hept-5-en-2-ylmethyl)amino)-4-oxobutanoate;

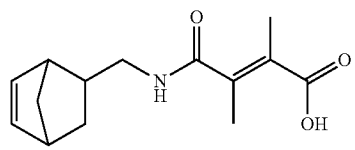 [SMILES: C/C(C(=O)O)=C(/C)C(=O)NCC1CC2C=CC1C2]

(E)-4-((bicyclo[2.2.1]hept-5-en-2-ylmethyl)amino)-2,3-dimethyl-4-oxobut-2-enoic acid;

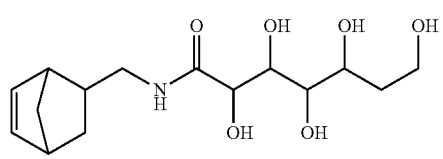 [SMILES: O=C(NCC1CC2C=CC1C2)C(O)C(O)C(O)C(O)CCO]

N-(bicyclo[2.2.1]hept-5-en-2-ylmethyl)-2,3,4,5,7-pentahydroxyheptanamide;

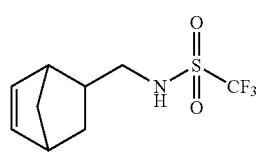 [SMILES: O=S(=O)(NCC1CC2C=CC1C2)C(F)(F)F]

N-(bicyclo[2.2.1]hept-5-en-2-ylmethyl)-1,1,1-trifluoromethanesulfonamide;

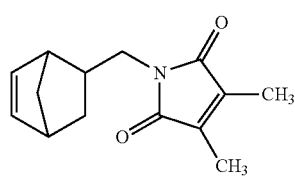 [SMILES: CC1=C(C)C(=O)N(CC2CC3C=CC2C3)C1=O]

1-(bicyclo[2.2.1]hept-5-en-2-ylmethyl)-3,4-dimethyl-1H-pyrrole-2,5-dione (MeDMMINB);

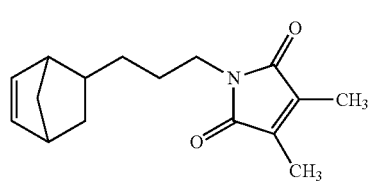 [SMILES: CC1=C(C)C(=O)N(CCCC2CC3C=CC2C3)C1=O]

1-(3-(bicyclo[2.2.1]hept-5-en-2-yl)propyl)-3,4-dimethyl-1H-pyrrole-2,5-dione (PrDMMINB);

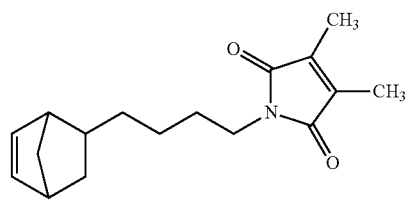 [SMILES: CC1=C(C)C(=O)N(CCCCC2CC3C=CC2C3)C1=O]

1-(4-(bicyclo[2.2.1]hept-5-en-2-yl)butyl)-3,4-dimethyl-1H-pyrrole-2,5-dione (BuDMMINB);

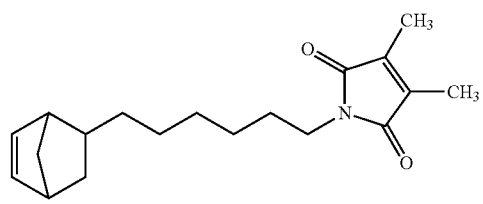 [SMILES: CC1=C(C)C(=O)N(CCCCCCC2CC3C=CC2C3)C1=O]

1-(6-(bicyclo[2.2.1]hept-5-en-2-yl)hexyl)-3,4-dimethyl-1H-pyrrole-2,5-dione (HexDMMINB);

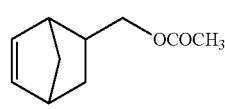

bicyclo[2.2.1]hept-5-en-2-ylmethyl acetate (NBMeOAc);

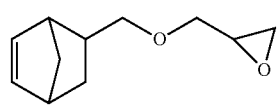

2-((bicyclo[2.2.1]hept-5-en-2-ylmethoxy)methyl)oxirane (MGENB);

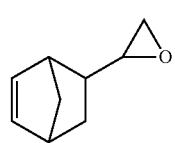

2-(bicyclo[2.2.1]hept-5-en-2-yl)oxirane;

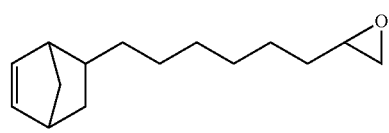 [SMILES: C1=CC2CC1CC2CCCCCCC1CO1]

2-(6-(bicyclo[2.2.1]hept-5-en-2-yl)hexyl)oxirane; and

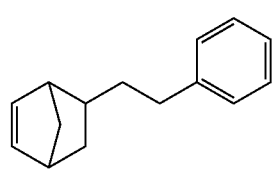 [SMILES: C1=CC2CC1CC2CCc1ccccc1]

5-phenethylbicyclo[2.2.1]hept-2-ene (PENB);

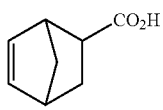

bicyclo[2.2.1]hept-5-ene-2-carboxylic acid;

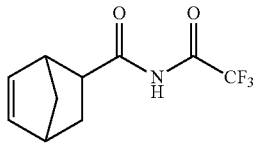 [SMILES: O=C(NC(=O)C(F)(F)F)C1CC2C=CC1C2]

N-(2,2,2-trifluoroacetyl)bicyclo[2.2.1]hept-5-ene-2-carboxamide;

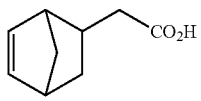

2-(bicyclo[2.2.1]hept-5-en-2-yl)acetic acid (NBCH$_2$CO$_2$H);

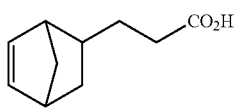 [SMILES: O=C(O)CCC1CC2C=CC1C2]

3-(bicyclo[2.2.1]hept-5-en-2-yl)propanoic acid (NBCH$_2$CH$_2$CO$_2$H);

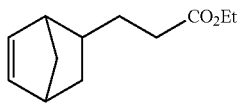 [SMILES: CCOC(=O)CCC1CC2C=CC1C2]

ethyl 3-(bicyclo[2.2.1]hept-5-en-2-yl)propanoate;

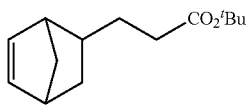

tert-butyl 3-(bicyclo[2.2.1]hept-5-en-2-yl)propanoate;

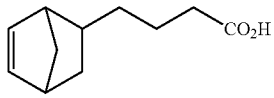 [SMILES: O=C(O)CCCC1CC2C=CC1C2]

4-(bicyclo[2.2.1]hept-5-en-2-yl)butanoic acid (NBCH$_2$CH$_2$CH$_2$CO$_2$H);

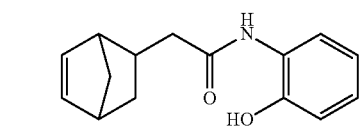 [SMILES: O=C(CC1CC2C=CC1C2)Nc1ccccc1O]

2-(bicyclo[2.2.1]hept-5-en-2-yl)-N-(2-hydroxyphenyl)acetamide;

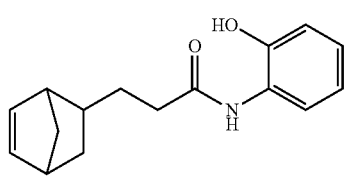 [SMILES: O=C(CCC1CC2C=CC1C2)Nc1ccccc1O]

3-(bicyclo[2.2.1]hept-5-en-2-yl)-N-(2-hydroxyhenyl)propanamide;

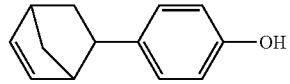 [SMILES: Oc1ccc(C2CC3C=CC2C3)cc1]

4-(bicyclo[2.2.1]hept-5-en-2-yl)phenol;

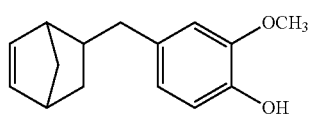 [SMILES: COc1cc(CC2CC3C=CC2C3)ccc1O]

4-(bicyclo[2.2.1]hept-5-en-2-ylmethyl)-2-methoxyphenol.

3. The copolymer of claim 1 which is selected from the group consisting of:
a copolymer of nadic anhydride and trioxanonanenorbornene;
a copolymer of nadic anhydride and tetraoxadodecanenorbornene;
a copolymer of nadic anhydride and 5-(3-methoxypropoxy)methyl-2-norbornene;
a copolymer of nadic anhydride and 5-(3-methoxybutoxy)methyl-2-norbornene;
a copolymer of nadic anhydride and 5-(2-(2-ethoxyethoxy)ethyl)bicyclo[2.2.1]hept-2-ene;
a copolymer of nadic anhydride and 2-(bicyclo[2.2.1]hept-5-en-2-ylmethyl)-1,1,3,3,3-hexafluoropropan-2-ol.

4. The terpolymer of claim 2 which is selected from the group consisting of:
a terpolymer of nadic anhydride, trioxanonanenorbornene and 5-(hex-5-en-1-yl)bicyclo[2.2.1]hept-2-ene;
a terpolymer of nadic anhydride, trioxanonanenorbornene and bicyclo[2.2.1]hept-5-en-2-ylmethyl acetate;
a terpolymer of nadic anhydride, trioxanonanenorbornene and 2-((2-(bicyclo[2.2.1]hept-5-en-2-ylmethoxy)ethoxy)methyl)-1,1,1,3,3,3-hexafluoropropan-2-ol.

5. A composition consisting of:
(i) a copolymer according to claim 1 which is selected from the group consisting of:
a copolymer of nadic anhydride and trioxanonanenorbornene;

a copolymer of nadic anhydride and tetraoxadodecanenorbornene;

a copolymer of nadic anhydride and 5-(3-methoxypropoxy)methyl-2-norbornene;

a copolymer of nadic anhydride and 5-(3-methoxybutoxy)methyl-2-norbornene;

a copolymer of nadic anhydride and 5-(2-(2-ethoxyethoxy)ethyl)bicyclo[2.2.1]hept-2-ene; and a copolymer of nadic anhydride and 2-(bicyclo[2.2.1]hept-5-en-2-ylmethyl)-1,1,1,3,3,3-hexafluoropropan-2-ol;

(ii) a photo active compounds; and (iii) a solvent.

6. A composition consisting of:

(i) a terpolymer according to claim 2 which is selected from the group consisting of:

a terpolymer of nadic anhydride, trioxanonanenorbornene and 5-(hex-5-en-1-yl)bicyclo[2.2.1]hept-2-ene;

a terpolymer of nadic anhydride, trioxanonanenorbornene and bicyclo[2.2.1]hept-5-en-2-ylmethyl acetate; and a terpolymer of nadic anhydride, trioxanonanenorbornene and 2-((2-(bicyclo[2.2.1]hept-5-en-2-ylmethoxy)ethoxy)methyl)-1,1,1,3,3,3-hexafluoropropan-2-ol;

(ii) a photo active compound; and (iii) a solvent.

7. The composition according to claim 5, wherein said photoactive compound comprises a 1,2-naphthoquinonediazide-5-sulfonyl moiety and/or a 1,2-naphthoquinonediazide-4-sulfonyl moiety as represented by structural formulae (IVa) and (IVb), respectively:

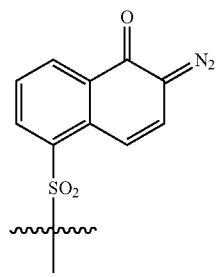

(IVa)

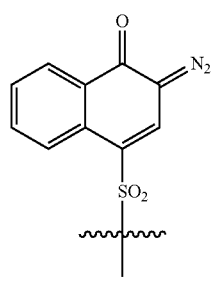

(IVb)

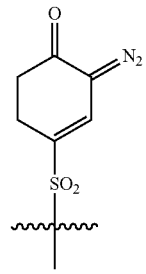

(IVc)

or a sulfonyl benzoquinone diazide group represented by structural formula (IVc).

8. The composition according to claim 7, wherein said photoactive compound is

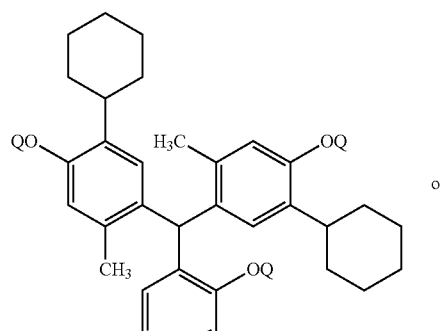

or

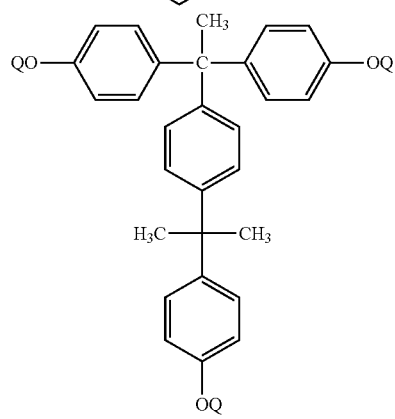

wherein at least one of Q is a group of formula (IVa) or (IVb):

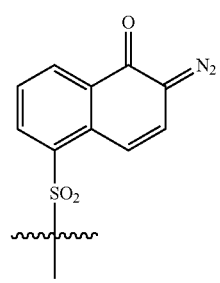

(IVa)

-continued

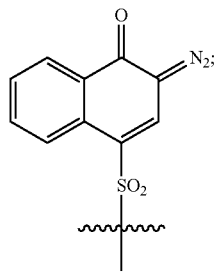

(IVb)

and the remaining Q is hydrogen.

9. The composition according to claim 5, which further comprises one or more crosslinking agents selected from the group consisting of:

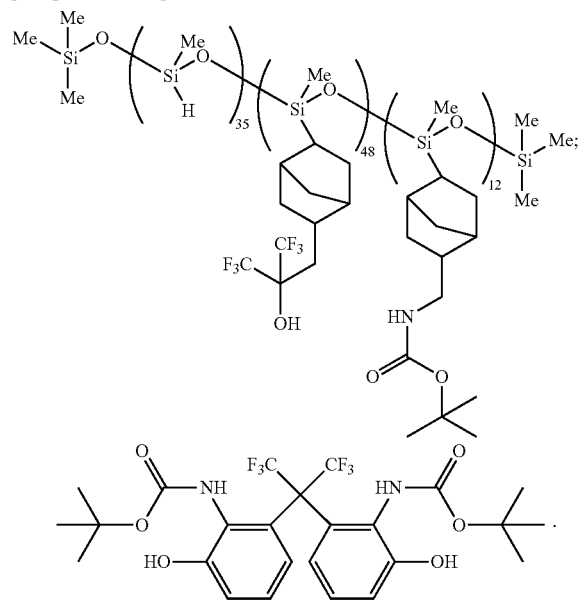

di-tert-butyl ((perfluoropropane-2,2-diyl)bis(6-hydroxy-2,1-phenylene))dicarbamate;

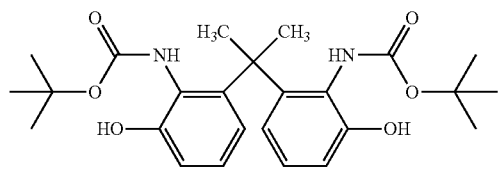 [SMILES: CC(C)(C)OC(=O)Nc1c(O)cccc1C(C)(C)c1cccc(O)c1NC(=O)OC(C)(C)C]

di-tert-butyl (propane-2,2-diylbis(6-hydroxy-2,1-phenylene))dicarbamate;

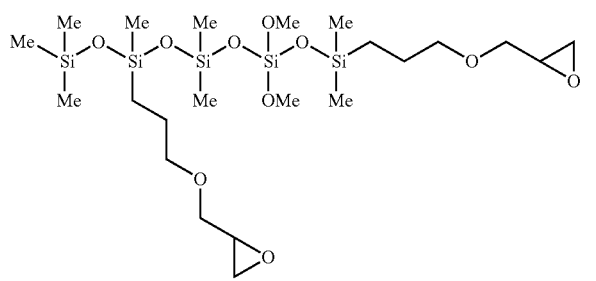 [SMILES: CO[Si](OC)(O[Si](C)(C)CCCOCC1CO1)O[Si](C)(C)O[Si](C)(CCCOCC1CO1)O[Si](C)(C)C]

silicone modified epoxy resin;

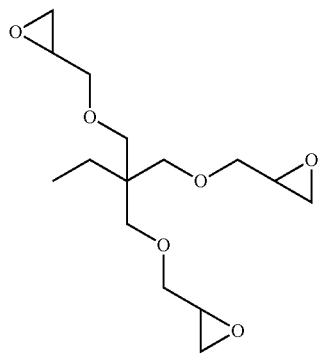 [SMILES: CCC(COCC1CO1)(COCC1CO1)COCC1CO1]

2,2'-(((2-ethyl-2-((oxiran-2-ylmethoxy)methyl)propane-1,3-diyl)bis(oxy))bis(methylene))bis(oxirane);
bisphenol A epichlorohydrin based epoxy resin;
polypropylene glycol epichlorohydrin based epoxy resin;
bis(4-(oxiran-2-ylmethoxy)phenyl)methane;
glycidyl ether of para-tertiary butyl phenol (Heloxy 65);
polyethylene glycol diglycidyl ether (PEGDGE);
polypropylene glycol diglycidyl ether (PPGDGE);
and a mixture in any combination thereof.

10. The composition according to claim 5, wherein said photoactive compound is a photoacid generator selected from the group consisting of:

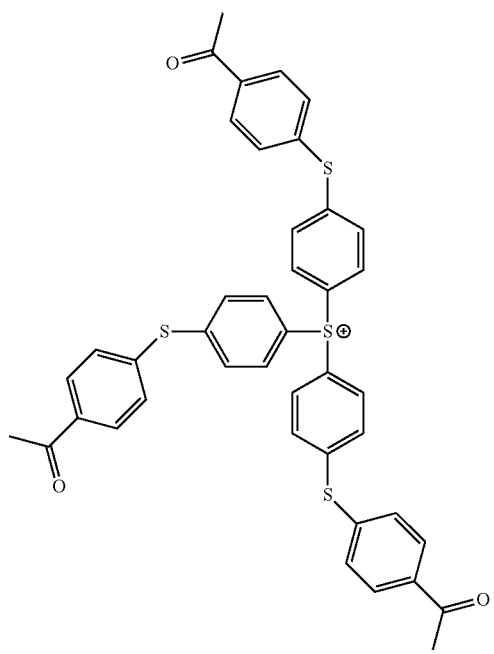

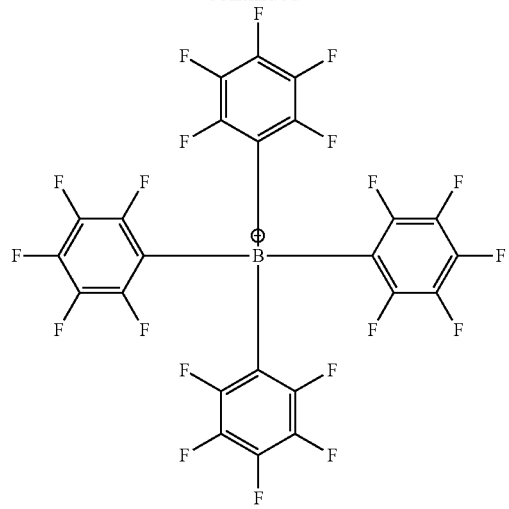
tris(4-((4-acetylphenyl)thio)phenyl)sulfonium tetrakis(perfluorophenyl)borate;
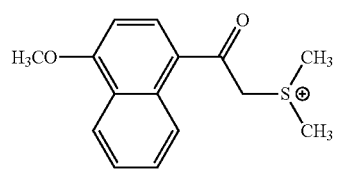
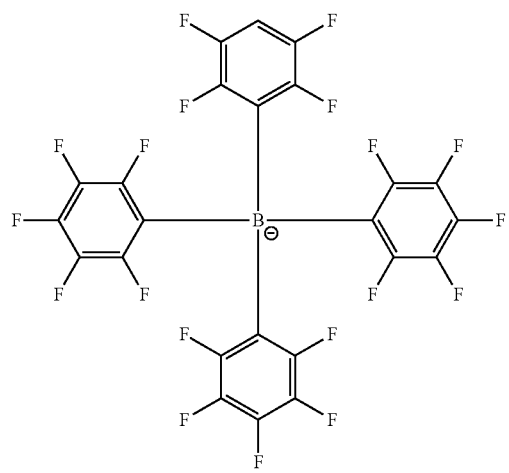
(2-(4-methoxynaphthalen-1-yl)-2-oxoethyl)dimethylsulfonium tetrakis(perfluorophenyl)borate;
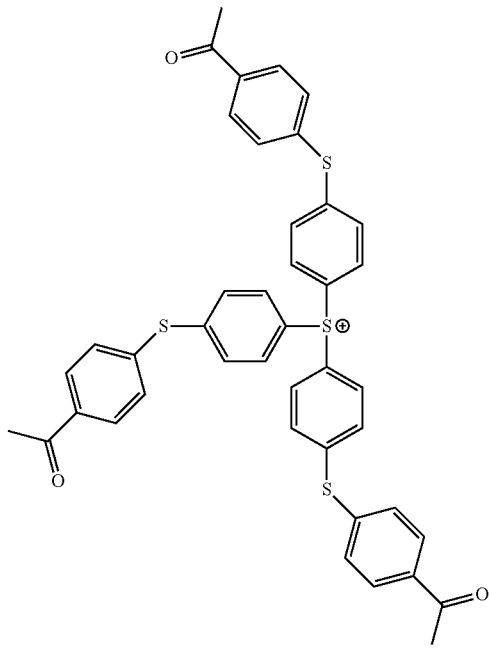
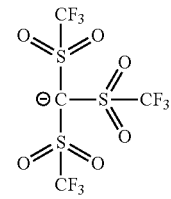
tris(4-((4-acetylphenyl)thio)phenyl)sulfonium tris((trifluoromethyl)sulfonyl)methanide;
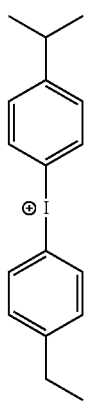

-continued

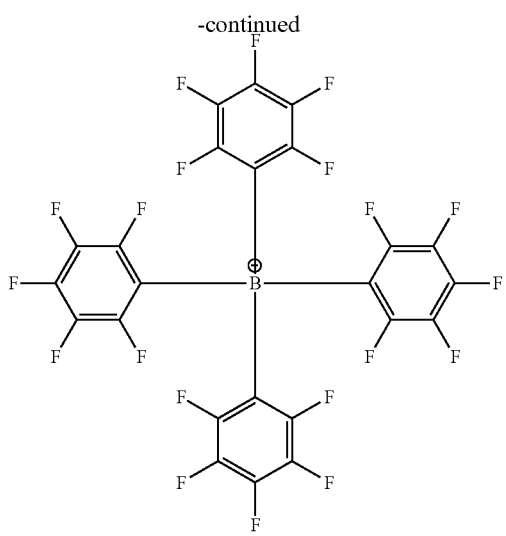

(4-ethylphenyl)(4-isopropylphenyl)iodonium tetrakis(perfluorophenyl)borate;

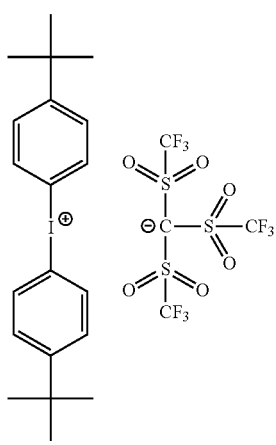 [SMILES: CC(C)(C)c1ccc([I+]c2ccc(C(C)(C)C)cc2)cc1 ; O=S(=O)([C-](S(=O)(=O)C(F)(F)F)S(=O)(=O)C(F)(F)F)C(F)(F)F]

di-(p-t-butylphenyl)iodonium tris(trifluoromethanesulfonyl)methanide;

and a mixture in any combination thereof.

11. A semiconductor device comprising a laminated semiconductor element where said lamination consists of a composition according to claim 5.

12. A microelectronic or optoelectronic device comprising one or more of a redistribution layer (RDL) structure, a chip-stack structure or a CMOS image sensor dam structure, where said structures further comprise a composition according to claim 5.

13. A film comprising the composition of claim 5.

14. A method of forming a film for the fabrication of a microelectronic or optoelectronic device comprising:
coating a suitable substrate with a composition according to claim 5 to form a film;
patterning the film with a mask by exposing to a suitable radiation;
developing the film after exposure to form a photopattern; and
curing the film by heating to a suitable temperature.

15. A cured product obtained by curing the composition of claim 5.

16. An optoelectronic or microelectronic device comprising the cured product of claim 15.

17. The composition according to claim 6, wherein said photoactive compound comprises a 1,2-naphthoquinonediazide-5-sulfonyl moiety and/or a 1,2-naphthoquinonediazide-4-sulfonyl moiety as represented by structural formulae (IVa) and (IVb), respectively:

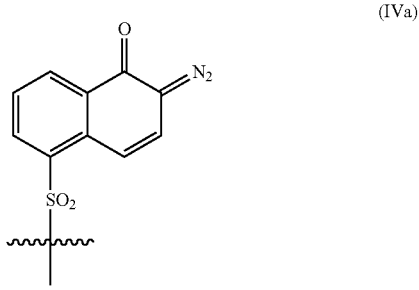

(IVa)

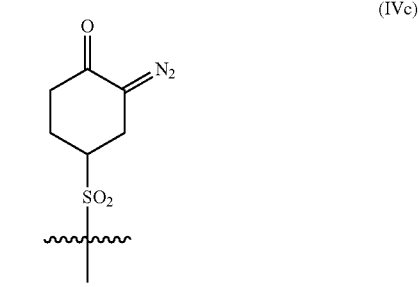

(IVb)

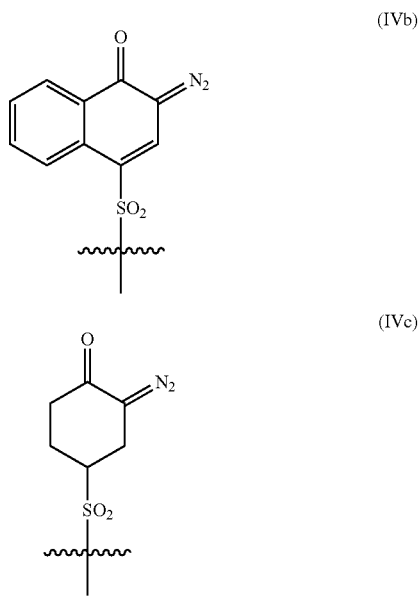

(IVc)

or a sulfonyl benzoquinone diazide group represented by structural formula (IVc).

18. The composition according to claim 17, wherein said photoactive compound is or

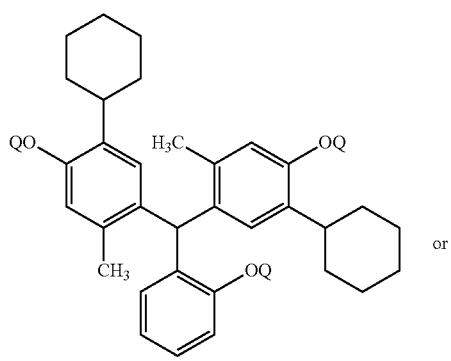

or

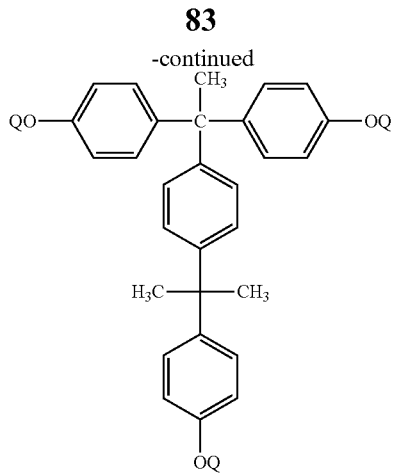

wherein at least one of Q is a group of formula (IVa) or (IVb):

(IVa)

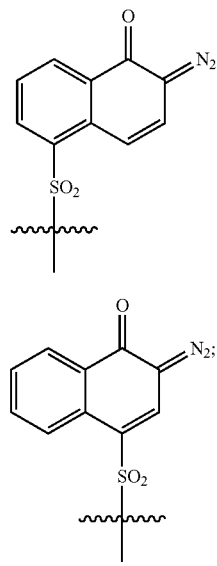

(IVb)

and the remaining Q is hydrogen.

19. The composition according to claim 6, which further comprises one or more crosslinking agents selected from the group consisting of:

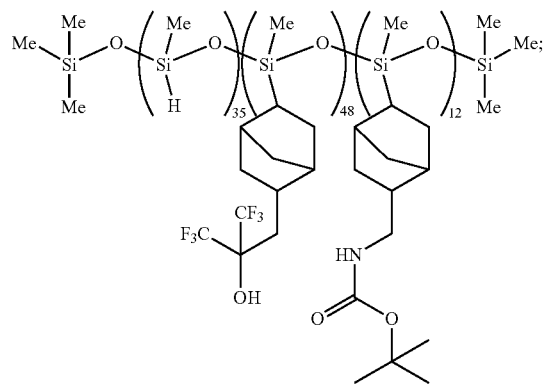

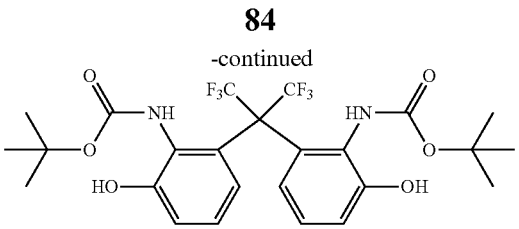

di-tert-butyl ((perfluoropropane-2,2-diyl)bis(6-hydroxy-2,1-phenylene))dicarbamate;

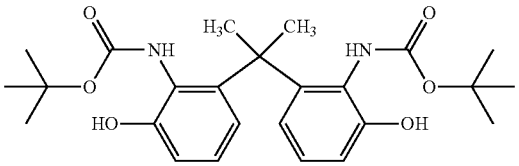 [SMILES: CC(C)(C)OC(=O)Nc1c(O)cccc1C(C)(C)c1cccc(O)c1NC(=O)OC(C)(C)C]

di-tert-butyl (propane-2,2-diylbis(6-hydroxy-2,1-phenylene))dicarbamate;

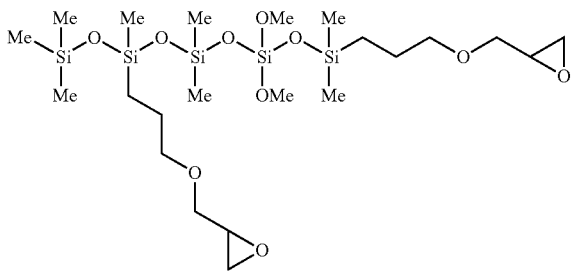 [SMILES: CO[Si](OC)(O[Si](C)(C)CCCOCC1CO1)O[Si](C)(C)O[Si](C)(CCCOCC1CO1)O[Si](C)(C)C]

silicone modified epoxy resin;

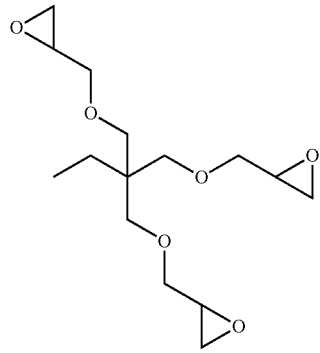 [SMILES: CCC(COCC1CO1)(COCC1CO1)COCC1CO1]

2,2'-(((2-ethyl-2-((oxiran-2-ylmethoxy)methyl)propane-1,3-diyl)bis(oxy))bis(methylene))bis(oxirane);
bisphenol A epichlorohydrin based epoxy resin;
polypropylene glycol epichlorohydrin based epoxy resin;
bis(4-(oxiran-2-ylmethoxy)phenyl)methane;
glycidyl ether of para-tertiary butyl phenol (Heloxy 65);
polyethylene glycol diglycidyl ether (PEGDGE);
polypropylene glycol diglycidyl ether (PPGDGE);
and a mixture in any combination thereof.

20. The composition according to claim 6, wherein said photoactive compound is a photoacid generator selected from the group consisting of:

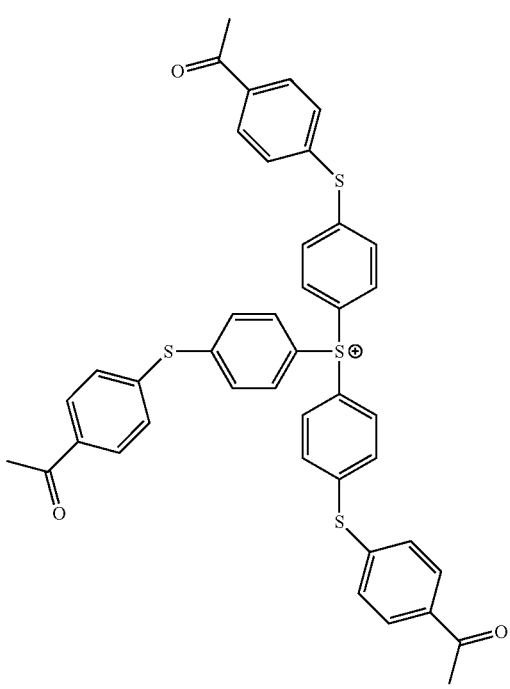
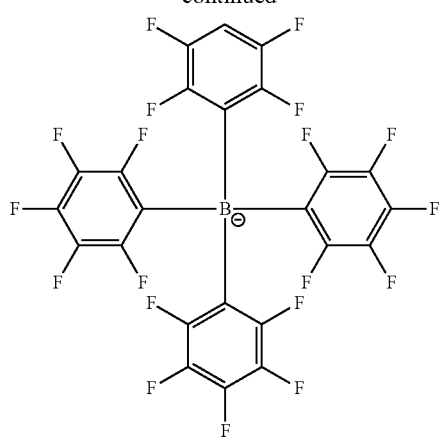
(2-(4-methoxynaphthalen-1-yl)-2-oxoethyl)dimethylsulfonium tetrakis(perfluorophenyl)borate;
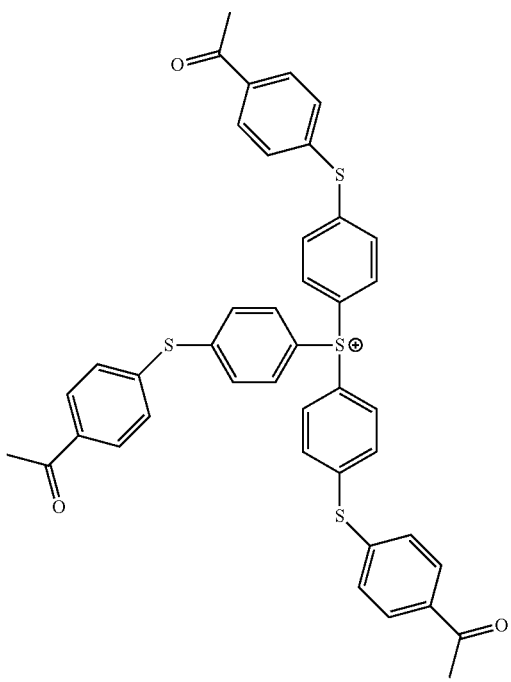
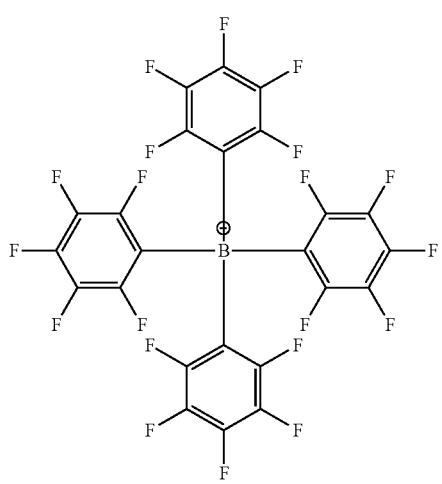
tris(4-((4-acetylphenyl)thio)phenyl)sulfonium tetrakis(perfluorophenyl)borate;
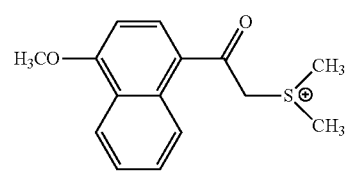
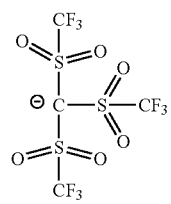
tris(4-((4-acetylphenyl)thio)phenyl)sulfonium tris((trifluoromethyl)sulfonyl)methanide;

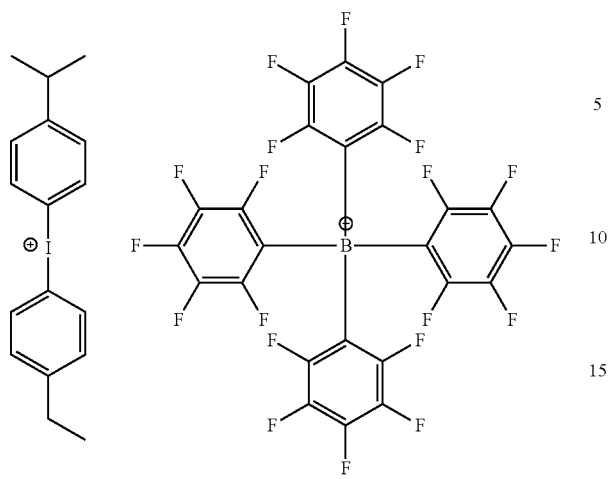
(4-ethylphenyl)(4-isopropylphenyl)iodonium tetrakis(perfluorophenyl)borate;
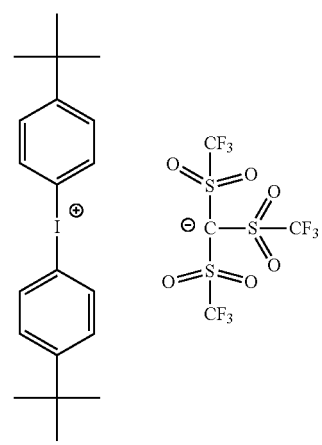 [SMILES: CC(C)(C)c1ccc([I+]c2ccc(C(C)(C)C)cc2)cc1 ; O=S(=O)([C-](S(=O)(=O)C(F)(F)F)S(=O)(=O)C(F)(F)F)C(F)(F)F]
di-(p-t-butylphenyl)iodonium tris(trifluoromethanesulfonyl)methanide;
and a mixture in any combination thereof.
* * * * *